US008120959B2

(12) United States Patent
Lee et al.

(10) Patent No.: US 8,120,959 B2
(45) Date of Patent: Feb. 21, 2012

(54) NAND STRING BASED NAND/NOR FLASH MEMORY CELL, ARRAY, AND MEMORY DEVICE HAVING PARALLEL BIT LINES AND SOURCE LINES, HAVING A PROGRAMMABLE SELECT GATING TRANSISTOR, AND CIRCUITS AND METHODS FOR OPERATING SAME

(75) Inventors: Peter Wung Lee, Saratoga, CA (US); Fu-Chang Hsu, San Jose, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 321 days.

(21) Appl. No.: 12/455,337

(22) Filed: Jun. 1, 2009

(65) Prior Publication Data

US 2009/0310414 A1    Dec. 17, 2009

Related U.S. Application Data

(60) Provisional application No. 61/130,381, filed on May 30, 2008, provisional application No. 61/131,554, filed on Jun. 9, 2008, provisional application No. 61/132,122, filed on Jun. 16, 2008, provisional application No. 61/132,628, filed on Jun. 20, 2008.

(51) Int. Cl.
   *G11C 16/04*   (2006.01)

(52) U.S. Cl. ......... 365/185.13; 365/185.14; 365/185.17; 365/185.25; 365/189.11; 365/189.12

(58) Field of Classification Search ............. 365/185.13, 365/185.17, 185.14
See application file for complete search history.

(56) References Cited

U.S. PATENT DOCUMENTS

| | | | |
|---|---|---|---|
| 4,601,020 A | 7/1986 | Arakawa et al. | |
| 4,761,768 A | 8/1988 | Turner et al. | |
| 5,563,827 A | 10/1996 | Lee et al. | |
| 5,768,192 A | 6/1998 | Eitan | |
| 5,862,082 A | 1/1999 | Dejenfelt et al. | |
| 5,894,437 A * | 4/1999 | Pellegrini | 365/185.13 |
| 5,920,501 A | 7/1999 | Norman | |
| 6,005,810 A | 12/1999 | Wu | |

(Continued)

OTHER PUBLICATIONS

"A Dual-Mode NAND Flash Memory: 1-Gb Multilevel and High-Performance 512-Mb Single-Level Modes," by Taehee Cho et al., IEEE Journal of Solid-State Circuits, vol. 36, No. 11, Nov. 2001, pp. 1700-1706.

(Continued)

*Primary Examiner* — Pho M Luu
(74) *Attorney, Agent, or Firm* — Saile Ackerman LLC; Stephen B. Ackerman; Billy Knowles

(57) ABSTRACT

A nonvolatile memory device includes a nonvolatile memory array including a plurality of charge retaining transistors arranged in rows and columns. The device has a plurality source lines formed in parallel with the bit lines associated with each column. Row decode/driver circuits are connected to blocks of the charge retaining transistors for controlling the application of the necessary read, program, and erase signals. Erase count registers, each of the erase count registers associated with one block of the array of the charge retaining transistors for storing an erase count for the associated block for determining whether a refresh operation is to be executed. Groupings on each column of the array of charge retaining transistors are connected as NAND series strings where each NAND string has a select gating charge retaining transistor connected to the top charge retaining transistor for connecting the NAND series string to the bit lines.

56 Claims, 33 Drawing Sheets

U.S. PATENT DOCUMENTS

| | | | |
|---|---|---|---|
| 6,072,722 A * | 6/2000 | Hirano | 365/185.13 |
| 6,163,048 A | 12/2000 | Hirose et al. | |
| 6,233,198 B1 | 5/2001 | Choi | |
| 6,265,266 B1 | 7/2001 | Dejenfelt et al. | |
| 6,356,478 B1 | 3/2002 | McCollum | |
| 6,396,744 B1 | 5/2002 | Wong | |
| 6,498,752 B1 | 12/2002 | Hsu et al. | |
| 6,545,915 B2 * | 4/2003 | Ohtani et al. | 365/185.29 |
| 6,556,481 B1 | 4/2003 | Hsu et al. | |
| 6,567,315 B2 * | 5/2003 | Takase et al. | 365/185.28 |
| 6,620,682 B1 | 9/2003 | Lee et al. | |
| 6,628,563 B1 | 9/2003 | Hsu et al. | |
| 6,633,500 B1 | 10/2003 | Chou et al. | |
| 6,665,211 B2 | 12/2003 | Kern | |
| 6,756,632 B1 | 6/2004 | Chen et al. | |
| 6,777,292 B2 | 8/2004 | Lee et al. | |
| 6,788,611 B2 | 9/2004 | Hsu et al. | |
| 6,788,612 B2 | 9/2004 | Hsu et al. | |
| 6,818,491 B2 | 11/2004 | Lee et al. | |
| 6,822,223 B2 | 11/2004 | Davis | |
| 6,891,755 B2 * | 5/2005 | Silvagni et al. | 365/185.13 |
| 7,064,978 B2 | 6/2006 | Lee et al. | |
| 7,075,826 B2 | 7/2006 | Lee et al. | |
| 7,087,953 B2 | 8/2006 | Lee | |
| 7,102,929 B2 | 9/2006 | Lee et al. | |
| 7,110,302 B2 | 9/2006 | Lee et al. | |
| 7,120,064 B2 | 10/2006 | Lee et al. | |
| 7,203,092 B2 | 4/2007 | Nazarian | |
| 7,283,401 B2 | 10/2007 | Lee et al. | |
| 7,289,366 B2 | 10/2007 | Lee et al. | |
| 7,324,379 B2 | 1/2008 | Del Gatto et al. | |
| 7,324,384 B2 | 1/2008 | Lee et al. | |
| 7,332,766 B2 | 2/2008 | Hasegawa et al. | |
| 7,505,355 B2 | 3/2009 | Kanda et al. | |
| 2003/0046487 A1 | 3/2003 | Swaminathan | |
| 2004/0177212 A1 | 9/2004 | Chang et al. | |
| 2007/0140036 A1 | 6/2007 | Noguchi et al. | |
| 2007/0165459 A1 | 7/2007 | Nazarian | |

OTHER PUBLICATIONS

"A New Self-Data-Refreash Scheme for a Sector Erasable 16-Mb Flash EEPROM," by Akira Umezawa et al., VLSI 12-2, pp. 99-100.

Co-pending U.S. Appl. No. 12/291,913, filed Nov. 14, 2008, "A Bit Line Gate Transistor Structure for a Multilevel, Dual-Sided Nonvolatile Memory Cell NAND Flash Array," assigned to the same assignee as the present invention.

Co-pending U.S. Appl. No. 12/387,771, filed May 7, 2009, A NAND Based NOR Flash Memory Cell, a NAND Based NMOS NOR Flash Memory Array, and a Method of Forming a NAND Based NMOS NOR Flash Memory Array, assigned to the same assignee as the present invention.

Co-pending U.S. Appl. No. 12/455,936, filed Jun. 9, 2009, "Row-Decoder and Source-Decoder Structures Suitable for Erase in Unit of Page, Sector and Chip of a NOR-Type Flash Operating Below +/−10V BVDS," assigned to the same assignee as the present invention.

Co-pending U.S. Appl. No. 12/456,354, filed Jun. 16, 2009, "Row-Decoder and Select Gate Decoder Structures Suitable for Flashed-Based EEPROM Operating Below +/−10V BVDS," assigned to the same assignee as the present invention.

Co-pending U.S. Appl. No. 12/456,744, filed Jun. 22, 2009, "An Apparatus and Method for Inhibiting Excess Leakage Current in Unselected Nonvolatile Memory Cells in an Array," assigned to the same assignee as the present invention.

* cited by examiner

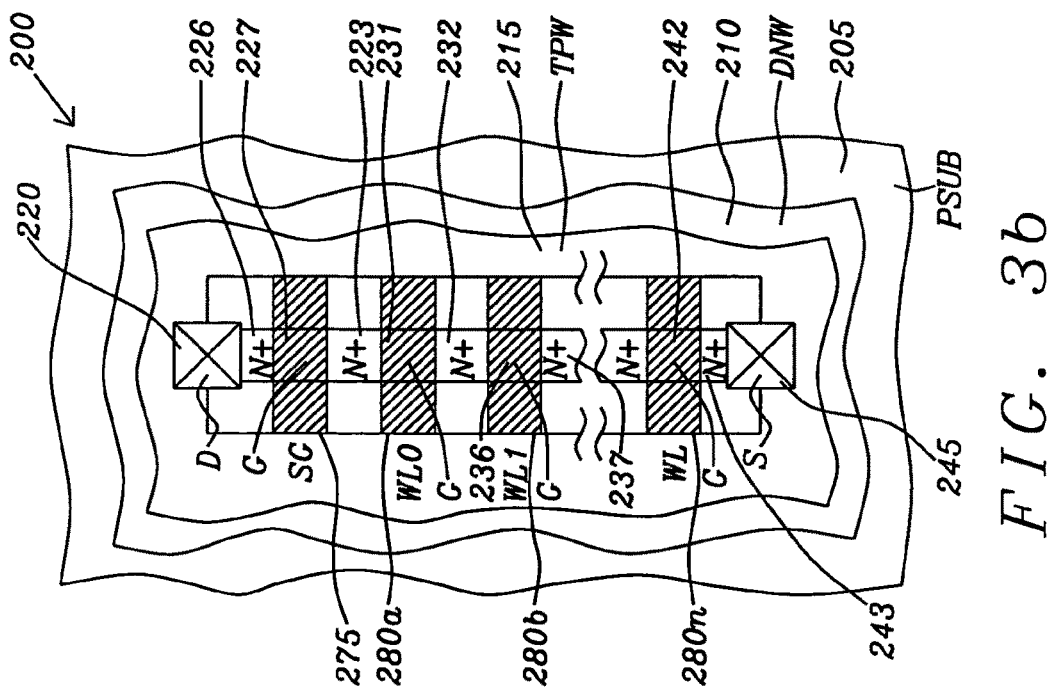
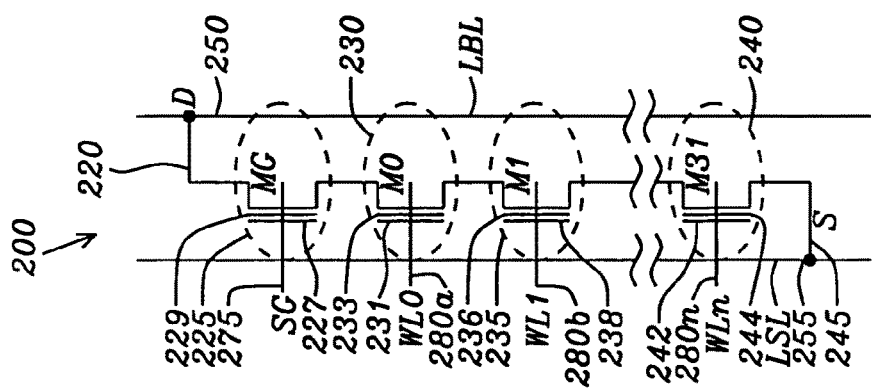
FIG. 3b
FIG. 3a

| BSC | Selected Block | | | Unselected Block | | | Power Lines & Control Signals | | | |
|---|---|---|---|---|---|---|---|---|---|---|
| MODE | IN | OUT | OUTB | IN | OUT | OUTB | VP1 | VP2 | PGM | ERS |
| READ | VDD | HV1** | 0.0V | 0.0V | 0.0V | VDD | HV1** | VDD | 0.0V | 0.0V |
| BLOCK ERASE | VDD | VDD | 0.0V | 0.0V | 0.0V | VDD | VDD | VDD | 0.0V | VDD |
| BLOCK ERASE VERIFY | VDD | HV1** | 0.0V | 0.0V | 0.0V | VDD | HV1** | VDD | 0.0V | 0.0V |
| PAGE ERASE | VDD | VDD | 0.0V | 0.0V | 0.0V | VDD | VDD | VDD | 0.0V | VDD |
| PAGE ERASE VERIFY | VDD | HV1** | 0.0V | 0.0V | 0.0V | VDD | HV1** | VDD | 0.0V | 0.0V |
| PROGRAM | VDD | 20.0V +Vt | 0.0V | 0.0V | 5.0V +Vt | 0.0V | 20.0V +Vt | 5.0V +Vt | VDD | 0.0V |
| PROGRAM VERIFY | VDD | HV1** | 0.0V | 0.0V | 0.0V | VDD | HV1** | VDD | 0.0V | 0.0V |
| CORRECTION VERIFY | VDD | HV1** | 0.0V | 0.0V | 0.0V | VDD | HV1** | VDD | 0.0V | 0.0V |

LEGEND

HV*: ~ −6V;
HV1**: >HV+Vt
VDD: 1.8V/3.0V

FIG. 9

| WL \ MODE | Unselected Block SC (Unsel) | Unselected Block WL (Unsel) | Selected Block SC (Sel) | Selected Block WL (Sel) | Selected Sector WL (Unsel) | XT (Sel) | XT (Unsel) | IN (Sel) | IN (Unsel) | VPAS | PCM_SEL |
|---|---|---|---|---|---|---|---|---|---|---|---|
| READ | 0V | F*** | HV* | 0V | 0V | 0V | HV* | VDD | 0V | HV* | 0V |
| BLOCK ERASE | 20V! | 20V! | 0V | 0V | 0V | 0V | HV* | VDD | 0V | 0V | 0V |
| BLOCK ERASE VERIFY | 0V | F*** | HV* | 0V | 0V | 0V | 0V | VDD | 0V | HV* | 0V |
| PAGE ERASE | 20V! | 20V! | 20V! | 0V | 20V! | 0V | VDD | VDD | 0V | VDD | 0V |
| PAGE ERASE VERIFY | 0V | F*** | HV* | 0V | HV* | 0V | HV* | VDD | 0V | HV* | 0V |
| PROGRAM | 5V | 5V | 5V | 15-20V | 10V | 15-20V | 10V | VDD | 0V | 5V | 10V |
| PROGRAM VERIFY | 0V | F*** | HV* | Vt1L | Vt1L | Vt1L | HV* | VDD | 0V | HV* | 0V |
| CORRECTION VERIFY | 0V | F*** | HV* | Vt1H | Vt1H | Vt1H | HV* | VDD | 0V | HV* | 0V |

LEGEND
HV*: ~6V;
F***: Floating,
20V!: Coupled
from NAND
Array's TPW
VDD: 1.8V/3.0V

| | Unselected Block | | Selected Block | | | Selected Sector | | Power Lines & Control Signals | | | |
|---|---|---|---|---|---|---|---|---|---|---|---|
| MODE \ WL | SC (Unsel) | WL (Unsel) | SC (Sel) | WL (Sel) | WL (Unsel) | XT (Sel) | XT (Unsel) | IN (Sel) | IN (Unsel) | VPAS | PGM_SEL |
| READ | 0V | F*** | HV* | 0V/Vr1/Vr2 | HV* | 0V/Vr1/Vr2 | HV* | VDD | 0V | HV* | 0V |
| BLOCK ERASE | 20V! | 20V! | 0V | 0V | 0V | 0V | 0V | VDD | 0V | 0V | 0V |
| BLOCK ERASE VERIFY | 0V | F*** | HV* | 0V | 0V | 0V | VDD | VDD | 0V | HV* | 0V |
| PAGE ERASE | 20V! | 20V! | 0V | 0V | 20V! | 0V | VDD | VDD | 0V | 0V | 0V |
| PAGE ERASE VERIFY | 0V | F*** | 0V | 0V | HV* | 0V | HV* | VDD | 0V | 0V | 0V |
| PROGRAM | 5V | 5V | 5V | 15-20V | 10V | 15-20V | 10V | VDD | 0V | 5V | 10V |
| PROGRAM VERIFY | 0V | F*** | HV* | Vt1L/Vt2L Vt3L | HV* | Vt1L/Vt2L Vt3L | HV* | VDD | 0V | HV* | 0V |
| CORRECTION VERIFY | 0V | F*** | HV* | Vt1H/Vt2H Vt3H | HV* | Vt1H/Vt2H Vt3H | HV* | VDD | 0V | HV* | 0V |

LEGEND
HV*: ~6V;
F***: Floating,
20V!: Coupled from NAND Array's TPW
VDD: 1.8V/3.0V

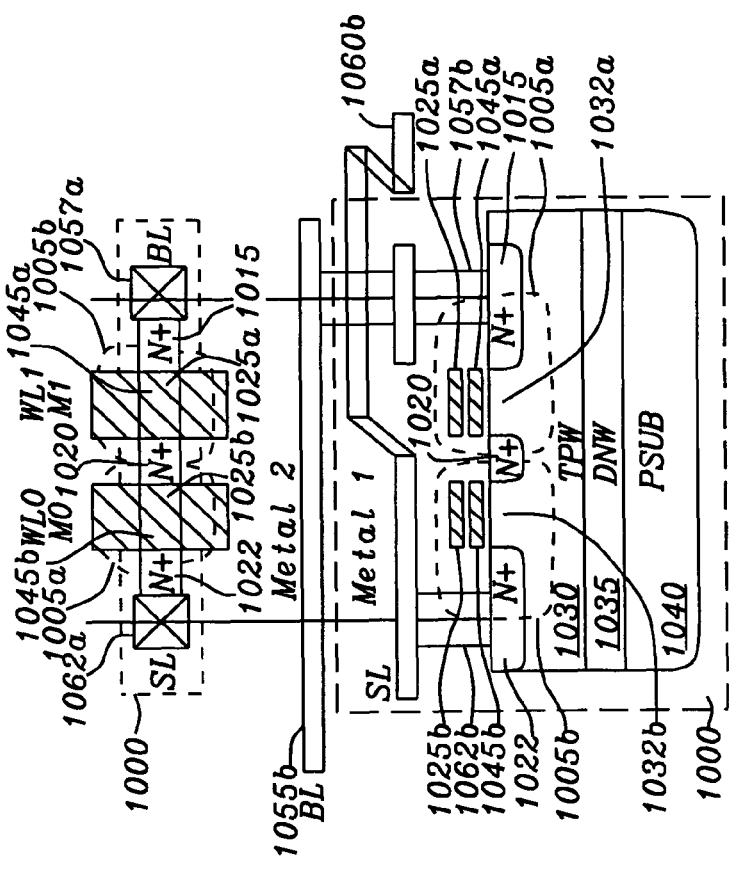
FIG. 18b-1
FIG. 18b-2
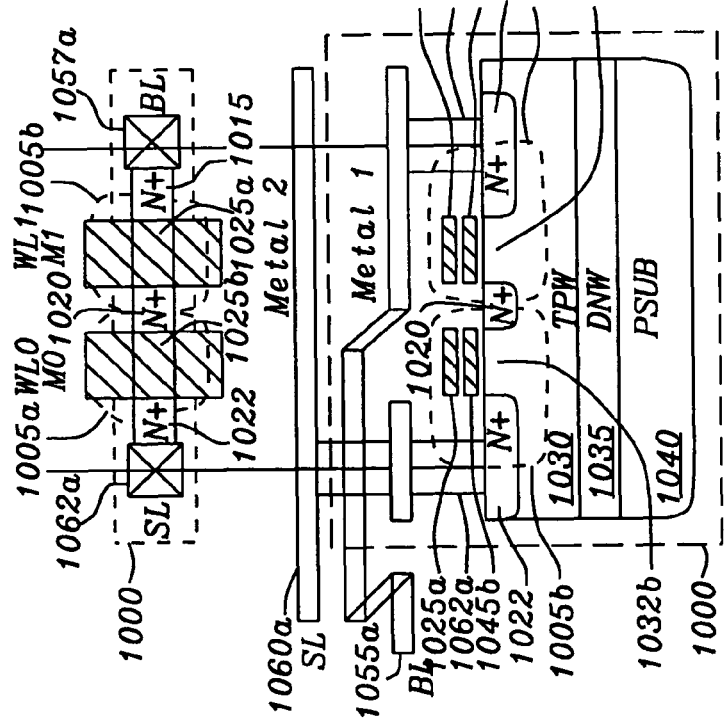
FIG. 18c-1
FIG. 18c-2

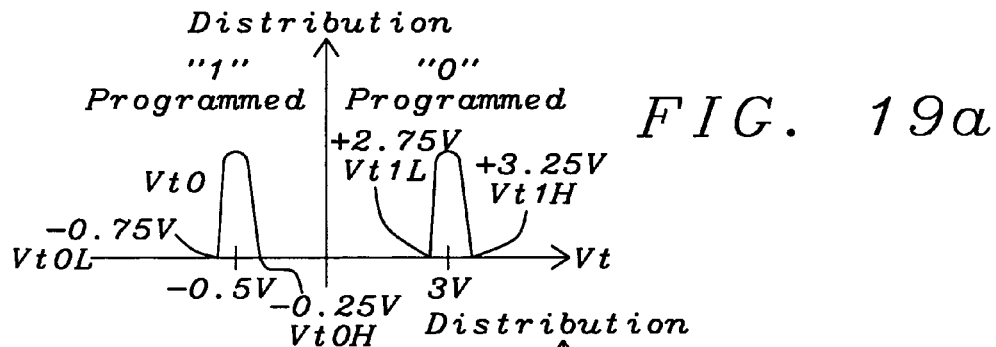
FIG. 19a
FIG. 19b
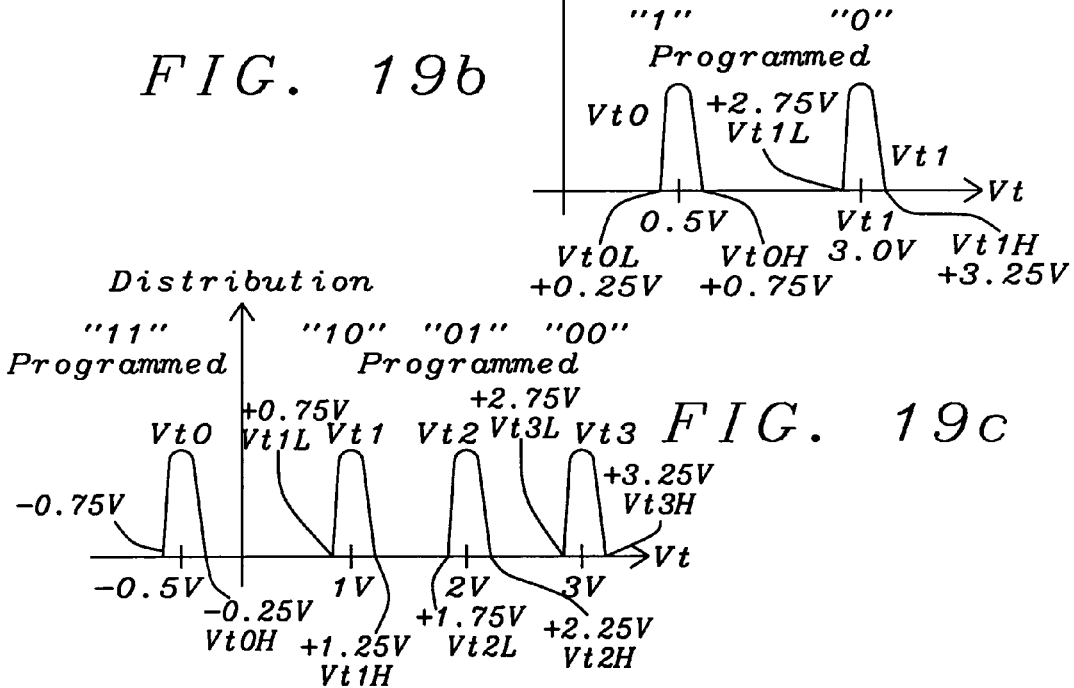
FIG. 19c
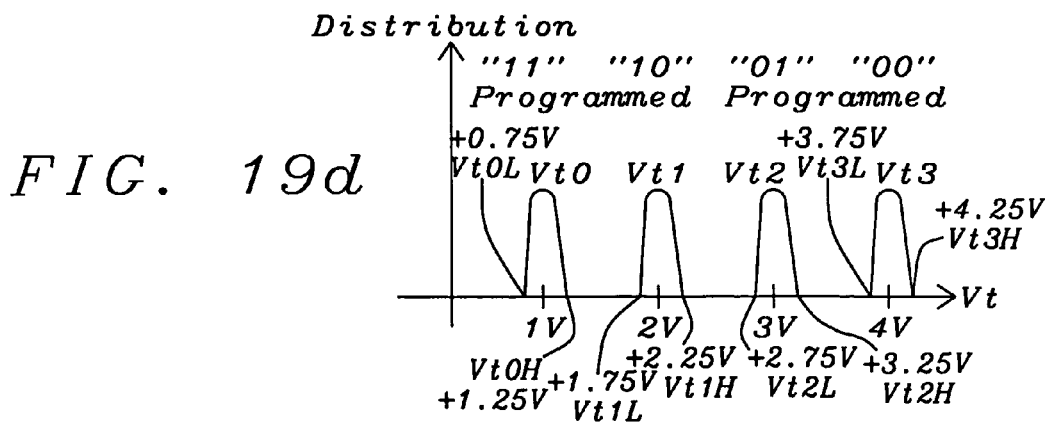
FIG. 19d

| BSC \ MODE | Selected Block IN 1302s | Selected Block OUT 1320s | Unselected Block IN 1307u | Unselected Block OUT 1320u | Power Lines & Control Signals VP1 1246c | Power Lines & Control Signals VP2 1246a | Power Lines & Control Signals PGM 1246b |
|---|---|---|---|---|---|---|---|
| READ | 0.0V | 0.0V | 0.0V | 0.0V | VDD | VDD | 0.0V |
| PAGE ERASE | VDD | VDD | 0.0V | 0.0V | VDD | VDD | 0.0V |
| PAGE ERASE VERIFY | 0.0V | 0.0V | 0.0V | 0.0V | VDD | VDD | 0.0V |
| PROGRAM | VDD | 20.0V +Vt | 0.0V | 5.0V +Vt | 20.0V +Vt | 5.0V +Vt | VDD |
| PROGRAM VERIFY | 0.0V | 0.0V | 0.0V | 0.0V | VDD | VDD | 0.0V |
| CORRECTION VERIFY | 0.0V | 0.0V | 0.0V | 0.0V | VDD | VDD | 0.0V |

LEGEND
VDD: 1.8V/3.0V

FIG. 26

| MODE | Selected Sector | | | | | | | | | | |
|---|---|---|---|---|---|---|---|---|---|---|---|
| | Selected Paired Page | Unsel Paired Page | Paired XT (Sel) | Paired XT (Unsel) | Paired XTU/XTL (Unsel) | Power Lines & Control Signals | | | | | |
| | WL (Sel) 1235s | WL (Unsel) 1235su | WL (Unsel) 1235u | 1248s | 1248su | 1248u | IN (Sel) 1307s | IN (Unsel) 1307u | RIN (Sel) 1403s | RIN (Unsel) 1403u | VPX 1425 | EN_RD 1415 | PGM_SEL 1246b |
| READ+ | Vt1L | HV* | 0V | Vt1L | HV* | 0V | 0V | 0V | VDD | 0V | HV1** | HV1** | 0V |
| PAGE ERASE | 0V | 20V! | 20V! | 0V | VDD | VDD | VDD | 0V | VDD | 0V | VDD | 0V | 0V |
| PAGE ERASE VERIFY | VtOH | HV* | 0V | VtOH | HV* | 0V | 0V | 0V | VDD | 0V | HV1** | HV1** | 0V |
| PROGRAM | 15–20V | 5V | 5V | 15–20V | 5V | 5V | VDD | 0V | VDD | 0V | VDD | 0V | 10V |
| PROGRAM VERIFY | VtOL/Vt1L | HV* | 0V | VtOL/Vt1L | HV* | 0V | 0V | 0V | VDD | 0V | HV1** | HV1** | 0V |
| CORRECTION VERIFY | Vt1H | HV* | 0V | Vt1H | HV* | 0V | VDD | 0V | VDD | 0V | HV1** | HV1** | 0V |

LEGEND
HV*: ~6V;
HV1**: >HV+Vt;
F***: Floating,
20V!: Coupled from NAND Array's TPW
READ+:TPW= −2V @ NOR Array
VDD:1.8V/3.0V

FIG. 27a

| MODE | Selected Paired Page WL (Sel) 1235s | Selected Paired Page WL (Unsel) 1235su | Unsel Paired Page WL 1235u | Paired XT (Sel) 1248s | Paired XT (Unsel) 1248su | XTU/XTL (Unsel) 1248u | IN (Sel) 1307s | IN (Unsel) 1307u | RIN (Sel) 1403s | RIN (Unsel) 1403u | VPX 1425 | EN_RD 1415 | PGM_SEL 1246b |
|---|---|---|---|---|---|---|---|---|---|---|---|---|---|
| READ+ | VR1/VR2/VR3 | HV* | 0V | VR1/VR2/VR3 | HV* | 0V | 0V | 0V | VDD | 0V | HV1** | HV1** | 0V |
| PAGE ERASE | 0V | 20V! | 20V! | 0V | VDD | VDD | VDD | 0V | VDD |  | VDD | 0V | 0V |
| PAGE ERASE VERIFY | Vt0H | HV* | 0V | Vt0H | HV* | 0V | 0V | 0V | VDD | 0V | HV1** | HV1** | 0V |
| PROGRAM | 15–20V | 5V | 5V | 15–20V | 5V | 5V | VDD | 0V | VDD | 0V | VDD | 0V | 10V |
| PROGRAM VERIFY | Vt0L/Vt1L/Vt2L/Vt3L | HV* | 0V | Vt0L/Vt1L/Vt2L/Vt3L | HV* | 0V | 0V | 0V | VDD | 0V | HV1** | HV1** | 0V |
| CORRECTION VERIFY | Vt0H/Vt1H/Vt2H/Vt3H | HV* | 0V | Vt0H/Vt1H/Vt2H/Vt3H | HV* | 0V | 0V | 0V | VDD | 0V | HV1** | HV1** | 0V |

LEGEND
HV*: ~6V;
HV1**: >HV+Vt;
F***: Floating;
20V!: Coupled from NOR Array's TPW
READ+: TPW= −2V @ NOR Array
VDD: 1.8V/3.0V

FIG. 27b

NAND STRING BASED NAND/NOR FLASH MEMORY CELL, ARRAY, AND MEMORY DEVICE HAVING PARALLEL BIT LINES AND SOURCE LINES, HAVING A PROGRAMMABLE SELECT GATING TRANSISTOR, AND CIRCUITS AND METHODS FOR OPERATING SAME

This application claims priority under 35 U.S.C. §119 to U.S. Provisional Patent Application U.S. Provisional Patent Application Ser. No. 61/130,381, filed on May 30, 2008, which is herein incorporated by reference in its entirety.

This application claims priority under 35 U.S.C. §119 to U.S. Provisional Patent Application U.S. Provisional Patent Application Ser. No. 61/131,554, filed on Jun. 9, 2008, which is herein incorporated by reference in its entirety.

This application claims priority under 35 U.S.C. §119 to U.S. Provisional Patent Application U.S. Patent Application Ser. No. 61/132,122, filed on Jun. 16, 2008, assigned to the same assignee as the present invention, and incorporated herein by reference in its entirety.

This application claims priority under 35 U.S.C. §119 to U.S. Provisional Patent Application U.S. Patent Application Ser. No. 61/132,628, filed on Jun. 20, 2008, assigned to the same assignee as the present invention, and incorporated herein by reference in its entirety.

RELATED PATENT APPLICATIONS

U.S. patent application Ser. No. 12/387,771, filed on May 7, 2009.
U.S. patent application Ser. No. 12/455,936, filed on Jun. 9, 2009.
U.S. patent application Ser. No. 12/456,354, filed on Jun. 16, 2009.
U.S. patent application Ser. No. 12/456,744, filed on Jun. 22, 2009.

BACKGROUND OF THE INVENTION

1. Field of the Invention

This invention relates generally to nonvolatile memory array structures and operation. More particularly, this invention relates to a NAND nonvolatile memory device structures, select gating devices for NAND nonvolatile memory device structures, and circuits and methods of operation of NAND nonvolatile memory device structures.

2. Description of Related Art

Nonvolatile memory is well known in the art. The different types of nonvolatile memory include Read-Only-Memory (ROM), Electrically Programmable Read Only Memory (EPROM), Electrically Erasable Programmable Read Only Memory (EEPROM), NOR Flash Memory, and NAND Flash Memory. In current applications such as personal digital assistants, cellular telephones, notebook and laptop computers, voice recorders, global positioning systems, etc., the Flash Memory has become one of the more popular types of Nonvolatile Memory. Flash Memory has the combined advantages of the high density, small silicon area, low cost and can be repeatedly programmed and erased with a single low-voltage power supply voltage source.

The Flash Memory structures known in the art employ a charge retaining mechanism such as a charge storage and a charge trapping. The charge storage mechanism, as with a floating gate nonvolatile memory, the charge representing digital data is stored on a floating gate of the device. The stored charge modifies the threshold voltage of the floating gate memory cell determine that digital data stored. In a charge trapping mechanism, as in a Silicon-Oxide-Nitride-Oxide-Silicon (SONOS) or Metal-Oxide-Nitride-Oxide-Silicon (MONOS) type cell, the charge is trapped in a charge trapping layer between two insulating layers. The charge trapping layer in the SONOS/MONOS devices has a relatively high dielectric constant (k) such Silicon Nitride ($SiN_x$).

A present day flash nonvolatile memory is divided into two major product categories such as the fast random-access, asynchronous NOR flash nonvolatile memory and the slower serial-access, synchronous NAND flash nonvolatile memory. NOR flash nonvolatile memory as presently designed is the high pin-count memory with multiple external address and data pins along with appropriate control signal pins. One disadvantage of NOR flash nonvolatile memory is as the density is doubled, the number of its required external pin count increases by one due to the adding of one more external address pin for doubling the address space of the memory. In contrast, NAND flash nonvolatile memory has an advantage of having a smaller pin-count than NOR with no address input pins. As density increases, the NAND flash nonvolatile memory pin count is always kept constant. Both mainstreamed NAND and NOR flash nonvolatile memory cell structures in production today use a one charge retaining (charge storage or charge trapping) transistor memory cell that stores one bit of data as charge or as it commonly referred to as a single-level program cell (SLC). They are respectively referred as one-bit/one transistor NAND cell or NOR cell, storing a single-level programmed data in the cell.

The NAND and NOR flash nonvolatile memory provide the advantage of in-system program and erase capabilities and have a specification for providing at least 100K endurance cycles. In addition, both single-chip NAND and NOR flash nonvolatile memory product can provide giga-byte density because their highly-scalable cell sizes. For instance, presently a one-bit/one transistor NAND cell size is kept at $\sim 4\lambda^2$ ($\lambda$ being a minimum feature size in a semiconductor process), while NOR cell size is $\sim 10\ \lambda^2$. Furthermore, in addition to storing data as a single-level program cell having two voltage thresholds (Vt0 and Vt1), both one transistor NAND and NOR flash nonvolatile memory cells are able to store at least two bits per cell or two bits/one transistor with four multi-level threshold voltages (Vt0, Vt1, Vt2 and Vt03) in one physical cell.

Currently, the highest-density of a single-chip double polycrystalline silicon gate NAND flash nonvolatile memory chip is 64 Gb. In contrast, a double polycrystalline silicon gate NOR flash nonvolatile memory chip has s density of 2 Gb. The big gap between NAND and NOR flash nonvolatile memory density is a result of the superior scalability of NAND flash nonvolatile memory cell over a NOR flash nonvolatile memory. A NOR flash nonvolatile memory cell requires 5.0V drain-to-source (Vds) to maintain a high-current Channel-Hot-Electron (CHE) programming process. Alternately, a NAND flash nonvolatile memory cell requires 0.0V between the drain to source for a low-current Fowler-Nordheim channel tunneling program process. The above results in the one-bit/one transistor NAND flash nonvolatile memory cell size being only one half that of a one-bit/one transistor NOR flash nonvolatile memory cell. This permits a NAND flash nonvolatile memory device to be used in applications that require huge data storage. A NOR flash nonvolatile memory device is extensively used as a program-code storage memory which requires less data storage and requires fast and asynchronous random access.

SUMMARY OF THE INVENTION

An object of this invention is to provide a nonvolatile memory array having one local source line and one local bit line associated with each column of nonvolatile memory cells that form the nonvolatile memory array.

Another object of this invention is to provide a nonvolatile memory circuit having at least one nonvolatile memory cell and at least one charge retaining (floating gate or SONOS) select gating transistor for selecting the nonvolatile memory circuit to be connected to a column bit line of an array of nonvolatile memory cells.

Further, another object of this invention is to provide a row decode/driver circuit peripheral to an array of nonvolatile memory cells for controlling the application of the necessary read, program, and erase signals to selected nonvolatile memory cells of the array of nonvolatile memory cells.

Even further, another object of this invention is to provide a circuit and method for refreshing a nonvolatile memory cells within an array of nonvolatile memory cells to eliminate the effects of program disturb voltages.

To accomplish at least one of these objects, an embodiment of a nonvolatile memory array has a plurality of charge retaining transistors arranged in rows and columns. Each column of the charge retaining transistors has at least one grouping of the charge retaining transistors connected to form a NAND nonvolatile memory circuit or a NOR nonvolatile memory circuit. Each NAND nonvolatile memory circuit or NOR nonvolatile memory circuit is associated with a bit line and a source line. A drain of a first of the charge retaining transistors of each grouping of the charge retaining transistors is connected to transfer drain operating signals between the associated bit line and the NAND nonvolatile memory circuit or a NOR nonvolatile memory circuit. A source of a second of the charge retaining transistors of each grouping of the charge retaining transistors is connected to transfer source operating signals between the associated source line and the NAND nonvolatile memory circuit or a NOR nonvolatile memory circuit. The operational signals are the appropriate voltage levels for reading, programming, and erasing selected charge retaining transistors at appropriate timing intervals.

In other embodiments, each grouping of the charge retaining transistors has a first select gating charge retaining transistor connected between the drain of the first charge retaining transistor and the bit line. A gate of the first select gating charge retaining transistor is connected to receive a first select signal for turning on the select gating charge retaining transistor to connect the drain of the charge retaining transistor to the bit line.

In other embodiments, each grouping of the charge retaining transistors has a second select gating charge retaining transistor connected between the drain of the second charge retaining transistor and the source line. A gate of the second select gating charge retaining transistor is connected to receive a second select signal for turning on the select gating charge retaining transistor to connect the drain of the charge retaining transistor to the source line.

In still other embodiments, the nonvolatile memory array is divided into sub-arrays or blocks. Each block has a row decoder that is connected to a control gate of each charge retaining transistor of a row of the charge retaining transistors to select the charge retaining transistors on the row for reading, programming, or erasing. The row decoder circuit includes a plurality of block decoder circuits to select the sub-array or block containing the row of charge retaining transistors to be read, programmed, or erased. In various embodiments, the row decoder has a plurality of high voltage charge-pump circuits to activate the select gating charge retaining transistors connected to each column grouping of the select gating charge retaining transistors. A plurality of pass-transistors connects the control gates of each row of charge retaining transistors through their associated word lines to address input lines having the necessary voltage levels for reading, programming, or erasing the charge retaining transistors of each row of the selected block. The gate of a block select transistor is connected to the high voltage charge pump circuit to selectively connect a global select signal to the gates of the select gating charge retaining transistors associated with each column of the select gating charge retaining transistor. The gates of the pass-transistors are connected to the charge pump circuit to selectively connect the word lines of the selected block to the address input lines to provide the necessary voltages to the word lines for reading, programming, or erasing.

The high voltage charge circuit includes two charge-pump sub-circuits. The first charge-pump sub-circuit has a first logic circuit (a NAND gate in some embodiments) with a first input connected to a pump clocking signal and a second input connected to an address enabling signal such that when the enabling signal is active, the clock is passed to the output of the first logic circuit. The first charge-pump sub-circuit includes a first high voltage coupling capacitor and a first high voltage diode that form a first voltage multiplier circuit. A first high voltage gating transistor and second high voltage gating transistor pass a first high voltage power supply level to an output node during a read and verify operation.

The second charge-pump sub-circuit has a second logic circuit (NOR gate in some embodiments) with a first input connected to the address enabling signal and a second input connected to and an inversion of a program command signal. The output is activated when the address enabling circuit is active and the program command signal is inactive. The second charge-pump sub-circuit has a third logic circuit (a NAND gate in some embodiments) that has a first input connected to the pump clocking signal and a second input connected to the output of the second logic circuit. The address enabling signal and the inversion of the program command signal are activated such that when the enabling signal is active, the clock is passed to the output of the second logic circuit. The second charge-pump sub-circuit includes a second high voltage coupling capacitor and a second high voltage diode that form a second voltage multiplier circuit. A third high voltage gating transistor and fourth high voltage gating transistor passes an intermediate voltage power supply level to an output node during a program operation.

A third high voltage gating pass transistor couples a full power supply voltage level to the output node during a read operation.

Each of the plurality of high voltage charge-pump circuits include a fourth logic circuit (a NOR circuit in some embodiments) with a first input connected to receive an erase command signal, a second input connected to receive the program command signal, and a third input connected to receive the address enabling signal such that the output has an logic state set so that unselected blocks of the array of nonvolatile memory cells have their bit lines set to be floating.

During a program and erase operation, the fourth logic circuit is activated such that the output has its logic state set so that blocks of the array of nonvolatile memory cells have their bit lines set to first or second high voltage power supply levels. In the erase operation, the global select signal associated with each column of the select gating charge retaining transistor is floating. This allows the coupling of a high erase voltage to be coupled to the gate of the first select gating charge retaining transistor from a well of a first conductivity type into which the selected block is formed to avoid an oxide breakdown during a Fowler-Nordheim erase operation.

In still other embodiments, each block of the nonvolatile memory array is divided into pages. In many embodiments, a page is a row of charge retaining transistors. The nonvolatile memory array further includes a block erase count register. The block erase count register contains an erase operations count indicating a number of erase operations that a block of the nonvolatile memory array has experienced to designate which of the pages in the unselected blocks of a selected sector of the nonvolatile memory array are to be refreshed. The block erase count register includes a number of the charge retaining transistors to store the erase operations count. In some embodiments, the number of charge retaining transistors is five to record a maximum number of erase operations as 32.

BRIEF DESCRIPTION OF THE DRAWINGS

FIG. 3a is a schematic diagram of a serial string of floating-gate transistor NMOS NAND flash cells.

FIG. 3b is a top plan layout view of a serial string of floating-gate transistor NMOS NAND flash cells.

FIG. 9 is a table of the operational voltages charge pump of the row decoder of FIG. 8.

FIG. 12a is a table illustrating the voltage conditions applied to an array of a serial string of floating-gate transistor NMOS NAND flash cells having single level programmed cells (SLC) embodying the principles of the present invention.

FIG. 12b is a table illustrating the voltage conditions applied to an array of a serial string of floating-gate transistor NMOS NAND flash cells having multiple-level programmed cells (MLC) embodying the principles of the present invention.

FIGS. 18b-1, 18b-2, 18c-1 and 18c-2 are top plan views and cross sectional cross sectional views of an embodiment of two transistor floating-gate NMOS NOR flash cell embodying the principles of the present invention.

FIGS. 19a-19d are graphs of threshold voltage levels for various embodiments of the two transistor floating-gate NAND based NMOS NOR flash cell embodying the principles of the present invention.

FIG. 26 is a table of the operational voltages of the write block row decoder of FIG. 22.

FIG. 27a is a table illustrating the voltage conditions applied to an array of an array of two transistor floating-gate NAND based NMOS NOR flash cells having single level programmed cells (SLC) embodying the principles of the present invention.

FIG. 27b is a table illustrating the voltage conditions applied to an array of an array of two transistor floating-gate NAND based NMOS NOR flash cells having multiple-level programmed cells (MLC) embodying the principles of the present invention.

DETAILED DESCRIPTION OF THE INVENTION

Figure 1A:
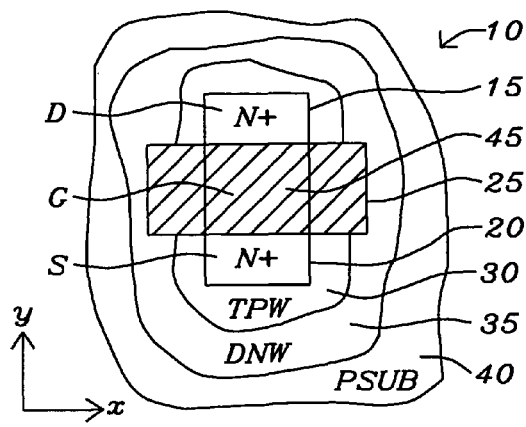
FIG. 1a is a top plan layout view of a single transistor floating-gate NMOS NAND flash cell.
Figure 1C:
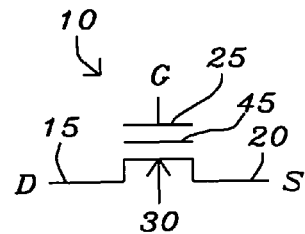
FIG. 1c is a schematic diagram of single transistor floating-gate NMOS NAND flash cell.
Figure 1B:
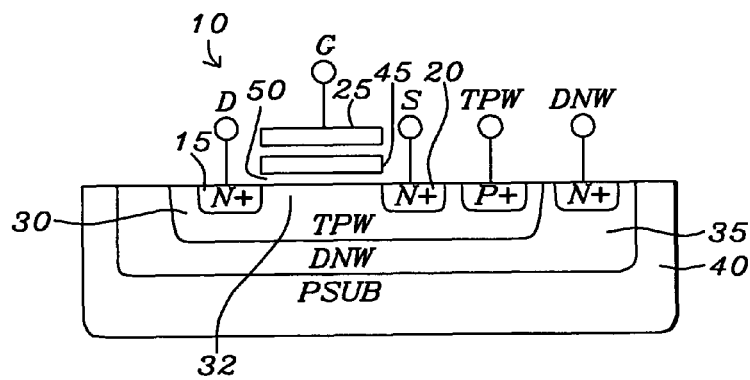
FIG. 1b is a cross sectional view of a single transistor floating-gate NMOS NAND flash cell.

FIG. 1a is a top plan view of a NMOS NAND flash floating-gate transistor 10. FIG. 1b is a cross sectional view NMOS NAND flash floating-gate transistors 10. FIG. 1c is the schematic symbol NMOS NAND flash floating-gate transistors 10. In a common structure of a NAND cell string of the NMOS NAND flash floating-gate transistors 10, the NMOS NAND flash floating-gate transistors 10 do not require a contact at either the drain diffusion region 15 or source diffusion region 20 node. In conventional NAND cell strings have a top select transistor connected to the topmost transistor and a bottom select transistor connected to the bottommost transistor. The drain of the top select transistor and the source of the bottommost transistor have contacts for connected to bit lines and source lines. This structure for a conventional NAND string enables the size of the NMOS NAND flash floating-gate transistors 10 to be the smallest of the nonvolatile memory structures.

The floating-gate type NMOS NAND flash cell 10 is formed in the top surface of a P-type substrate 40. An N-type material is diffused into the surface of the P-type substrate 40 to form a deep N-well 35. A P-type material is then diffused into the surface of the deep N-well 35 to form a P-well 30 (commonly referred to as a triple P-well). The N-type material is then diffused into the surface of a P-type well 30 to form the drain (D) 15 and the source (S) 20. A first polycrystalline silicon layer is formed above the bulk region of the P-type well 30 between the drain region 15 and the source region 20 to form the floating gate 45. A second polycrystalline silicon layer is formed over the floating gate 45 to create a control gate (G) 25 of the NMOS NAND flash floating-gate transistors 10. The gate length of the NMOS NAND flash floating-gate transistors 10 is the channel region in the bulk region of P-type well 30 between drain region 15 and the source region 20. The NMOS NAND flash floating-gate transistor's 10 channel width is determined by the width of the N-diffusion of the drain 15 and the source 20. The typical unit size of the NMOS NAND flash floating-gate transistors 10 is about $4\lambda^2$ with $2\lambda$ in X-dimension and $2\lambda$ in Y-dimension. The dimension Lambda ($\lambda$) is the minimum size of feature geometry achievable within a manufacturing process.

The floating-gate layer 45 stores electron charges to modify the threshold voltage of the NMOS NAND flash floating-gate transistors 10. In operation, the P-type substrate 40 is connected to a ground reference voltage source (GND). The deep N-well 35 is connected to the power supply voltage source (VDD). In present designs of NMOS NAND flash floating-gate transistors 10, the power supply voltage source is either 1.3V or 3.0V. The triple P-type well 30 is connected to the ground reference voltage in normal read operation.

In an array of NMOS NAND flash floating-gate transistors 10, the NMOS NAND flash floating-gate transistors 10 are arranged in rows and columns. The second polycrystalline silicon layer 25 that is the control gate of the NMOS NAND flash floating-gate transistors 10 is extended to form a wordline that connects to each of the NMOS NAND flash floating-gate transistors 10 on a row of an array.

A tunnel oxide 50 is formed on top of the channel region 32 between the drain region 15 and the source region 20 and the floating-gate 45. The thickness of the tunnel oxide 50 typically 100 Å. The tunnel oxide 50 is the layer through which the electron charges tunnel during the Fowler-Nordheim channel programming and Fowler-Nordheim channel erasing. In a traditional NAND operation, Fowler-Nordheim channel erasing expels stored electrons from the floating-gate 45 through the tunnel oxide 50 to cell's channel region 32 into the triple P-well 30.

Figure 1D:
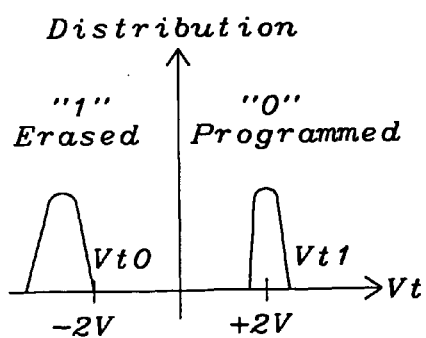
FIG. 1d is a graph of two threshold voltage distributions of a single transistor floating-gate NMOS NAND flash cell having a negative erase level and a single positive program level.

FIG. 1d is a graph of two threshold voltage distributions of a single transistor floating-gate NMOS NAND flash cell having a single program level and a erase level. After an erase operation, there are fewer electron charges in the floating-gate 45 that result in lowering the threshold voltage of the NMOS NAND flash floating-gate transistors 10. Normally, the erased NMOS NAND flash floating-gate transistors 10 has its threshold voltage set to approximately −2.0V. In contrast, in Fowler-Nordheim channel programming, electrons are attracted to the floating-gate 45 so that threshold voltage of the NMOS NAND flash floating-gate transistors 10 is increased to a voltage level of approximately +2.0V. By convention, the erased voltage threshold (Vt0) value of approximately −2.0V is designated as a logical data value of "1" and the programmed voltage threshold (Vt1) of +2.0V is designated as a logical data value of "0".

In an array, the Fowler-Nordheim channel erase process removes electron charges from the floating-gate and is generally performed collectively in unit of a page (512 B) or a sector (64 KB) and the erased voltage threshold (Vt0) has a wider distribution because the nature of the process makes it more difficult to control the removal of the electrons. Alternately, a programming operation injects electrons into the floating-gate in a more controllable way and can be performed on bit-by-bit basis (one NMOS NAND flash floating-gate transistor 10 at a time through the a bit line connected to a drain 15) so that the programmed voltage threshold (Vt1) distribution is much smaller than erased voltage threshold (Vt0) and is controlled within 0.5V. Since each NAND cell stores two distinctive voltage threshold states with the erase voltage threshold state (Vt0) having a wide distribution and the programmed voltage threshold (Vt1) having one narrow distribution, the NMOS NAND flash floating-gate transistors 10 stores only one bit of a binary data and is referred to as a single level programmed or SLC, which stands for Single-Level-Cell. The NMOS NAND flash floating-gate transistors 10 that stores a single bit of data is referred to as a single-bit-one-transistor NMOS NAND flash floating-gate cell (1b1T).

Figure 1E:
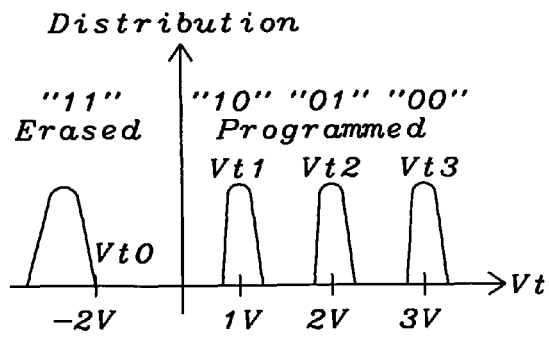
FIG. 1e is a graph of four threshold voltage distributions of a single transistor floating-gate NMOS NAND flash cell having a negative erase level and three positive program levels.

FIG. 1e is a graph of four threshold voltage distributions of a single transistor floating-gate NMOS NAND flash cell having one erase level and three program levels. It is known in the art that by varying the program conditions more than two threshold voltage levels can be created based on the quantity of charge placed on the floating-gate 45 of the NMOS NAND flash floating-gate transistors 10. This is commonly referred to multiple level programming of a NMOS NAND flash floating-gate cell or MLC, which stands for multi-level cell. In this example, there are four threshold voltage levels that can be programmed to the NMOS NAND flash floating-gate transistors 10. The most negative threshold voltage level Vt0 is the erased voltage level with a nominal value of −2.0V for storing a logical data value of "11". The most negative threshold voltage level Vt0 has the widest distribution of the threshold voltage levels (Vt0, Vt1, Vt2 and Vt3) because it is the only one erase state, which is performed to remove the electron charges. The other three threshold voltage levels (Vt1, Vt2 and Vt3) have a more narrow distribution of the programmed states because they add the electrons onto the floating-gate in a more controlled fashion from the erase state. The three positive narrow programmed voltage threshold voltage levels are set to be sufficiently spaced apart to allow detection. In the present example, the first of the three voltage threshold levels Vt1 has a nominal value of approximately +1.0V for storing a logical data value "10". The second of the three voltage threshold levels Vt2 has a nominal value of approximately +2.0V for storing a logical data value "01". The third of the three voltage threshold level Vt3 has a nominal value of approximately +3.0V for storing a logical data value "00". Since each NMOS NAND flash floating-gate transistor 10 stores four distinctive threshold voltage states, each NMOS NAND flash floating-gate transistor 10 stores two bits binary data and is referred to as a two-bit-one-transistor NMOS NAND flash cell (2b/1T).

The nominal values of threshold voltages (Vt0, Vt1, Vt2 and Vt3) of the NMOS NAND flash floating-gate transistors 10 may vary by more than 1.0V among different designs. The assignment of 2-bit data states for four threshold voltage states may also vary between NMOS NAND flash floating-gate cell designs. For example, some NMOS NAND flash floating-gate cell designs assign the logical data value 10 to the first positive threshold voltage Vt1 and the logical data value 01 for the second positive threshold voltage state Vt2. Or the negative erased threshold voltage Vt0 may be assigned to the logical data value 11 and the third positive threshold voltage Vt3 may be assigned to the logical data value 00.

Figure 2A:
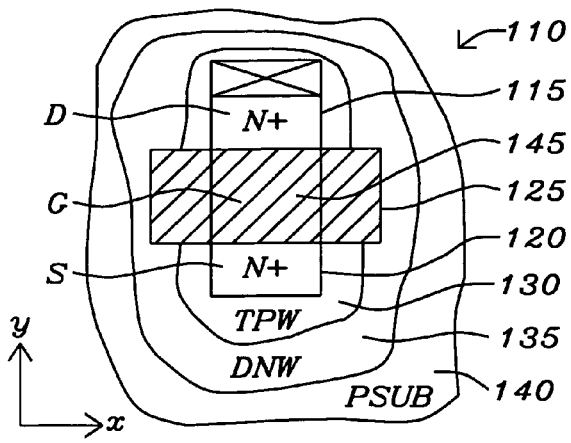
FIG. 2a is a top plan layout view of a single transistor floating-gate NMOS NOR flash cell.
Figure 2C:
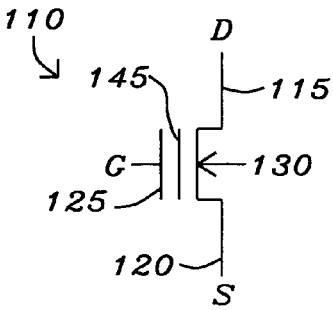
FIG. 2c is a schematic diagram of a single transistor floating-gate NMOS NOR flash cell.
Figure 2B:
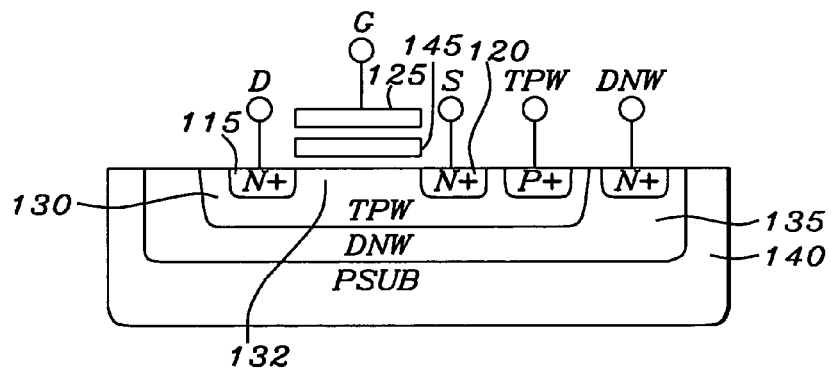
FIG. 2b is a cross sectional view of a single transistor floating-gate NMOS NOR flash cell.

FIG. 2a is a top plan view of a NMOS NOR flash floating-gate transistor 110. FIG. 2b is a cross sectional view NMOS NOR flash floating-gate transistors 110. FIG. 2c is the schematic symbol NMOS NOR flash floating-gate transistors 110. The floating-gate type NMOS NOR flash cell 110 is formed in the top surface of a triple P-type substrate 130. An N-type material is diffused into the surface of the P-type substrate 140 to form a deep N-well 135. A P-type material is then diffused into the surface of the deep N-well 135 to form a P-well 130 (commonly referred to as a triple P-well). The N-type material is then diffused into the surface of a P-type well 130 to form the drain (D) 115 and the self-aligned source (S) 120. A first polycrystalline silicon layer is formed above the bulk region of the P-type well 130 between the drain region 115 and the source region 120 to form the floating gate 145. A second polycrystalline silicon layer is formed over the floating gate 145 to create a control gate (G) 125 of the NMOS NOR flash floating-gate transistors 110. The self-aligned source 120 is formed self-aligned between two adjacent second polycrystalline silicon layers of two control gates 125 of a pair of NMOS NOR flash floating-gate transistors 110. The self-aligned source 120 is commonly used in NMOS NOR flash floating-gate transistors 110 to reduce the source line pitch.

The gate length of the NMOS NOR flash floating-gate transistors 110 is the channel region 132 in the bulk region of P-type well 130 between drain region 115 and the source region 120. The NMOS NOR flash floating-gate transistor's 110 channel width is determined by the width of the N-diffusion of the drain 115 and the source 120. The typical unit size of the NMOS NOR flash floating-gate transistors 110 is about $10\lambda^2$ with $2.5\lambda$ in the X-dimension and $4\lambda$ in the Y-dimension.

The floating-gate layer 145 stores electron charges to modify the threshold voltage of the NMOS NOR flash floating-gate transistors 110. In all operations, the P-type substrate 140 is connected to a ground reference voltage source (GND). The deep N-well 135 is connected to the power supply voltage source (VDD) in read and program operations but around +10V in the Fowler-Nordheim channel erase operation. In present designs of NMOS NOR flash floating-gate transistors 110, the power supply voltage source is either 1.8V or 3.0V. The triple P-type well 130 is connected to the ground reference voltage in normal read and program operation but to the +10V during erase operation. In other words, during the Fowler-Nordheim channel erase operation, both the deep N-well 135 and the triple P-well 130 are biased with the same voltage of approximately +10V to avoid forward leakage current through the P/N junction through the deep N-well 135 and the triple P-well 130.

In an array of NMOS NOR flash floating-gate transistors 110, the NMOS NOR flash floating-gate transistors 110 are arranged in rows and columns. The second polycrystalline silicon layer 125 that is the control gate of the NMOS NOR flash floating-gate transistors 110 is extended to form a wordline that connects to each of the NMOS NOR flash floating-gate transistors 110 on a row of the array.

A tunnel oxide 150 is formed on top of the channel region 132 between the drain region 115 and the source region 120 and the floating-gate 145. The thickness of the tunnel oxide 150 typically 100 Å. The tunnel oxide 150 is the layer through which the electron charges pass during the high current channel-hot-electron programming and low current Fowler-Nordheim channel erasing. In a traditional NOR operation, Fowler-Nordheim channel erasing expels stored electrons from the floating-gate 145 through the tunnel oxide 150 to cell's channel region 132 into the triple P-type well 130.

After an erase operation, fewer electron charges are stored in the floating-gate 145 that results in a decrease in the NMOS NOR flash floating-gate transistor's 110 first threshold voltage level (Vt0) of less than approximately 2.5V. In contrast, in a channel-hot-electron program operation, electrons are attracted into floating-gate 145 so that the NMOS NOR flash floating-gate transistor's 110 second threshold voltage level (Vt1) is set to the voltage greater than approximately 4.0V. The distributions of the first threshold voltage level (Vt0) for an erased state with a wide distribution and the second threshold voltage level (Vt1) for a programmed state with a narrow distribution are set to be positive to avoid any false reading induced by the NMOS NOR flash floating-gate transistors 110 having a negative threshold voltage level.

Figure 2D:
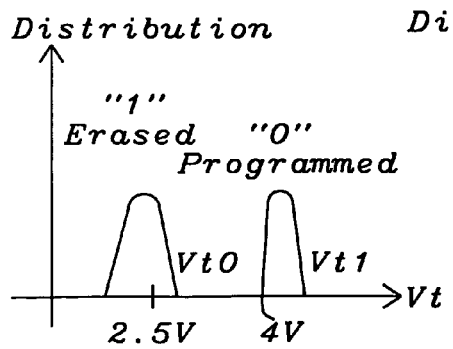
FIG. 2d is a graph of two threshold voltage distributions of a single transistor floating-gate NMOS NOR flash cell having a positive erase level and a single positive program level.

FIG. 2d is a graph of two threshold voltage distributions of a single transistor floating-gate NMOS NOR flash cell having a single program level. After an erase operation, there are fewer electron charges in the floating-gate 45 that result in lowering the threshold voltage of the NMOS NOR flash floating-gate transistors 10. Normally, the erased NMOS NOR flash floating-gate transistors 10 has a maximum value of its threshold voltage set to approximately +2.5V. In contrast, in channel-hot-electron-programming, electrons are injected to the floating-gate 45 so that threshold voltage of the NMOS NOR flash floating-gate transistors 10 is increased to a minimum is value voltage level of approximately +4.0V. By convention, the erased voltage threshold (Vt0) value of approximately +2.5V is designated as a logical data value of "1" and the programmed voltage threshold (Vt1) of +4.0V is designated as a logical data value of "0". As in the NMOS NAND flash floating-gate transistors, the NMOS NOR flash floating-gate transistors 10 that stores a single bit of data is referred to as a single-bit-one-transistor NMOS NOR flash floating-gate cell (1b1T)

Figure 2E:
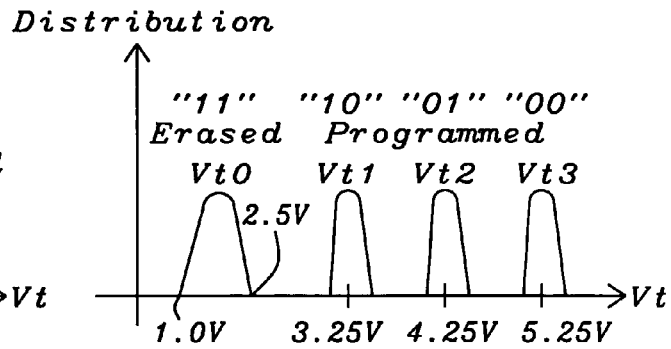
FIG. 2e is a graph of four threshold voltage distributions of a single transistor floating-gate NMOS NOR flash cell having a positive erase level and three positive program levels.

FIG. 2e is a graph of four threshold voltage distributions of a single transistor floating-gate NMOS NOR flash cell having one erase level and three program levels. It is known in the art that by varying the program conditions more than two threshold voltage levels can be created based on the quantity of charge placed on the floating-gate 145 of the NMOS NOR flash floating-gate transistors 110. This is commonly referred to multiple level programming of a NMOS NOR flash floating-gate cell or multi-level programmed cell. In this example, there are four threshold voltage levels that can be programmed to the NMOS NOR flash floating-gate transistors 110. The least positive wide-distribution threshold voltage level Vt0 is the erased voltage level with a maximum value of +2.5V for storing a logical data value of "11". The three positive narrow-distribution programmed voltage threshold voltage levels are set to be sufficiently spaced apart to allow accurate detection. In the present example, the first of the three voltage threshold levels Vt1 has a nominal value of approximately −3.25V for storing a logical data value "10". The second of the three voltage threshold levels Vt2 has a nominal value of approximately +4.25V for storing a logical data value "01". The third of the three voltage threshold level Vt3 has a nominal value of approximately +5.25V for storing a logical data value "00". Since each NMOS NOR flash floating-gate transistor 110 stores four distinctive positive threshold voltage states, each NMOS NOR flash floating-gate transistor 110 stores two bits binary data and is referred to as a two-bit-one-transistor NMOS NOR flash cell (2b/1T).

The nominal values of threshold voltages Vt1 and Vt2 of the NMOS NOR flash floating-gate transistors 110 may vary by more than 1.0V among different designs. The nominal values of threshold voltages Vt0 and Vt3 can have a wider threshold voltage distribution. For example, the first threshold voltage Vt0 is may vary from approximately 1.0V to approximately 2.5V. The fourth threshold voltage Vt3 can have much wider distribution. It must have a voltage greater than approximately 4.5V to ensure that the NMOS NOR flash floating-gate transistors 110 is in a non-conduction state. The assigned designations of 2-bit data states for four threshold voltage states may also vary between NMOS NOR flash floating-gate cell designs as described above in the NMOS NAND flash floating-gate cell.

Figure 3C:
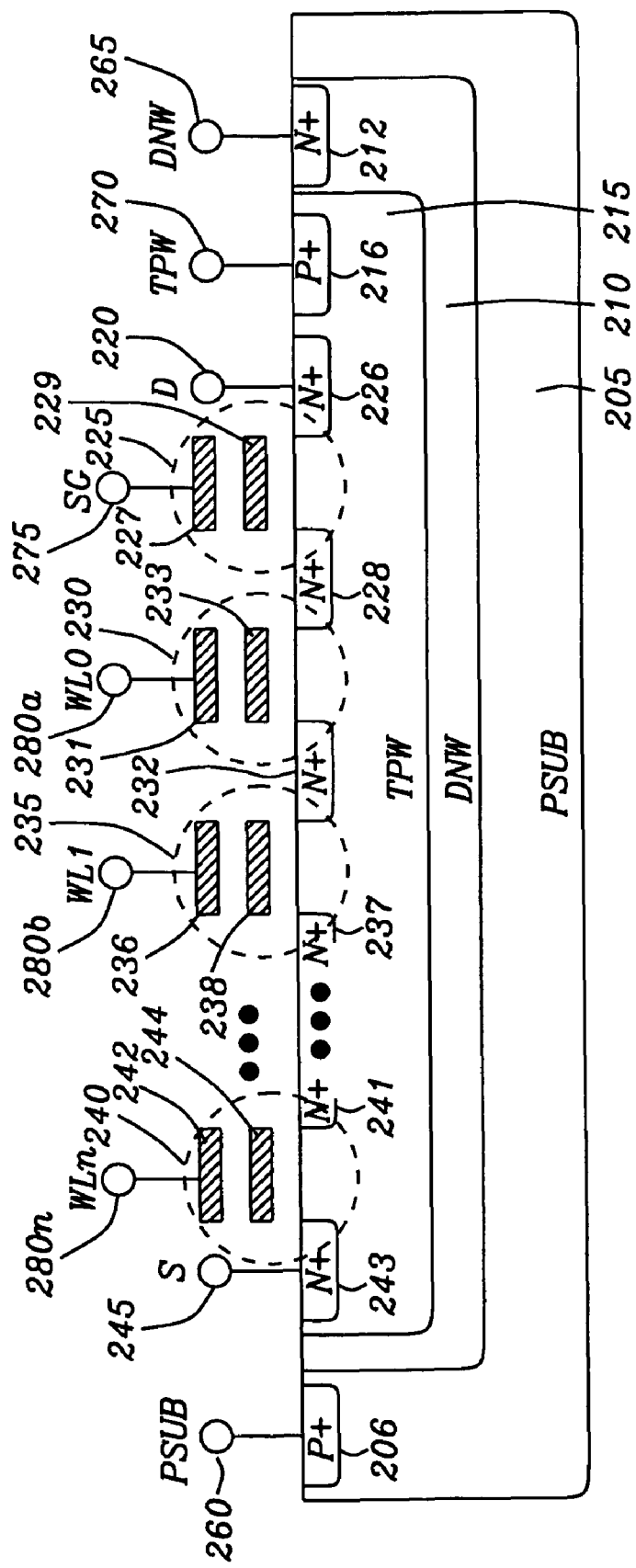
FIG. 3c is a cross sectional view of a serial string of floating-gate transistor NMOS NAND flash cells.

FIG. 3a is the schematic symbol of an implementation of a serial string of floating-gate transistor NMOS NAND flash cells 200 embodying the principles of the present invention. FIG. 3b is a top plan view of an implementation of a serial string of floating-gate transistor NMOS NAND flash cells 200 embodying the principles of the present invention. FIG. 3c is a cross sectional view of an implementation of a serial string of floating-gate transistor NMOS NAND flash cells 200 embodying the principles of the present invention. The a serial string of floating-gate transistor NMOS NAND flash cells 200 is formed in the top surface of a P-type substrate 205. An N-type material is diffused into the surface of the P-type substrate 205 to form a deep N-well 210. A P-type material is then diffused into the surface of the deep N-well 210 to form a P-well 215 (commonly referred to as a triple P-well). The N-type material is then diffused into the surface of a P-type well 215 to form the drain region (D) 226 of the NMOS floating-gate select transistor 225, the source region of the NMOS NAND flash floating-gate transistor 243 and the self-aligned source/drain regions (S/D) 228, 232, 237, and 241. The self-aligned source/drain regions 228, 232, 237, and 241 are the source regions and the drain regions for the NMOS NAND flash floating-gate transistors 230, 235, and 240. A first polycrystalline silicon layer is formed above the bulk region of the P-type well 215 between the drain region 226 and the source/drain region 228 of the NMOS floating-gate select transistor 225 to form the floating gate 229. The first polycrystalline layer is also formed above the bulk regions between the source/drain regions 228, 232, 237, and 241 of the serial string of NMOS NAND flash floating-gate transistors 230, 235, and 240 to form the floating gates 233, 236, and 244 of the NMOS NAND flash floating-gate transistors 230, 235, and 240. A second polycrystalline silicon layer is formed over the floating gates 229, 233, 236, and 244 to create the control gates 227, 231, 238, and 242 of the NMOS floating-gate select transistor 225 and the NMOS NAND flash floating-gate transistors 230, 235, and 240. The self-aligned source/drain regions 228, 232, 237, and 241 are formed as self-aligned between the adjacent second polycrystalline silicon layers of control gates 227, 231, 238, and 242 of NMOS floating-gate select transistor 225 and NMOS NAND flash floating-gate transistors 230, 235, and 240. The self-aligned source/drain regions 228, 232, 237, and 241 are commonly used in the NMOS floating-gate select transistor 225 and the NMOS NAND flash floating-gate transistors 230, 235, and 240 to reduce the source line pitch.

In a serial string of floating-gate transistor NMOS NAND flash cell 200, the NMOS NAND flash floating-gate transistors 230, 235, and 240 are arranged in rows and columns with the NMOS floating-gate select transistor 225 connected to the top NMOS NAND flash floating-gate transistor 230 of each NAND string of the flash floating-gate transistors 230, 235, and 240. The control gates 231, 236, and 242 of the NMOS NAND flash floating-gate transistors 230, 235, and 240 are extended to form word lines 280a, 280b, . . . , 280n that connect to each of the NMOS NAND flash floating-gate transistors 230, 235, and 240 on a row of the array. The control gate 227 of the NMOS floating-gate select transistor 225 is connected to receive the select gating signal 275 at the drain 220. A P$^+$-contact 216 connects a P-well voltage source to the P-well voltage source 270, the N$^+$-contact 212 is connected to the deep N-well voltage source 265, and the P$^+$-contact 206 is connected to the P-substrate voltage source 260. In most embodiments P-substrate voltage source 260 is actually the ground reference voltage.

Figure 3D:
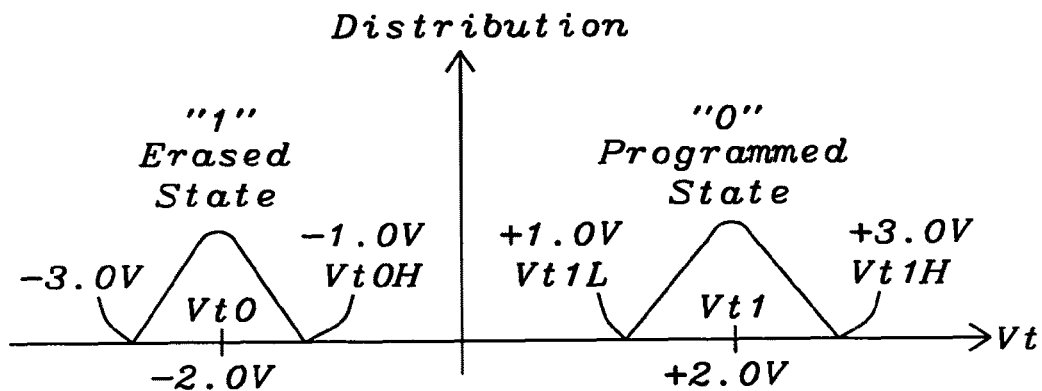
FIG. 3d is a graph of two threshold voltage distributions of a serial string of floating-gate transistor NMOS NAND flash cells having a positive erase level and a single positive program level.
Figure 3E:
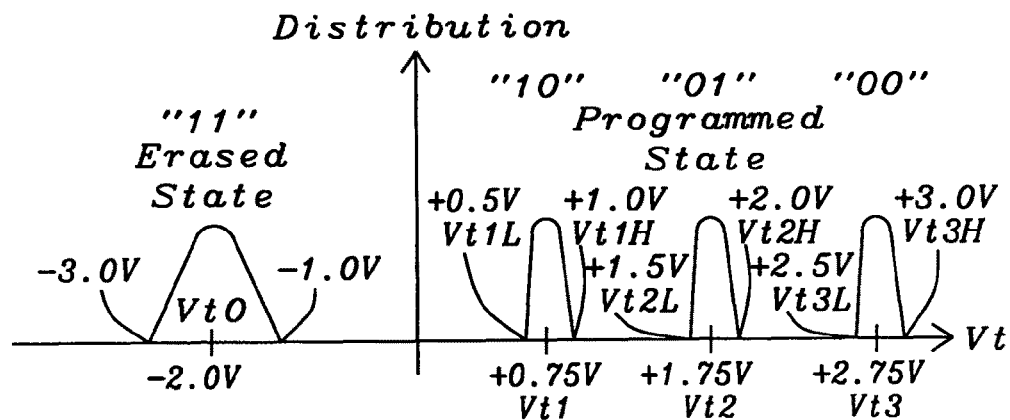
FIG. 3e is a graph of four threshold voltage distributions of a serial string of floating-gate transistor NMOS NAND flash cells having a positive erase level and three positive program levels.
Figure 3F:
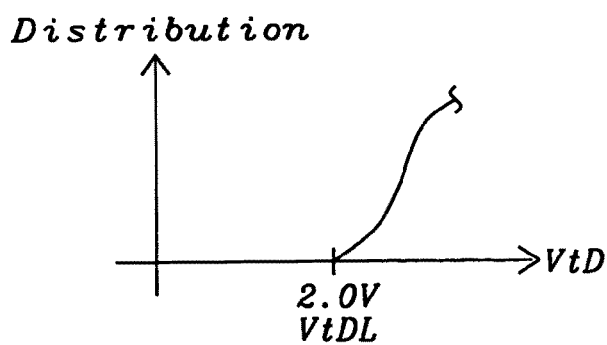
FIG. 3f is a graph of the single threshold voltage distribution of a floating gate select transistor of a serial string of floating-gate transistor NMOS NAND flash cells having a single threshold voltage level.

FIGS. 3d-3f are graphs of threshold voltage levels of various embodiments of a serial string of floating-gate transistor NMOS NAND flash cells with a NMOS floating-gate select transistor of the present invention. FIG. 3d illustrates the voltage thresholds levels for one implementation of programming and erasing of the NMOS NAND flash floating-gate transistors 230, 235, and 240. In this implementation there is one programmed positive threshold voltage level (Vt1) with a nominal voltage level of +2.0 V representing a logical "0" datum and one erased threshold voltage level (Vt0) also with a nominal voltage level of −2.0V representing a logical "1" datum. Both Vt0 and Vt1 established by a Fowler-Nordheim channel tunneling effect. The erased state threshold voltage level (Vt0) has a range of approximately 2.0V, varying from −3.0V to about −1.0V. The programmed state threshold voltage level (Vt1) has a range of approximately +1.0V to approximately +3.0V.

FIG. 3e illustrates the voltage thresholds levels for still another implementation of programming and erasing of the NMOS NAND flash floating-gate transistors 230, 235, and 240. This implementation is for a multi-level cell (MLC) with four threshold voltage levels (Vt0, Vt1, Vt2 and Vt3). In this implementation the first threshold voltage level (VT0) is a negative erased state with a nominal threshold voltage level of approximately −2.0V and a distribution varying from approximately −3.0V to approximately −1.0V for storing a logical "11" data. The second threshold voltage level (VT1) is the second data state stored in NMOS NAND flash floating-gate transistors 230, 235, and 240 and has a nominal voltage level of approximately +0.5 v. The second threshold voltage level (VT1) has a distribution that varies from approximately +0.75V to approximately +1.0V to store a logical "10" data. The third threshold voltage level (Vt2) is the third data state of the NMOS NAND flash floating-gate transistors 230, 235, and 240 with a nominal voltage level of approximately +1.75V. The third threshold voltage level (Vt2) has a distribution that varies from approximately +1.5V to approximately +2.0V to store a logical "01" data. The fourth threshold voltage level (Vt3) is the fourth data state of the NMOS NAND flash floating-gate transistors 230, 235, and 240 and has nominal voltage level of approximately +2.75V. The fourth threshold voltage level (Vt3) has a distribution that varies from approximately +2.5V to approximately +3.0V to store a logical "00" data.

Further, FIG. 3f illustrates the voltage thresholds levels for another implementation of programming and erasing of the NMOS floating-gate select transistor 225. In the present embodiment the NMOS floating-gate select transistor 225 has a "tuned" positive threshold voltage that is greater than approximately +2.0V.

Figure 4A:
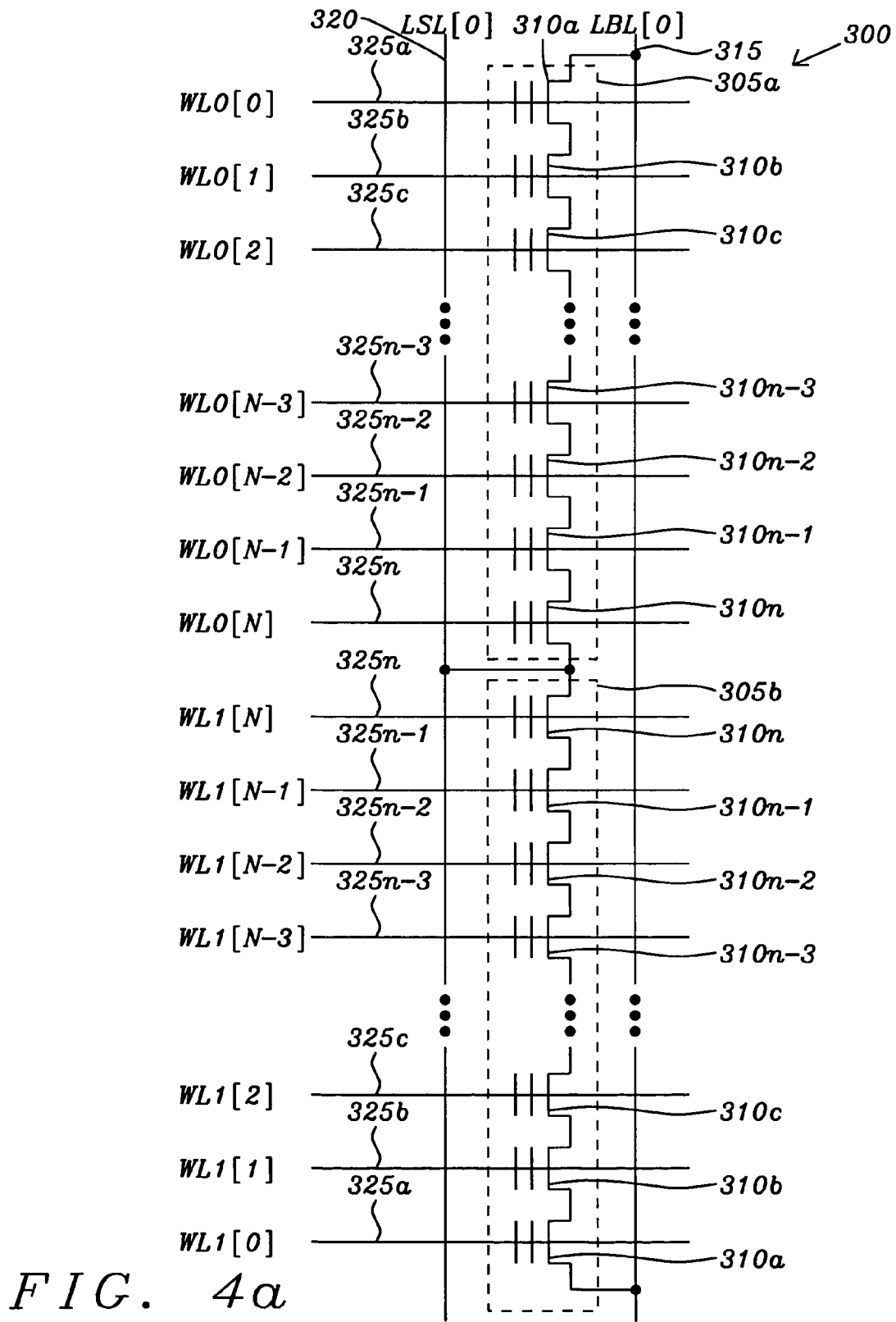
FIGS. 4a-4c are schematics of a serial string of floating-gate transistor NMOS NAND flash cells embodying the principles of the present invention.

FIGS. 4a-4f are schematics of a serial string of floating-gate transistor NMOS NAND flash cells 300 embodying the principles of the present invention. In some embodiments as shown in FIG. 4a, a column 300 of the NMOS NAND flash floating-gate transistors 310a, 310b, . . . , 310n are grouped into NAND strings 305a and 305b as described in FIGS. 3a-c. The drain of a first transistor 310a is connected to a local bit line 315 and source of a last transistor 310n of the NAND strings 305a and 305b is connected to a local source line 320. The word lines 325a, 325b, . . . , 325n are connected to the control gates of the NMOS NAND flash floating-gate transistors 310a, 310b, . . . , 310n.

The NAND strings of the prior art as presently marketed have 16/32/64 NMOS NAND flash floating-gate transistors connected in a series string. A first of the NMOS NAND flash floating-gate transistors is connected to a bit line through a first select transistor and a second of the NMOS NAND flash floating-gate transistors are connected to a source line through a second select transistor. The channel width of the first and second select transistors is approximately three times that of each NMOS NAND flash floating-gate transistor channel length, in a 70 nm semiconductor process. In future semiconductor processing when the NMOS NAND flash floating-gate transistor is further scaled down, the channel length of the two select transistors of the prior art will not be able to be scaled down due to a concern for a punch-through phenomena. This occurs in a program operation because the channel voltage of NMOS NAND flash floating-gate transistors can be coupled to from approximately +7.0V to approximately +10.0V. The channel length of the first and second select transistors of the prior art must be sufficiently large to sustain +7.0V to +10.0V without incurring punch-through.

In the arrays of the NAND series strings of the NMOS NAND flash floating-gate transistors of the prior art, the source lines are structured to be orthogonal to the bit lines and parallel to the word lines. This has forced these lines to become relatively large as the size of the arrays has become larger. As the arrays have become larger, the size of the sub-arrays has become larger. This has caused a larger noise component to be generated since the current from the bit lines of the sub-array is now larger.

The bit line 315 and the source line 320 are formed in parallel with each column of the NMOS NAND flash floating-gate transistors 310a, 310b, . . . , 310n. The number of source lines 320 in an array is now equal to the number of bit lines 315 to equalize the currents to minimize the noise and to provide a sufficient metal wiring surface to assist in the dissipation of thermal energy. Further, in FIG. 4a, the select transistors are eliminated and the area used by the select transistors is eliminated.

Figure 4B:
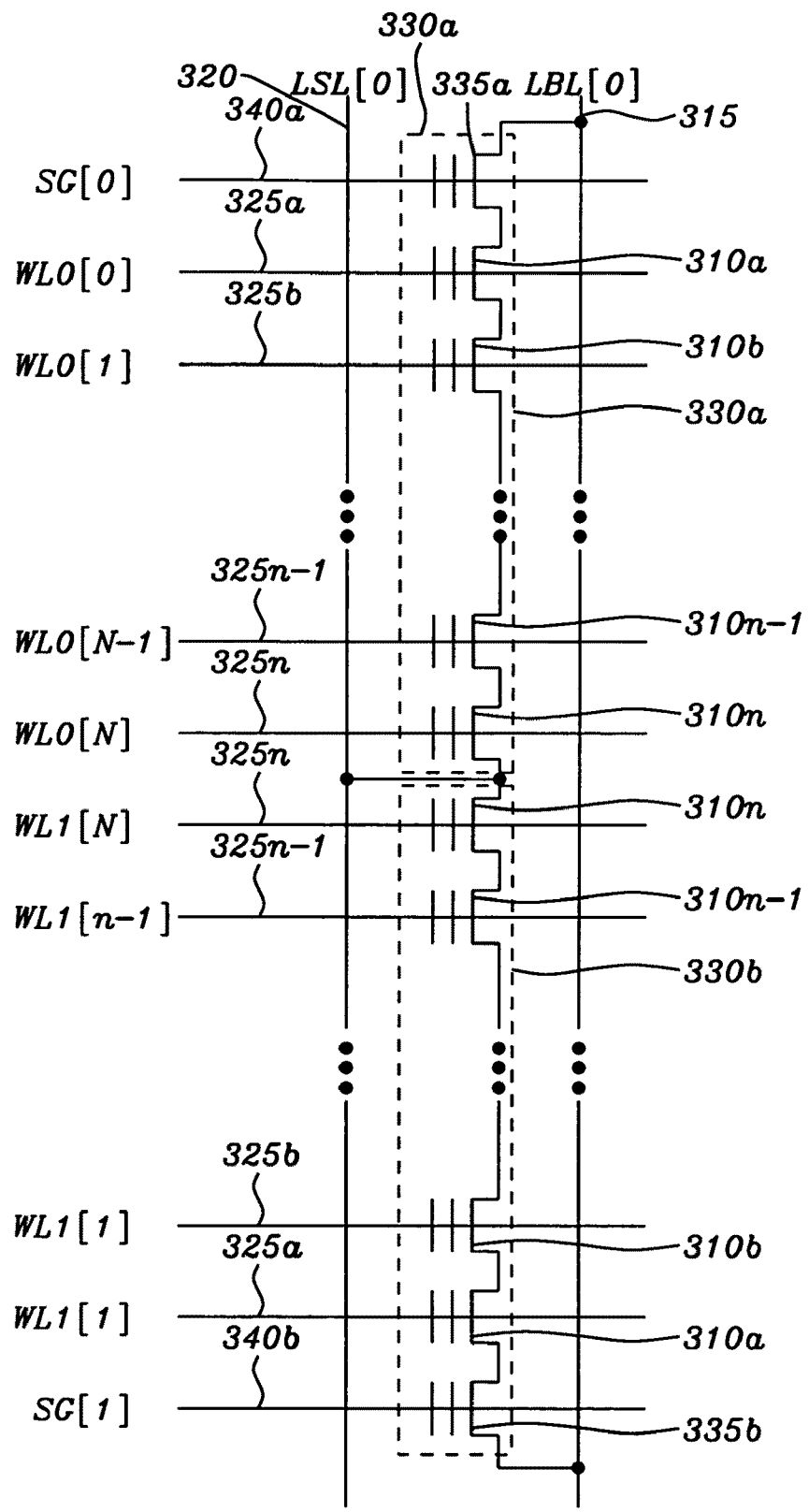

In FIG. 4b, the structure is identical to that of FIG. 4a except a first floating select transistor 335a and 335b is added to each of the NAND strings 350a and 350b. The drain of the first NMOS NAND flash floating-gate transistor 310a is connected to the source of the floating gate select transistor 335a and 335b. The drain of the floating gate select transistors 335a and 335b are connected to the local bit lines 315. In operation the bit line 315 and the source line 320 are connected to essentially the same voltage potential and there is no concern for punch through. This allows the size of the floating gate select transistor 335a and 335b to be equal to the size of the NMOS NAND flash floating-gate transistors 310a, 310b, . . . , 310n, thus saving area within an array of NMOS NAND flash floating-gate transistors 310a, 310b, . . . , 310n.

Figure 4C:
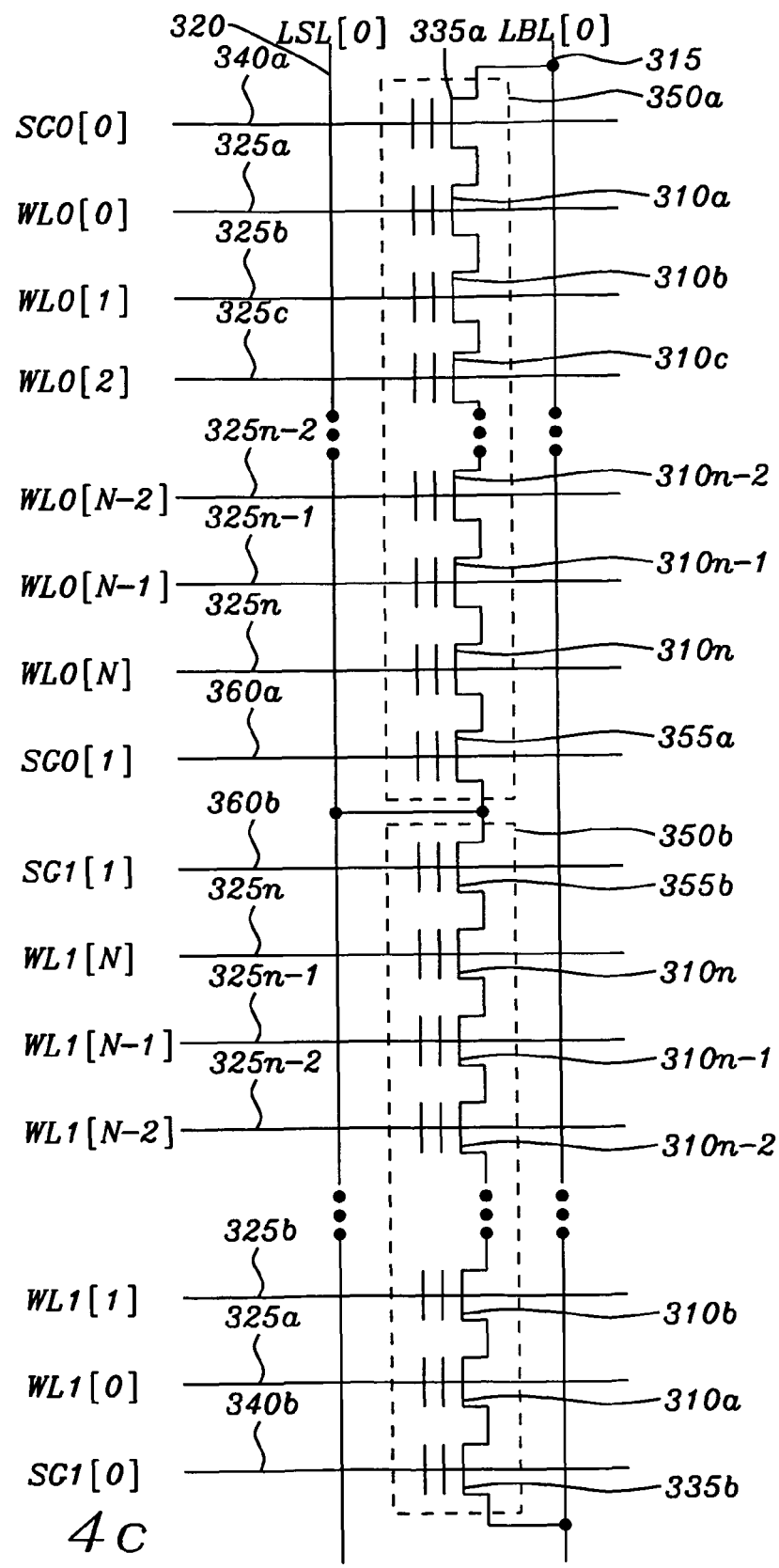

In FIG. 4c, the structure is identical to that of FIG. 4b except a second floating select transistor 355a and 355b is added to each of the NAND strings 330a and 330b. The source of the second NMOS NAND flash floating-gate transistor 310n is now connected to the drain of the floating gate select transistor 355a and 355b. The source floating gate select transistor 355a and 355b are connected to the local source lines 320. As in FIG. 4b, in operation, the bit line 315 and the source line 320 are connected to essentially the same voltage potential and there is no concern for punch through. This allows the size of the first floating gate select transistors 335a and 335b and the second floating gate select transistors 355a and 355b to be equal to the size of the NMOS NAND flash floating-gate transistors 310a, 310b, . . . , 310n, thus saving area within an array of NMOS NAND flash floating-gate transistors 310a, 310b, . . . , 310n, even though there are now two select transistors.

Figure 5:
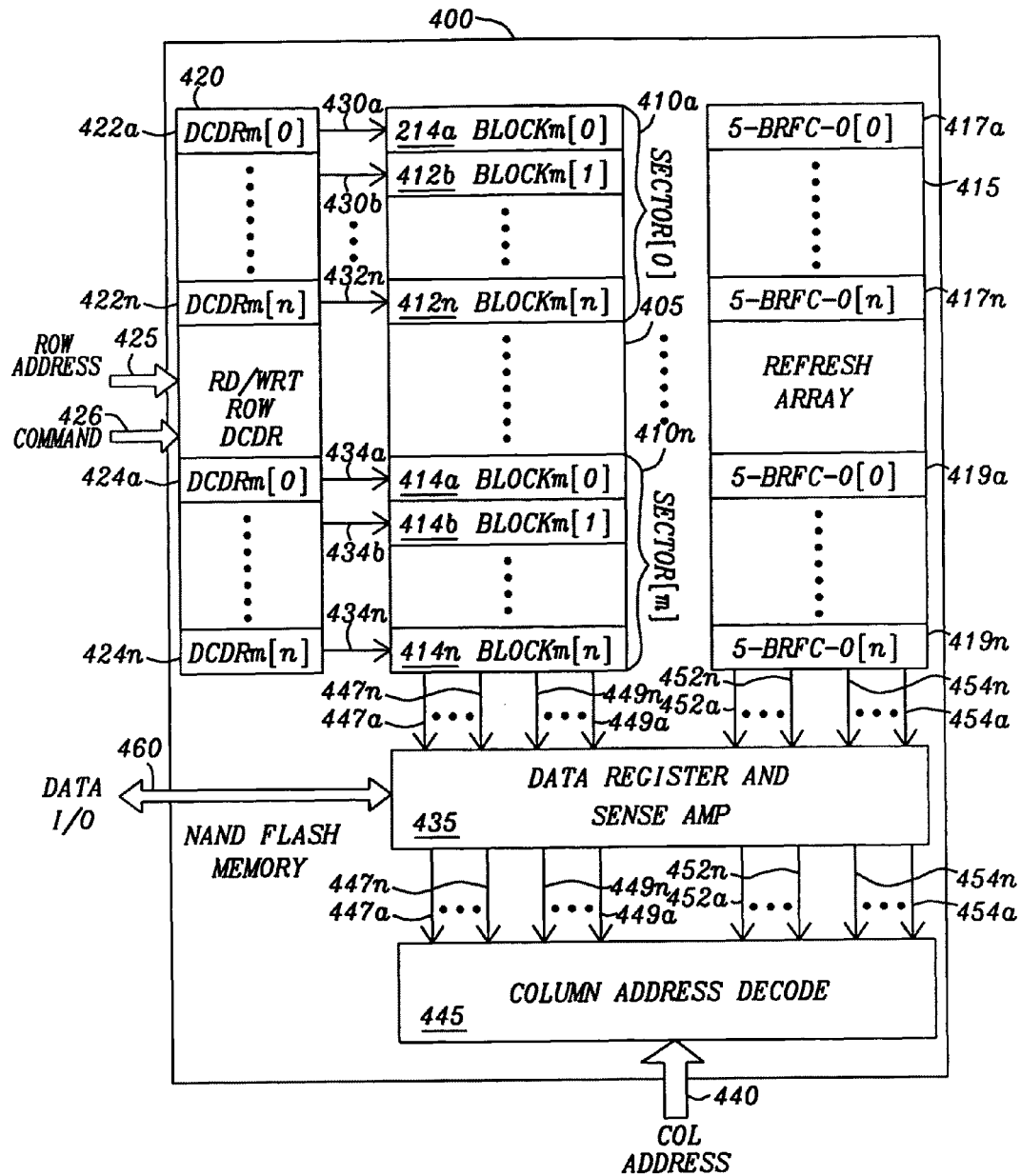
FIG. 5 is a block diagram of a nonvolatile memory device embodying the principles of the present invention.

FIG. 5 is a block diagram of a nonvolatile memory device 400 embodying the principles of the present invention incorporating the various embodiments of NAND strings of flash floating-gate transistors of the present invention. The NAND flash nonvolatile memory device 400 includes an array 405 of NAND strings of NMOS flash floating-gate transistors arranged in a matrix of rows and columns. The array 405 is partitioned into a uniform number of sectors 410a, . . . , 410n and each sector is divided into a uniform number of blocks 412a, 412b, . . . , 412n, and 414a, 414b, . . . , 414n, For instance, a 1 Gb memory array device may be divided into 1024 sectors. Each sector then becomes 128 KB and may be divided into a number blocks such as 8 blocks of 16 KB each. Further, the block is divided into pages. In this example, the page may have a size of 4 Kb such that one page is equivalent to one word line or row of the block or sub-array 412a, 412b, . . . , 412n, and 414a, 414b, . . . , 414n. Thus, each block 412a, 412b, . . . , 412n, and 414a, 414b, . . . , 414n has 32 pages or word lines.

The column address decoder 445 receives a column address 440, decodes the column address 440, and from the decoded column address 440 selects which of the sectors 410a, . . . , 410n are being accessed. The column address decoder 445 activates the appropriate bit lines 447a, . . . , 447n and the appropriate source lines 449a, ..., 449n for operating a selected sector 410a, ..., 410n. The appropriate bit lines 447a, ..., 447n and the appropriate source lines 449a, ..., 449n are further connected to the data register and sense amplifier 435. The data register and sense amplifier 435 receives the data signals through the bit lines 447a, ..., 447n and the source lines 449a, ..., 449n from the selected sector 410a, ..., 410n and senses and holds the data from the data signal for a read operation. The data is transferred from the data register and sense amplifier 435 to the data input/output terminals 460 to external circuitry. In a program operation, the data is transferred from the data input/output terminals 460 to the data register and sense amplifier 435 and then from the data register and sense amplifier 435 through the bit lines 447a, ..., 447n and the source lines 449a, ..., 449n to the selected sector 410a, ..., 410n.

Each block 412a, 412b, ..., 412n, and 414a, 414b, ..., 414n of the array 405 of NAND strings of NMOS flash floating-gate transistors is connected to a read/write row decoder 420 through the word lines 432a, 432b, 432n, 434a, 434b, ..., 434n. Each block 412a, 412b, ..., 412n, and 414a, 414b, ..., 414n is connected with its own row decoder 422a, 422b, 422n, and 424a, 424b, 424n for providing the appropriate voltage levels to a selected page or word line for reading and programming selected NMOS flash floating-gate transistors. The row address 425 and is the command signal 426 are transferred to each of the row decoders 422a, 422b, ..., 422n, and 424a, 424b, ..., 424n select the page or word line and to provide the appropriate voltage levels for reading and programming the selected NMOS flash floating gate transistors.

Each block 412a, 412b, ..., 412n, and 414a, 414b, ..., 414n of the array 405 of NAND strings of NMOS flash floating-gate transistors is associated with a block erase count register 417a, ..., 417n, and 419a, ..., 419n of the refresh array 415. Each of the block erase count registers 417a, ..., 417n, and 419a, ..., 419n retains a count of the number of erase operations that the associated block 412a, 412b, ..., 412n, and 414a, 414b, ..., 414n within a sector 410a, ..., 410n has had performed. Each of the block erase count registers 417a, ..., 417n, and 419a, ..., 419n is connected to the refresh bit lines 452a, 452b, ..., 452n and the refresh source lines 454a, 454b, ..., 454n to provide the necessary biasing voltages for reading, programming and erasing the block erase count registers 417a, ..., 417n, and 419a, ..., 419n. The structure and operation of the block erase count registers 417a, ..., 417n, and 419a, ..., 419n is discussed hereinafter.

Figure 6:
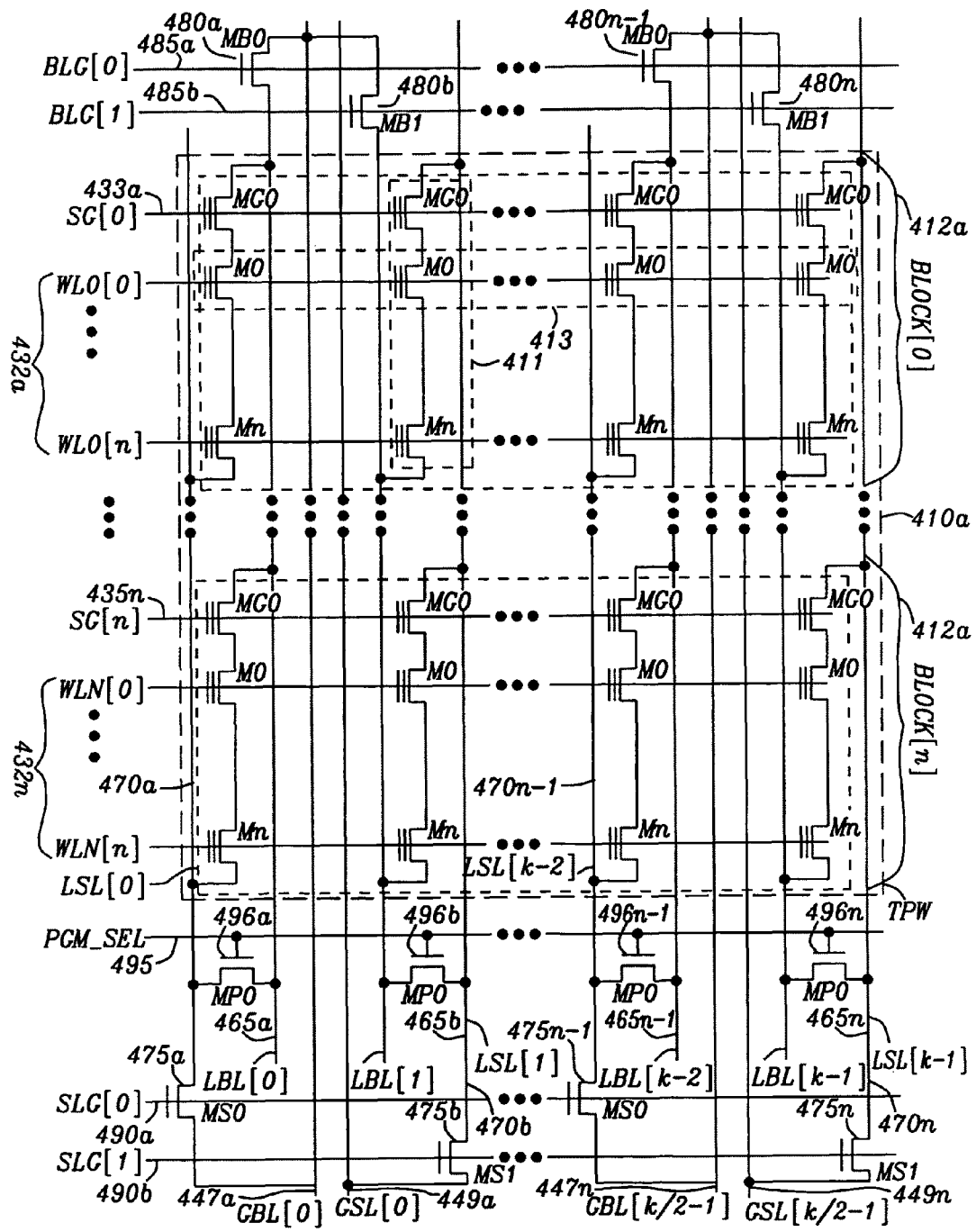
FIG. 6 is a schematic diagram illustrating an array of a serial string of floating-gate transistor NMOS NAND flash cells of FIG. 5 embodying the principles of the present invention.

Refer now to FIG. 6 for a discussion of the structure of a sector 410a of the array 405. The sector 410a is exemplary of the all the sectors 410a, ..., 410n of array 405. The sector 410a is placed in a common P-type well (TPW) and contains all the NMOS floating gate transistors MG0, M0, ..., Mn of the sector 410a. The sector 410a is divided into multiple blocks 412a, ..., 412n and each block is further divided into pages 413. The page 413 being a grouping of the NMOS floating gate transistors M0, ..., Mn having their control gates connected commonly to a word line (WL0) of the word lines 432a, ..., 432n. Each grouping on any one column of the NMOS floating gate transistors MG0, M0, ..., Mn are serially connected to form a NAND series floating gate to memory cell 411 of the NMOS floating gate transistors MG0, M0, ..., Mn. The drain of the first or top floating gate transistor M0 is connected to the source of the select floating gate transistor MG0. The drain of the select floating gate transistor MG0 is connected to the associated local bit line 465a, 465b, ..., 465n. The gate of each of the select floating gate transistors MG0 is connected to the gate select lines 433a, ..., 433n that provides the activation voltage to connect the NMOS floating gate transistors MG0, M0, ..., Mn to its associated local bit line 465a, 465b, ..., 465n. The source of a second or bottom floating gate transistor Mn is connected an associated local source line 470a, 470b, ..., 470n.

The local bit lines 465a, 465b, ..., 465n are connected to the sources of the bit line gating transistors 480a, 480b, ..., 480n and the drain of the bit line gating transistors 480a, 480b, ..., 480n are connected to the global bit lines 447a, ..., 447n. The gates of the bit line gating transistors 480a, 480b, ..., 480n are connected to their associated bit line select lines BLG[0] 485a and BLG[1] 485b. The local source lines 470a, 470b, ..., 470n are connected to the drains of the source line gating transistors 475a, 475b, ..., 475n and the source of the source line gating transistors 475a, 475b, ..., 475n are connected to the global source lines 449a, ..., 449n. The gates of the source line gating transistors 475a, 475b, ..., 475n are connected to their associated source line select lines SLG[0] 490a and SLG[1] 490b. This permits selected columns of the NMOS floating gate transistors MG0, M0, ..., Mn to be read or programmed, while an associated column of the NMOS floating gate transistors MG0, M0, ..., Mn are not selected are essentially inactive. In this implementation of the sector 410a, there are two local bit line 465a, 465b, ..., 465n connected to each of the global bit lines 447a, ..., 447n. However, it obvious to one skilled in the art that any number of local bit line 465a, 465b, ..., 465n may be connected to one of the global bit lines 447a, ..., 447n and still be in keeping with the intent of this invention. Similarly, in this implementation of the sector 410a, there are two local source lines 470a, 470b, ..., 470n connected to each of the global source lines 449a, ..., 449n. However, it obvious to one skilled in the art that any number of local source lines 470a, 470b, ..., 470n may be connected to one of the global source lines 449a, ..., 449n and still be in keeping with the intent of this invention.

Each of the local bit lines 465a, 465b, ..., 465n are connected to their associated local source lines 470a, 470b, ..., 470n through the pass transistors 496a, 496b, ..., 496n. The gates of the pass transistors 496a, 496b, 496n are connected to the program select signal 495 to bring the local bit line 465a, 465b, ..., 465n and the local source lines 470a, 470b, ..., 470n to an equal potential voltage level during a program operation.

Figure 7:
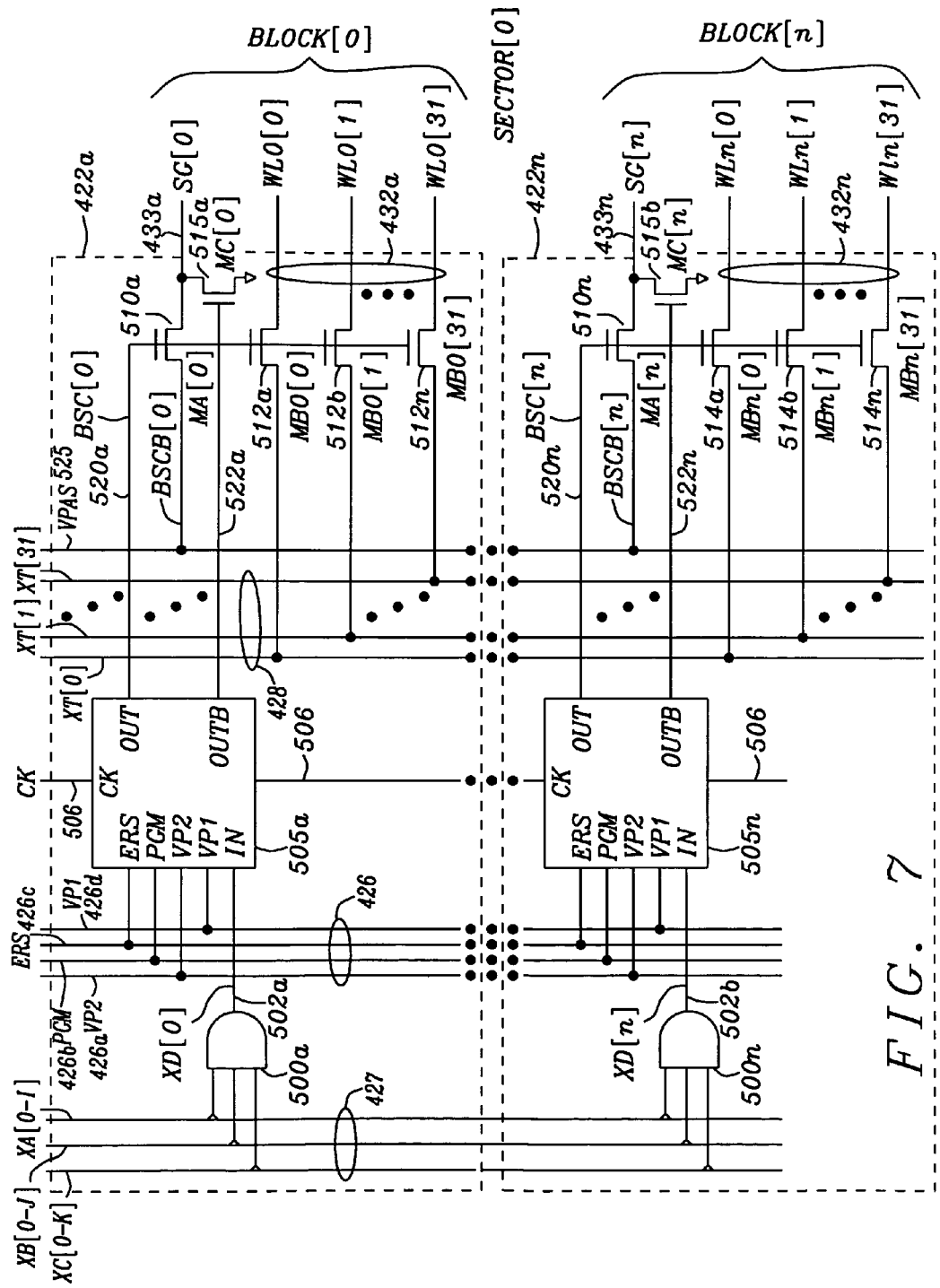
FIG. 7 is a schematic diagram of the read/write row decoder of the nonvolatile memory device of FIG. 5 embodying the principles of the present invention.

FIG. 7 is a schematic diagram of the read/write row decoder of the nonvolatile memory device of FIG. 5 embodying the principles of the present invention. Refer now to FIG. 7 for a discussion of the structure and operation of the row decoders 422a, 422b, ..., 422n, and 424a, 424b, ..., 424n of the read/write row decoder 420. FIG. 7 shows only the row decoders 422a, 422b, ..., 422n of the read/write row decoder 420. The row decoders 424a, 424b, ..., 424n are equivalent in function and structure. The block address portion 427 of the row address 425 of FIG. 5 is the input to a select logic gate 500a, ..., 500n (an AND gate in this embodiment) for selecting the appropriate row decoder 422a, 422b, ..., 422n, and 424a, 424b, ..., 424n to condition a selected block 412a, 412b, ..., 412n, and 414a, 414b, ..., 414n of the selected sector 410a, ..., 410n for reading or programming.

The block selection output 502a, 502n of the select logic gate 500a, ..., 500n select logic gate 500a, ..., 500n is an input signal to a charge pump circuit 505a, ..., 505n. The charge pump circuits 505a, ..., 505n generate an high voltage level necessary for selecting a block for reading, programming, or erasing. The command signals 426 are the inputs to the charge pump circuits 505a, ..., 505n and provide the commands (program 426b and erase 426c) and the pass voltage levels 426a and 426d. The pass voltage levels 426a and 426d are transferred to the output 520a, . . . , 520n of the charge pump circuits 505a, . . . , 505n. The output 520a, . . . , 520n of the charge pump circuits 505a, . . . , 505n are connected to the block select pass transistors 510a, . . . , 510n and the word line select transistors 512a, . . . , 512n and 514a, . . . , 514n. The output 520a, . . . , 520n of the charge pump circuits 505a, . . . , 505n must have sufficient amplitude to fully pass the voltage levels of the page address portion 428 of the address 425 to the word lines 432a, . . . , 432n. The block select pass transistors 510a, . . . , 510n pass block select signal (VPAS) 525 to the gate select lines 433a, . . . , 433n to activate the select floating gate transistors MG0 for each of the blocks 412a, 412b, . . . , 412n, and 414a, 414b, . . . , 414n. The gate of the block deselect transistors 515a, . . . , 515n is connected to out of phase output 522a, . . . , 522n of the charge pump circuits 505a, . . . , 505n. In a read operation, the out of phase output 522a, . . . , 522n becomes active (a logical "1") to turn on the block deselect transistors 515a, . . . , 515n which in turn will turn off the select floating gate transistors MG0 for each of the unselected blocks 412a, 412b, . . . , 412n, and 414a, 414b, . . . , 414n.

Figure 8:
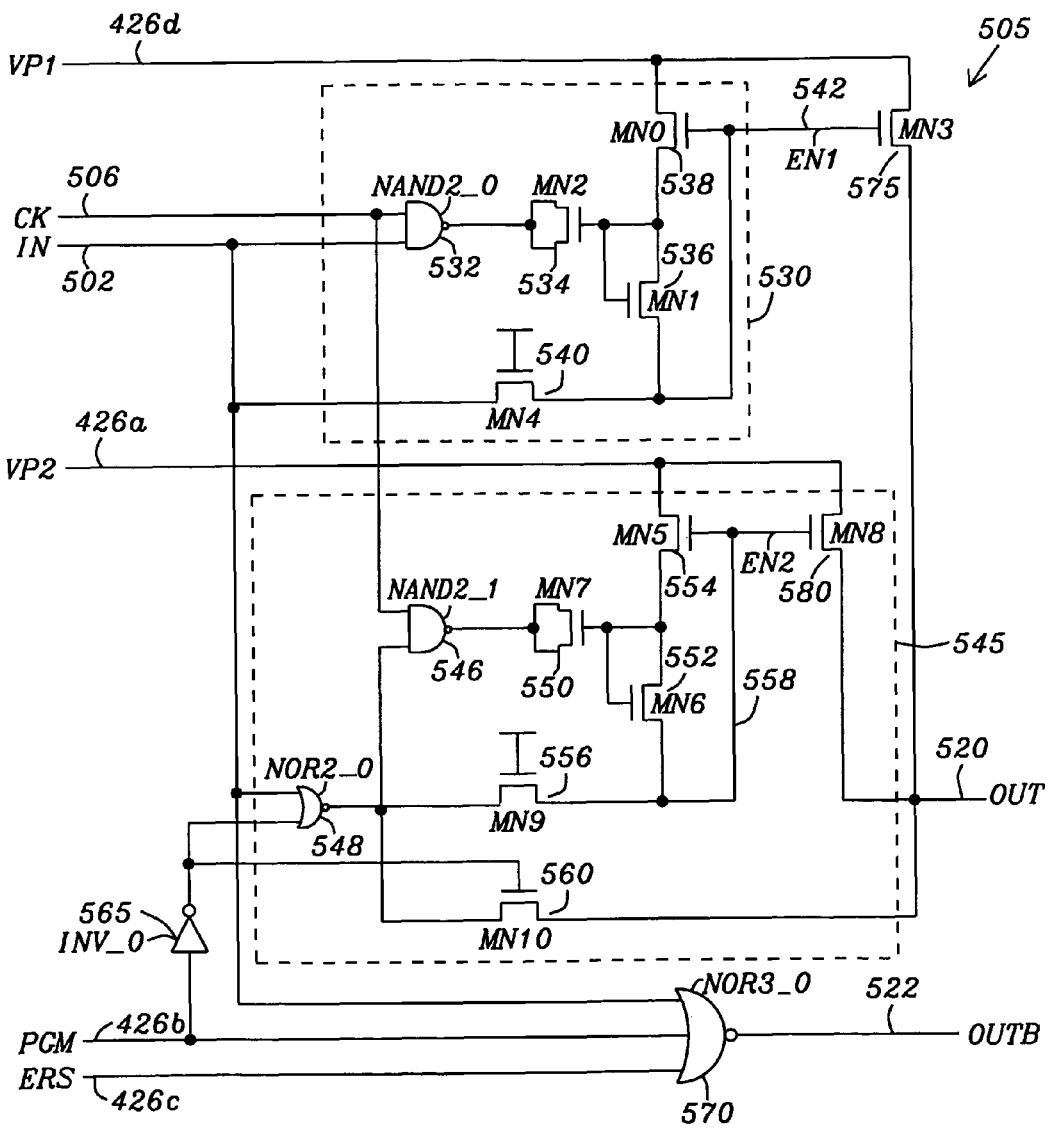
FIG. 8 is a schematic diagram of a charge pump circuit of FIG. 7 embodying the principles of the present invention.

FIG. 8 is a schematic diagram of a charge pump circuit of FIG. 7. Charge pump circuit 505 includes two charge-pump sub-circuits 530 and 545. The first charge-pump sub-circuit 530 has a gating logic circuit 532 (a NAND gate in this embodiment) that is active when the select input signal 502 is active and changes state as the clock 506 changes state. The first coupling capacitor 534, the first high voltage NMOS diode 536, the high voltage gating transistors 538 and 575 transfer the first high voltage power supply level 426d to the output node 520 during a read operation. During the read operation, the first enable signal 542 is pumped by the first charge-pump sub-circuit to a voltage level equal to the first high voltage power supply level 426d plus the voltage threshold level of the output transistor 575 (VP1+Vt). The NMOS transistor 540 has its drain connected to the select input terminal 502, it source connected to the first enable signal 542, and it gate connected to the power supply voltage source VDD. The NMOS transistor 542 is a high voltage devices used to isolate the pumped voltage levels at the first enable signal 542 from the low voltage devices at the select input terminal 502. When the select input terminal 502 is set to the voltage level of the power supply voltage source VDD, the first charge-pump sub-circuit is enabled to pump the first enable signal 542 to a voltage level equal to the first high voltage power supply level 426d plus the voltage threshold level of the output transistor 575 (VP1+Vt).

The second charge-pump sub-circuit 545 has second logic gate 546 (a NAND gate in this embodiment) that is activated based on the output of a third logic gate 548 (a NOR gate in this embodiment). The inputs of the third logic gate 546 are the input select signal 502 and the inversion of the program command signal 426b through the inverter gate 565. The second high voltage coupling capacitor, the second high voltage NMOS diode 552, and the gating transistors 554 and 580 generate a sufficiently high voltage such that the output gating transistor 580 transfers a second high voltage power supply level 426a to the output node 520.

The high voltage transistor 560 is connected to couple the full voltage level of the power supply voltage source VDD during a read operation. The NMOS transistor 556 has its drain connected to the output of the logic gate 548, it source connected to the second enable signal 558, and it gate connected to the power supply voltage source VDD. The NMOS transistor 556 is a high voltage devices used to isolate the pumped voltage levels at the second enable signal 558 from the low voltage devices at the output of the logic gate 548. When the output of the logic gate 548 is set to the voltage level of the power supply voltage source VDD, the second charge-pump sub-circuit is enabled to pump the second enable signal 558 to a voltage level equal to the high voltage level HV** of approximately +6.0V plus a voltage threshold of the output transistor 575 (VP1+Vt).

During an erase operation setup, the erase signal 426c is activated ("1") such that the out of phase output 522 is deactivate the block deselect transistors 515a, . . . , 515n to float the select gate signal lines 433a, . . . , 433n. As a result, the out of phase output 522 is thus coupled with +20.0V which is applied to P-well 210 of FIG. 3c for a Fowler-Nordheim bulk erase for a selected block 412a, 412b, . . . , 412n, and 414a, 414b, . . . , 414n to avoid an oxide breakdown.

Refer now to FIG. 9 for a discussion of the operational voltages of the charge pump circuits 505 of FIG. 8. The high voltage HV1** for the first pass voltage level 426d is a high voltage level of approximately +6.0V plus a threshold voltage value of an NMOS transistor (HV*+Vt). The first pass voltage level 426d is sufficient large to allow the pass block select signal (VPAS) 525 to fully pass through the block select pass transistors 510a, 510n to activate the select floating gate transistors MG0 of the selected block 412a, 412b, . . . , 412n, and 414a, 414b, . . . , 414n. The modes of operation for charge pump circuit 505 provide the necessary voltage levels for the operation of the row decoders 422a, 422b, . . . , 422n, and 424a, 424b, . . . , 424n of FIG. 6. The modes of operation for the row decoders 422a, 422b, . . . , 422n, and 424a, 424b, . . . , 424n are read, erase, erase verify, program, program verify, and correction verify. The voltage levels provided by the row decoders 422a, 422b, . . . , 422n, and 424a, 424b, . . . , 424n, are not only for the selected block 412a, 412b, . . . , 412n, and 414a, 414b, . . . , 414n, but also for the unselected block 412a, 412b, . . . , 412n, and 414a, 414b, . . . , 414n within the sector.

During a READ operation, the select input signal IN 502 of the address is set to activate the first charge-pump sub-circuit 530 and deactivate the second charge-pump sub-circuit 545. The first enable signal 542 is charged to a voltage level that is greater than the first pass voltage level 426d plus a threshold voltage level. This forces the voltage level at common output node OUT 520 to the voltage level of the first pass voltage level (HV1) 426d or first high voltage level of approximately 6.0V plus an NMOS transistor voltage level (approximately 7.0V). The first high voltage level (HV1) insures the full transfer the a first intermediate voltage (HV*) of approximately +6.0V to the unselected word lines 432a, . . . , 432n and 0 v to the selected word lines 432a, . . . , 432n of the selected block 412a, 412b, . . . , 412n of NAND strings of NMOS flash floating-gate transistors.

During an ERASE operation, the first and second pass voltage levels VP1 426a and VP2 426d are set to the voltage level of the power supply voltage source VDD and the select input signal IN 502 is also set to the voltage level of the power supply voltage source VDD so that common output node OUT 520 is set to the voltage level of the power supply voltage source VDD to allow a voltage level of approximately 0.0V to be coupled to the selected word lines 432a, . . . , 432n and selected gate select line SG 433a, 433n for the selected block 412a, 412b, . . . , 412n . . . . During the erase operation, the P-type well (TPW) is coupled to a voltage level of approximately +20.0V to erase the NAND series floating gate memory cells 411 within the selected block 412a, 412b, . . . , 412n.

After an erase, the NAND series floating gate memory cells 411 within the selected block 412a, 412b, . . . , 412n must be verified that the erasure has occurred. The NAND series floating gate memory cells 411 within the selected block 412a, 412b, ..., 412n are read and compared to the upper boundary of the erased threshold voltage VT0H. If the NAND series floating gate memory cells 411 within the selected block 412a, 412b, ..., 412n have an erased threshold voltage Vt0 greater than the upper boundary of the erased threshold voltage VT0H, the NAND series floating gate memory cells 411 have failed and must be erased again.

In a PROGRAM operation, the voltage of select input signal 502 of the selected block 412a, 412b, ..., 412n is set to be to the voltage level of the power supply voltage source VDD and clocking signal 506 activates first charge-pump sub-circuit 530 and deactivates the second charge-pump sub-circuit 545. As a result, the common output node 520 is set to be equal to first pass voltage level VP1 426a that has a voltage level of approximately +20.0V plus a NMOS transistor threshold voltage level (+20.0V+Vt). This voltage level is sufficiently large to fully transfer the program voltage of from approximately +15.0V to approximately +20.0V to the selected word line 432a, ..., 432n and a voltage level of from approximately +8.0V to approximately +10.0V to the unselected word lines 432a, ..., 432n of the selected block 412a, 412b, ..., 412n. In contrast, the voltage of all select input signals 502 of the unselected blocks 412a, 412b, ..., 412n are set to be at a voltage level of approximately 0.0V or the substrate voltage level (VSS).

The second charge-pump sub-circuit 545 is activated and the first charge-pump sub-circuits 530 is deactivated. As a result, the voltage level of the common output node OUT 520 is set to be equal to the voltage level of the second pass voltage level VP2 426a. The second pass voltage level VP2 426a has a voltage level of approximately +5.0V plus an NMOS threshold voltage level (+5.0V+Vt). This voltage level designed to be sufficiently large (more than 6V) to fully transfer a word line program inhibit voltage of approximately +5.0V to the unselected word lines 432a, ..., 432n and unselected gate select lines 433a, ..., 433n of the unselected blocks 412a, 412b, ..., 412n, of the selected sector 410a.

The program signal 426b is set to the voltage level of the power supply voltage source VDD to set the out of phase output 522 to shut off block deselect transistors 515a, ..., 515n to allow the pass block select signal (VPAS) 525 to fully is pass to the selected gate select line 433a, ..., 433n.

During program verify operation, the select input signal IN 502 of the address is set to activate the first charge-pump sub-circuit 530 and deactivate the second charge-pump sub-circuit 545. The first enable signal 542 is charged to a voltage level that is greater than the first pass voltage level 426d plus a threshold voltage level. This forces the voltage level at common output node OUT 520 to the voltage level of the first pass voltage level 426d or first high voltage level of approximately 6.0V plus an NMOS transistor voltage level (approximately 7.0V). The first high voltage level insures the full transfer . . . .

During a correction verify operation, several steps have to be in order. The first step, for all programmed states of Vt0 and Vt1 of SLC storage or Vt0, Vt1, Vt2 and Vt3 of MLC storage, the upper boundary threshold voltage level (VtnH) would be checked after a bit-by-bit program operation to pass each lower boundary voltage threshold level (VtnL) check. When any upper boundary threshold voltage level value is found to be higher than the desired upper boundary threshold voltage level, a second step is executed. The second step includes a soft erase to ensure no single fast cell's voltage threshold is above the upper boundary threshold voltage level. The third step is to perform a slow bit-by-bit program on those regular speed cells to meet the upper boundary threshold voltage level value.

Figure 10:
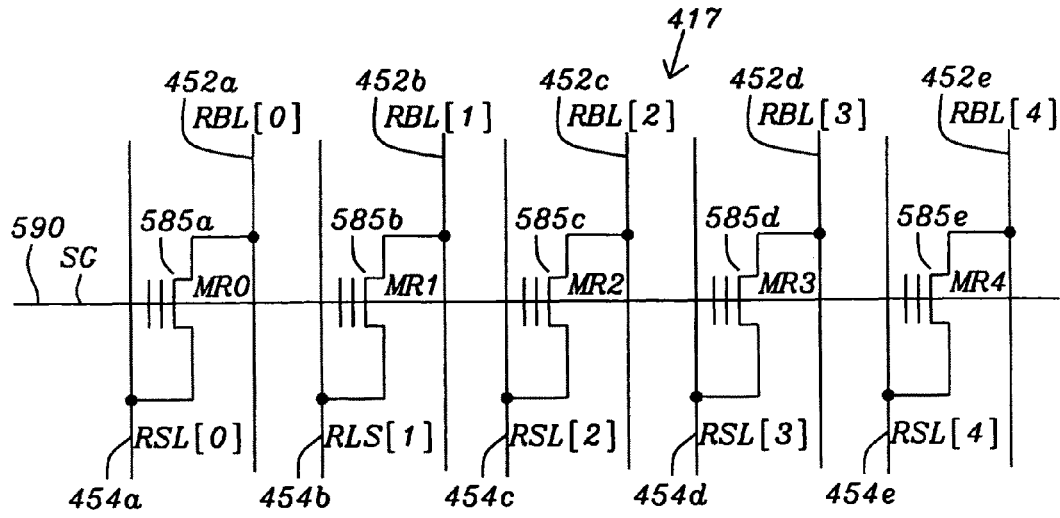
FIG. 10 is schematic diagram of a block erase count register of FIG. 5 embodying the principles of this invention.

Referring back to FIG. 5, the refresh array 415 provides the erase count for each block within an array. Each of the block erase count registers 417a, ..., 417n, and 419a, ..., 419n are associated with one block 412a, 412b, ..., 412n, and 414a, 414b, ..., 414n and are connected to the associated block 412a, 412b, ..., 412n, and 414a, 414b, ..., 414n through one of the word lines of the associated block 412a, 412b, ..., 412n, and 414a, 414b, ..., 414n. Referring now to FIG. 10 for a description of a block erase count register 419. The block erase count register 417a, ..., 417n, and 419a, ..., 419n of FIG. 5 are designated as block erase count register 417 for the discussion of FIG. 10. The block erase count register 417 has a number of NMOS flash floating gate transistors 585a, 585b, 585c, 585d, and 585e arranged as the bit structure of a register to hold a binary number of the count of the number of time the associated block 412a, 412b, ..., 412n, and 414a, 414b, ..., 414n of FIG. 5. The number of the NMOS flash floating gate transistors 585a, 585b, 585c, 585d, and 585e is shown as five in this embodiment.

The gates of the NMOS flash floating gate transistors 585a, 585b, 585c, 585d, and 585e are connected to the select gate that is connected to a word line of the associated block 412a, 412b, ..., 412n, and 414a, 414b, ..., 414n. The word line is connected from the associated block 412a, 412b, ..., 412n, and 414a, 414b, ..., 414n to the read/write row decoder 420. The drains of the NMOS flash floating gate transistors 585a, 585b, 585c, 585d, and 585e are connected to the refresh bit lines 452a, 452b, ..., 452e. The sources of the NMOS flash floating gate transistors 585a, 585b, 585c, 585d, and 585e are connected to the refresh source lines 454a, 454b, ..., 454e. The NMOS flash floating gate transistors 585a, 585b, 585c, 585d, and 585e are programmed with the number of the erasures for the associated block.

Figure 11:
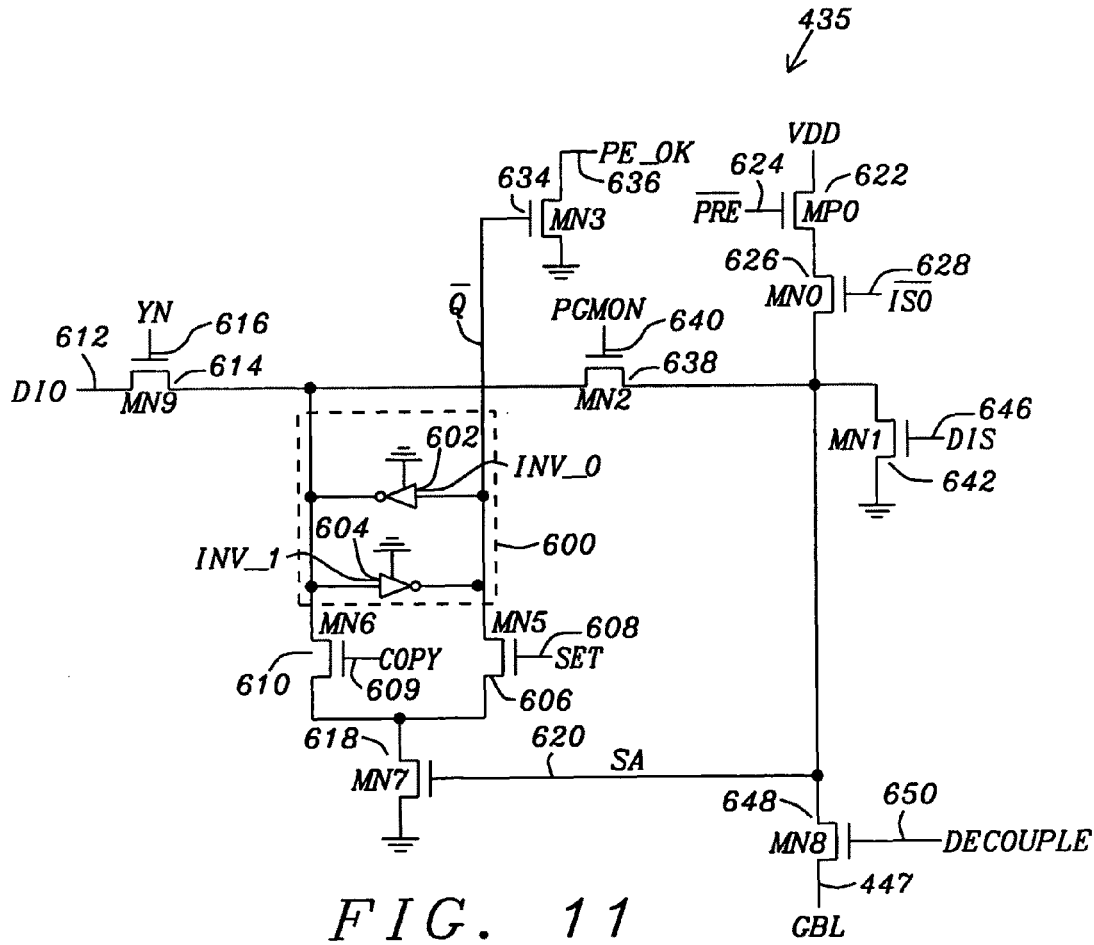
FIG. 11 is a schematic diagram for a data register and sense amplifier a nonvolatile memory device embodying the principles of this invention.

Refer now to FIG. 11 for a discussion of a data register and sense amplifier 447 within the nonvolatile memory device of FIG. 5. The data register and sense amplifier 447 has a high voltage latch 600 that includes two cross connected inverters 602 and 604. A latch set control signal 608 is connected to the gate of the NMOS transistor 606 and a latch copy signal 609 is connected to the gate of the NMOS transistor 610. The drain of the NMOS transistor 606 is connected to the common connection of the input of the inverter 602 and the output of the inverter 604. The drain of the NMOS transistor 610 is connected to the common connection of the input of the inverter 604 and the output of the inverter 602. The sources of the NMOS transistors 606 and 610 are commonly connected to the drain of the NMOS transistor 618. The source of the NMOS transistor 618 is connected to the ground reference voltage source and the gate of the NMOS transistor 618 is connected to the sense amplifier node SA 620. The NMOS transistor 618 provides the detection of the threshold voltage of a selected NMOS NAND flash floating-gate transistor of the selected row of the array of NMOS NAND flash floating-gate transistors.

The drain of the PMOS transistor 622 is connected to the drain of the isolation NMOS transistor 626 and the source of the isolation NMOS transistor 626 is connected to the sense amplifier node SA 620. The gate of the PMOS transistor 622 is connected to the pre-charge enable signal 624, which when it is active allows the PMOS transistor 622 to pre-charge the sense amplifier node SA 620 to a pre-charge voltage of approximately the voltage level of the power supply voltage source VDD. The gate of the isolation NMOS transistor 626 is connected to the isolation control signal 628 which when active enables the pre-charging of the sense amplifier node SA 620.

The gate of the NMOS transistor 634 is connected to the common connection of the input of the inverter 602 and the output of the inverter 604 to provide a verification that the selected NMOS NAND flash floating-gate transistors are erased below the desired upper boundary of the threshold voltage Vt0H successfully. In an erase of the NMOS NAND flash floating-gate transistors the gate of the NMOS transistor 634 is grounded thus floating the erase verify node PE_OK 632. Similarly, the NMOS transistor 634 is used to provide a verification that the selected NMOS NAND flash floating-gate transistors are programmed to a voltage level greater than the desired lower boundary of the threshold voltage Vt1L successfully. In a programming of the NMOS NAND flash floating-gate transistors the gate of the NMOS transistor 634 is grounded thus floating the program verify node PE_OK 636.

The drain of the NMOS transistor 638 is connected to the common connection of the input of the inverter 604 and the output of the inverter 602 and the source of the NMOS transistor 638 are connected to the sense amplifier node SA 620. The program enable signal 640 is applied to the gate of the NMOS transistor 638 to control transfer of data between the high voltage latch 600 and the global bit line 447.

The NMOS transistor 614 has its drain connected to the data input/output node 612 and its source is connected to the common connection of the input of the inverter 604 and the output of the inverter 602. The gate of the NMOS transistor 614 is connected to the data transfer control signal 616. The NMOS transistor 614 controls transfer the accessed data into the latch 600 or to read out the sensed data through the high voltage latch 600.

The NMOS transistor 642 has its drain connected to the sense amplifier node SA 620 and its source connected to the ground reference voltage source. The gate of the NMOS transistor 642 is connected to the discharge control signal 646, which, when activate, turns on the NMOS transistor 642 to discharge the sense amplifier node SA 620.

The isolation NMOS transistor 626 is a high voltage device that provides a buffering between high voltage nodes and lower voltage nodes. In a program operation, the high voltage program bit line inhibit voltage of approximately +8.0V flows from the output of inverter 602 through the NMOS transistor 638 and the NMOS transistor 648 to global bit line 647 of selected NMOS NAND flash floating-gate transistors. Therefore, the NMOS transistor 626 and NMOS transistor 642 must to be shut off to protect the low voltage PMOS transistor 622 and leakage to substrate ground reference voltage source. During an ERASE VERIFY operation, the upper boundary threshold voltage level Vt0H of an erased NMOS NAND flash floating-gate transistor is transferred from the global bit line 447 to the gate of NMOS transistor 618 for verification. When all the NMOS NAND flash floating-gate transistors have a threshold voltage that is lower than the upper boundary threshold voltage level Vt0H and the sense amplifier node SA 620 than the threshold voltage of the NMOS transistor 618 by about 0.3V, the high voltage latch 600 is enabled and reset. The designed trip voltage of high voltage latch 600 is approximately +0.7V. Therefore, upper boundary threshold voltage level Vt0H of −1.0V is detected and verified. If all the word lines of NMOS NAND flash floating-gate transistor block are eased simultaneously, then all the NMOS NAND flash floating-gate transistors have a threshold voltage that is lower than the upper boundary threshold voltage level Vt0H in order to have voltage at the sense amplifier node SA 620 equal to desired 1.0V.

FIG. 12*a* is a table illustrating the voltage conditions applied to an array of a serial string of floating-gate transistor NMOS NAND flash cells having single level programmed cells (SLC) embodying the principles of the present invention. Referring now to FIG. 12*a* for a discussion of the operating conditions for a NAND flash memory device as shown in FIGS. 6-11. FIG. 12*a* illustrates the operational modes for a NAND flash memory device such as READ, ERASE, ERASE VERIFY, PROGRAM, PROGRAM VERIFY and CORRECTION VERIFY. The table of FIG. 12*a* further provides the voltage levels applied to the selected word lines 432S and unselected word lines 432U and 432SU, selected block gate select lines 433S and unselected Block gate select lines 433U, and corresponding control signals including the selected block selection output IN 502S, the unselected block selection output IN 502U, selected page address XT 428S, unselected page address XT 428U, pass block select signal (VPAS) 525 and program select signal (PGM_SEL) 495.

For a read operation, the gate select lines 433S of the unselected block 412U are set to a voltage level of approximately the ground reference voltage source (0.0V) and the word lines 432U of the unselected blocks 412U are set to be floating (F*). The gate select line 433S of the selected block 412S** is set to a first intermediate voltage (HV*) of approximately +6.0V. The selected word line 432S is set to a voltage level of approximately the ground reference voltage source (0.0V) and the unselected word lines 432SU are set to the first intermediate voltage (HV*) of approximately +6.0V. The selected block selection output IN 502S is set to a voltage level of approximately the power supply voltage source VDD. The unselected block selection outputs IN 502U are set to voltage level of approximately the ground reference voltage source (0.0V). The selected page address XT 428S is set to the voltage level of approximately the ground reference voltage source (0.0V) voltage level of approximately the ground reference voltage source (0.0V) and the unselected page addresses XT 428U are voltage level of approximately the first intermediate voltage (HV*) of approximately +6.0V. The pass block select signal (VPAS) 525 is set to the first intermediate voltage (HV*) of approximately +6.0V. The program select signal PGM_SEL 495 is set to the voltage level of approximately the ground reference voltage source (0.0V).

In the block erase operation, the P-type well (TPW 215 of FIG. 3*c*) is set to a high erase voltage level of approximately +20.0V. The gate select lines 433U and the word lines 432U of the unselected blocks 412U are coupled to high erase voltage level of approximately +20.0V from the P-type well. The gate select line 433S, the selected word line 432S, and the unselected word lines 432SU of the selected block 412S are set to a voltage level of approximately the ground reference voltage source (0.0V). The selected block selection output IN 502S is set to a voltage level of approximately the power supply voltage source VDD. The unselected block selection outputs IN 502U are set to voltage level of approximately the ground reference voltage source (0.0V). The selected page address XT 428S and the unselected page addresses XT 428U are voltage level of approximately the ground reference voltage source (0.0V). The pass block select signal (VPAS) 525 and the program select signal PGM_SEL 495 are set to the voltage level of approximately the ground reference voltage source (0.0V).

As a result of the above conditions, all the gates of the NMOS floating gate transistors M0, ..., Mn of the selected block 412S are connected to ground voltage. This with the connection of the P-type well to the high erase voltage level of approximately +20.0V activates the Fowler-Nordheim channel tunneling effect for the selected block 412S. The coupling of the unselected gate select lines 433U and the unselected word lines 432U of the unselected blocks 412U of the same sector to the high erase voltage level of approximately +20.0V prevents the activation of Fowler-Nordheim channel tunneling effect.

After a predetermined erase time, an erase verification operation is executed. The sense amplifier node SA 620 of FIG. 11 is charge discharged to approximately the ground reference voltage source (0.0V). This is transferred through the global bit lines 447a, ..., 447n to the local bit lines 465a, ..., 465n to the drain of the select gate floating gate transistors MG0. The voltage levels for the block erase verify are identical to those of the read operation except that all the word lines 432S and 432U of the selected block 412S are set to the voltage level of approximately the ground reference voltage source (0.0V). The voltage level of the drains of the select floating gate transistors MG0 are tested to determine that the pre-discharged voltage is maintained at approximately the ground reference voltage source (0.0V) or above the set detection level. If the voltage level of the drains of the select floating gate transistors MG0 is above the set detection, then all NMOS floating gate transistors M0, ..., Mn have been erased successfully to a voltage level less than the upper boundary of the threshold voltage Vt0H, which is approximately −1.0V.

All the gates of the NMOS floating gate transistors M0, ..., Mn of the unselected block 412U are set to be floating. The gate select lines 433U of the unselected blocks 412U are set to approximately the ground reference voltage source (0.0V), so the sensed data is only reflected the status of selected block 412S.

In the page erase operation, the P-type well (TPW 215 of FIG. 3c) is set to a high erase voltage level of approximately +20.0V. The gate select lines 433U and the word lines 432U of the unselected blocks 412U are coupled to high erase voltage level of approximately +20.0V from the P-type well. The gate select line 433S and the selected word line 432S of the selected block 412S are set to a voltage level of approximately the ground reference voltage source (0.0V). The unselected word lines 432SU and the gate select line 433S of the selected block 412S is coupled to high erase voltage level of approximately +20.0V from the P-type well. The selected block selection output IN 502S is set to a voltage level of approximately the power supply voltage source VDD. The unselected block selection outputs IN 502U are set to voltage level of approximately the ground reference voltage source (0.0V). The selected page address XT 428S is set to a voltage level of approximately the ground reference voltage source (0.0V). The unselected page addresses XT 428U and the pass block select signal (VPAS) 525 are set to a voltage level of approximately the power supply voltage source VDD. The program select signal PGM_SEL 495 is set to the voltage level of approximately the ground reference voltage source (0.0V).

As a result of the above conditions, one of the gates of the NMOS floating gate transistors M0, ..., Mn of the selected page 432S of the selected block 412S are connected to ground voltage. This with the connection of the P-type well to the high erase voltage level of approximately +20.0V activates the Fowler-Nordheim channel tunneling effect for the selected page 432S of the selected block 412S. The coupling of the unselected word lines 432SU of the selected block 412S and the unselected gate is select lines 433U and the unselected word lines 432U of the unselected blocks 412U of the same sector to the high erase voltage level of approximately +20.0V prevents the activation of Fowler-Nordheim channel tunneling effect.

After a predetermined erase time, an erase verification operation is executed. The sense amplifier node SA 620 of FIG. 11 is pre-discharged to a detection voltage level of approximately ground reference voltage source (0.0V) ground reference voltage source (0.0V). This is transferred through the global bit lines 447a, ..., 447n to the local bit lines 465a, ..., 465n to the drain of the select floating gate transistors MG0. The voltage levels for the block erase verify are identical to those of the read operation. The voltage level of the drains of the select floating gate transistors MG0 are tested to determine that the pre-discharged voltage is maintained at or above the voltage level of the ground reference voltage source (0.0V). If the voltage level of the drains of the select floating gate transistors MG0 is above the set detection level, then the selected NMOS floating gate transistor M0, ..., Mn has been erased successfully to a voltage level less than the upper boundary of the threshold voltage Vt0H, which is approximately −1.0V.

All the gates of the NMOS floating gate transistors M0, ..., Mn of the unselected block 412U are set to be floating. The gate select lines 433S of the unselected blocks are set to the voltage level of the ground reference voltage source (0.0V), so the sensed data is only reflects the status of selected block 412S.

In the program operation, the gate select line 433S of the selected block 412S and the gate select lines 433U and the word lines 432U of the unselected block 412U are set to an intermediate program inhibit voltage of approximately +5.0V. The selected word line 432S of the selected block 412S is set to a high programming voltage level of from approximately +15.0V to approximately +20.0. The unselected word lines 432SU of the selected block 412S are set to a larger programming inhibit voltage of approximately +10.0V. The selected block selection output IN 502S is set to a voltage level of approximately the power supply voltage source VDD. The unselected block selection outputs IN 502U are set to voltage level of approximately the ground reference voltage source (0.0V). The selected page address XT 428S is set to a high programming voltage level of from approximately +15.0V to approximately +20.0. The unselected page addresses XT 428U are set to the larger programming inhibit voltage of approximately +10.0V. The pass block select signal (VPAS) 525 is set to the second intermediate program inhibit voltage of approximately +5.0V and the program select signal PGM_SEL 495 are set to an larger programming inhibit voltage of +10.0V.

As a result of the above conditions, all the gates of the NMOS floating gate transistors M0, ..., Mn of the selected page 413 of the selected block 412S are connected to the large programming voltage. This with the connection of the P-type well to the ground reference voltage level (0.0V) activates the Fowler-Nordheim channel tunneling effect for the NMOS floating gate transistors M0, ..., Mn of the selected page 413 the selected block 412S. The coupling of the unselected word lines 432SU of the selected blocks 412S to the larger programming inhibit voltage of approximately +10.0V and the unselected gate select lines 433U and the unselected word lines 432U of the unselected blocks 412U to the intermediate program inhibit voltage (5.0V) prevents the activation of Fowler-Nordheim channel tunneling effect.

After the program time, a program verification operation is executed. The sense amplifier node SA 620 of FIG. 11 is charged to a voltage level of the power supply voltage source VDD plus the threshold voltage of an NMOS transistor Vt (VDD+Vt). This is transferred through the global bit lines 447a, . . . , 447n to the local bit lines 465a, . . . , 465n to the drain of the select floating gate transistors MG0. The voltage levels for the block program verify are identical to those of the read operation except for the selected word line 432S and the selected page address XT 428S are set the threshold value of the desired lower boundary of the threshold voltage Vt1L for the programmed logic level ("0"). The voltage level of the drains of the select floating gate transistors MG0 are tested to determine that the pre-charged voltage is maintained above or below the set detection level. If the voltage level of the drains of the select floating gate transistors MG0 is above the detection level, then all NMOS floating gate transistors M0, . . . , Mn have been programmed successfully to a voltage level greater than the desired lower boundary of the threshold voltage Vt1L as shown in FIG. 3d or is approximately +1.0V.

All the programmed NMOS floating gate transistors M0, . . . , Mn must be verified that they have a threshold voltage value that is greater than the desired lower boundary of the threshold voltage Vt1L and less than the desired upper boundary of the threshold voltage Vt1H or approximately +3.0V. To verify that the programmed NMOS floating gate transistors M0, . . . , Mn are less than a program correction verify is executed. The voltage levels of the program correction verify are identical to that of the program verify operation with the exception that the selected word line 432S and the selected page address XT 428S are set the threshold value of the desired upper boundary of the threshold voltage Vt1H.

For those of the NMOS floating gate transistors M0, . . . , Mn that have a threshold voltage that are not between the desired lower boundary of the threshold voltage Vt1L and desired upper boundary of the threshold voltage Vt1H, must have their threshold voltage levels adjusted. Any programmed the NMOS floating gate transistors M0, . . . , Mn that have a threshold voltage Vt1 greater than the desired upper boundary of the threshold voltage Vt1H must have its programmed threshold voltage Vt1 adjusted to be less than the upper boundary of the threshold voltage level Vt1H. The correction involves a soft collective erase on all the NMOS floating gate transistors M0, . . . , Mn in the selected page to bring back the those the NMOS floating gate transistors M0, . . . , Mn having a threshold voltage larger than the desired upper boundary of the threshold voltage Vt1H. The soft erase is followed by a bit-by-bit slow program. The best method for accomplishing the slow program is to gradually increase the voltage step of the selected word line 432S program voltage incrementally from +15.0V to +20.0V during the program operation. The increment step of the program voltage may be set from approximately +0.3V to approximately +0.5V. This method more fully controls the programmed threshold voltage level of the programmed the NMOS floating gate transistors M0, . . . , Mn such that it remains below desired lower boundary of the threshold voltage Vt1L.

The desired threshold voltage VtD of the select floating gate transistors MG0 of the selected block of the NMOS floating gate transistors M0, . . . , Mn must have its threshold voltage level VtD controlled. There are several design specification goals for select floating gate transistors MG0. First of all, the select floating gate transistors MG0 may have one single wide positive threshold voltage distribution. It should remain larger than +2.0V (see FIG. 3f) for the boundary of the threshold voltage VtD during the product life cycle after 100K repeat program and erase of the array of a serial string of floating-gate transistor NMOS NAND flash cells.

The threshold voltage VtD of the select floating gate transistors MG0 must be optimized to reduce the threshold voltage shift due to repeat read, program and erase in product life cycle of the array of a serial string of floating-gate transistor NMOS NAND flash cells. In the array of a serial string of floating-gate transistor NMOS NAND flash cells of FIG. 6 higher voltage levels are required in read, program and erase operation to be applied to the word lines 432S, 432SU, and 432U, and the P-type Well (TPW) 215 of FIG. 3c. In addition, a high voltage bit line inhibit voltage of from approximately +8.0V to approximately +10.0V is required in selected bit lines 465a, . . . , 465n of FIG. 6 and source lines 470a, . . . , 470n of FIG. 6. In a read operation, to secure the right operation of activating and deactivating the selected bit lines 465a, . . . , 465n and source lines 470a, . . . , 470n in consideration of repeated stress in selected bit lines 465a, . . . , 465n, the desired upper boundary of the threshold voltage Vt1H, is set to a voltage level of approximately 3.0V to allow more margin for threshold voltage drop due to bit line inhibit high voltage stress during program operation. The desired upper boundary of the threshold voltage Vt1H is not of concern because of the available high voltages in all operations. The select floating gate transistors MG0 may always be coupled to a voltage level higher than the desired upper boundary of the threshold voltage Vt1H when it is selected and 0V to deselected the NAND string of NMOS floating gate transistors M0, . . . , Mn. As shown in FIG. 3f, the threshold voltage of the select floating gate transistors MG0 is preferably set within the desired boundary of the threshold voltage VtD value of greater than +2.0V. The worst-case high voltage bit line stress condition of the select floating gate transistors MG0 is when the drain and source are biased with +10.0V with gate tied to +5.0V. The gate-to-source voltage (Vgs) or the gate-to-drain (Vgd) is +5.0V. For an upper boundary of the threshold voltage Vt1H drop is from initial programmed value of +3.0V but kept higher than the lower boundary of the threshold voltage Vt1L of +0.5V, there is about 2.5V margin in product cycle. Based on a typical NAND flash string of the NMOS floating gate transistors MG0, M0, . . . , Mn threshold voltage drop measurement report, the 2.5V margin can sustain more than 100K P/E cycles in product life. It should be noted that the preferred desired lower boundary of the threshold voltage Vt1D for the select floating gate transistors MG0 as shown in FIG. 3f is for both single level program cell (SLC) and the multiple level program (MLC) case.

In programming the select floating gate transistors MG0 to a threshold voltage level VtD within the voltage distribution as shown in FIG. 3f, the select floating gate transistors MG0 is first erased collectively with the NAND strings of the NMOS floating gate transistors M0, . . . , Mn in a selected block 412S of the array 405 of FIG. 6. After desired upper boundary of the erased threshold voltage Vt0H has been successfully verified for the for the NAND string of NMOS floating gate transistors M0, . . . , Mn, the desired boundary of the threshold voltage VtD of the select floating gate transistors MG0 are programmed and verified.

During the program operation, the selected word line 432S are programmed in order from top selected word line WL0[0] 432a or WLN[0] 434a and is completed with the programming of bottom selected word line WL0[n] 432n or WLN[n] 434n. The program select signal PGM_SEL 495 of FIG. 6 is coupled to a voltage level of approximately +8.0V plus a threshold voltage level to allow the full program bit line inhibit voltage of +10.0V to be transferred from a selected local bit line 465a, 465b, 465n to a selected associated local source line 470a, 470b, . . . , 470n or vise versa. The block selection output In 502 for the selected row decoders 422a, 422b, 422n, and 424a, 424b, 424n of FIG. 6 is set to the voltage level of the power supply VDD to activate the selected local charge pump circuit 505a, . . . , 505n to allow the full passage of the high programming voltage level of from approximately +15.0V to approximately +20.0 to the selected word line 432S and the intermediate programming inhibit voltage of approximately +10.0V for the unselected word lines 432SU in the selected BLOCK 412S. The block selection output node OUT 520 for the selected BLOCK 412S has to be pumped up to a voltage level to approximately +20.0V plus an NMOS transistor voltage threshold Vt to fully pass the required program bit line inhibit voltage of +10.0V for the selected local bit line 465a, 465b, . . . , 465n that contain NMOS floating gate transistors M0, . . . , Mn that are to be programmed and pass the bit line inhibit voltage level of approximately +8.0V to the NAND string of NMOS floating gate transistors M0, . . . , Mn on the unselected local bit line 465a, 465b, . . . , 465n that are not to be programmed.

FIG. 12b is a table illustrating the voltage conditions applied to an array of a serial string of floating-gate transistor NMOS NAND flash cells having multiple level programmed cells (MLC) embodying the principles of the present invention. Referring now to FIG. 12b for a discussion of the operating conditions for a NAND flash memory device as shown in FIGS. 6-11. FIG. 12b illustrates the operational modes for a NAND flash memory device such as READ, ERASE, ERASE VERIFY, PROGRAM, PROGRAM VERIFY and CORRECTION VERIFY. The table of FIG. 12b further provides the voltage levels applied to the selected word lines 432S and unselected word lines 432U and 432SU, selected block gate select lines 433S and unselected Block gate select lines 433U, and corresponding control signals including the selected block selection output IN 502S, the unselected block selection output IN 502U, selected page address XT 428S, unselected page address XT 428U, pass block select signal (VPAS) 525 and program select signal (PGM_SEL) 495.

The read operation for a multiple level program of the array of a serial string of floating-gate transistor NMOS NAND flash cells is identical to that of the single level program describe above for FIG. 12a except that the selected word line voltages 432S are now set sequentially to three separate detection levels—approximately the voltage level of the ground reference voltage source (0.0V), a first positive reference voltage level (Vr1), and a second positive reference voltage level (Vr2). The first positive reference voltage level (Vr1) is set to a voltage level such that it will be greater than the upper boundary of the first positive threshold voltage level Vt1H and less than the lower boundary of the second positive threshold voltage level Vt2L. The second positive reference voltage level (Vr2) is set to a voltage level such that it will be greater than the upper boundary of the second positive threshold voltage level Vt2H and less is than the lower boundary of the third positive threshold voltage level Vt3L. The threshold voltage levels define the data as stored in the NMOS floating gate transistors M0, . . . , Mn as shown in FIG. 3e.

The block erase, the page erase, block erase verify, and the page erase verify for a multiple level program of the array of a serial string of floating-gate transistor NMOS NAND flash cells are identical to that of the single level program describe above for FIG. 12a.

The programming for a multiple level programming of the array of a serial string of floating-gate transistor NMOS NAND flash cells is identical to that of the single level programming of FIG. 12a except that the high programming voltage level of from approximately +15.0V to approximately +20.0 is gradually increased incrementally in steps to more easily establish the multiple programmed threshold voltage levels during the program operation. The increment step of the application of the high programming voltage level of from approximately +15.0V to approximately +20.0 can be set from approximately +0.3V to approximately +0.5V. In such method, the upper boundary of the first positive threshold voltage level Vt1H can better controlled within its specified limits.

The program verify and the correction verify operations are again for the multiple level program are again identical to the single level program of FIG. 12a except for the program verify the selected word lines 432S are now set sequentially to three separate detection levels. For the program verify the selected word lines are set to the lower boundary of the first positive threshold voltage level Vt1L, then to the lower boundary of the second positive threshold voltage level Vt2L, and followed by the lower boundary of the third positive threshold voltage level Vt3L. The correction verify levels the selected word lines are set to the upper boundary of the first positive threshold voltage level Vt1H, then to the upper boundary of the second positive threshold voltage level Vt2H, and followed by the upper boundary of the third positive threshold voltage level Vt3H. The voltage distributions for the programmed NMOS floating gate transistors M0, . . . , Mn must be between the lower and upper boundaries for the first second and third positive threshold voltage levels Vt1L and Vt1H, Vt2L and Vt2H, Vt3L and Vt3H.

Any programmed NMOS floating gate transistors M0, . . . , Mn having their first threshold voltage level Vt1 greater than the upper boundary of the first positive threshold voltage level Vt1H, their second threshold voltage level Vt2 greater than the upper boundary of the second positive threshold voltage level Vt2H, and their third threshold voltage level Vt3 greater than the upper boundary of the third positive threshold voltage level Vt3H, then the programming of the failing programmed NMOS floating gate transistors M0, . . . , Mn must be corrected. With a multiple level programming, a three-step to correction process for the respective thresholds is required. The correction begins with a soft collective erase, followed by a bit-by-bit program. As described above, the selected word line is set to the high programming voltage level and is gradually increased incrementally from +15V to +20V during the program operation. The increment step can be set from approximately +0.3V to approximately +0.5V to more easily control the upper boundary of the first positive threshold voltage level Vt1H.

As shown, the multiple level program is able to store three positive threshold voltage levels Vt0, Vt1, and Vt3 and an erase threshold voltage level Vt0. It is known in the art that any number of voltage threshold levels greater than 4 is possible. For example, if each of the NMOS floating gate transistors M0, . . . , Mn is to store eight threshold voltage level, then each NMOS floating gate transistors M0, . . . , Mn stores three bits of data. For the analog threshold voltage storage, the largest number is of threshold voltages stored is 256. This means each one of the NMOS floating gate transistors M0, . . . , Mn can store up to eight bits of data. The difference in the threshold voltages ΔVt is about 0.5 mV between any adjacent threshold voltage state.

Figure 13:
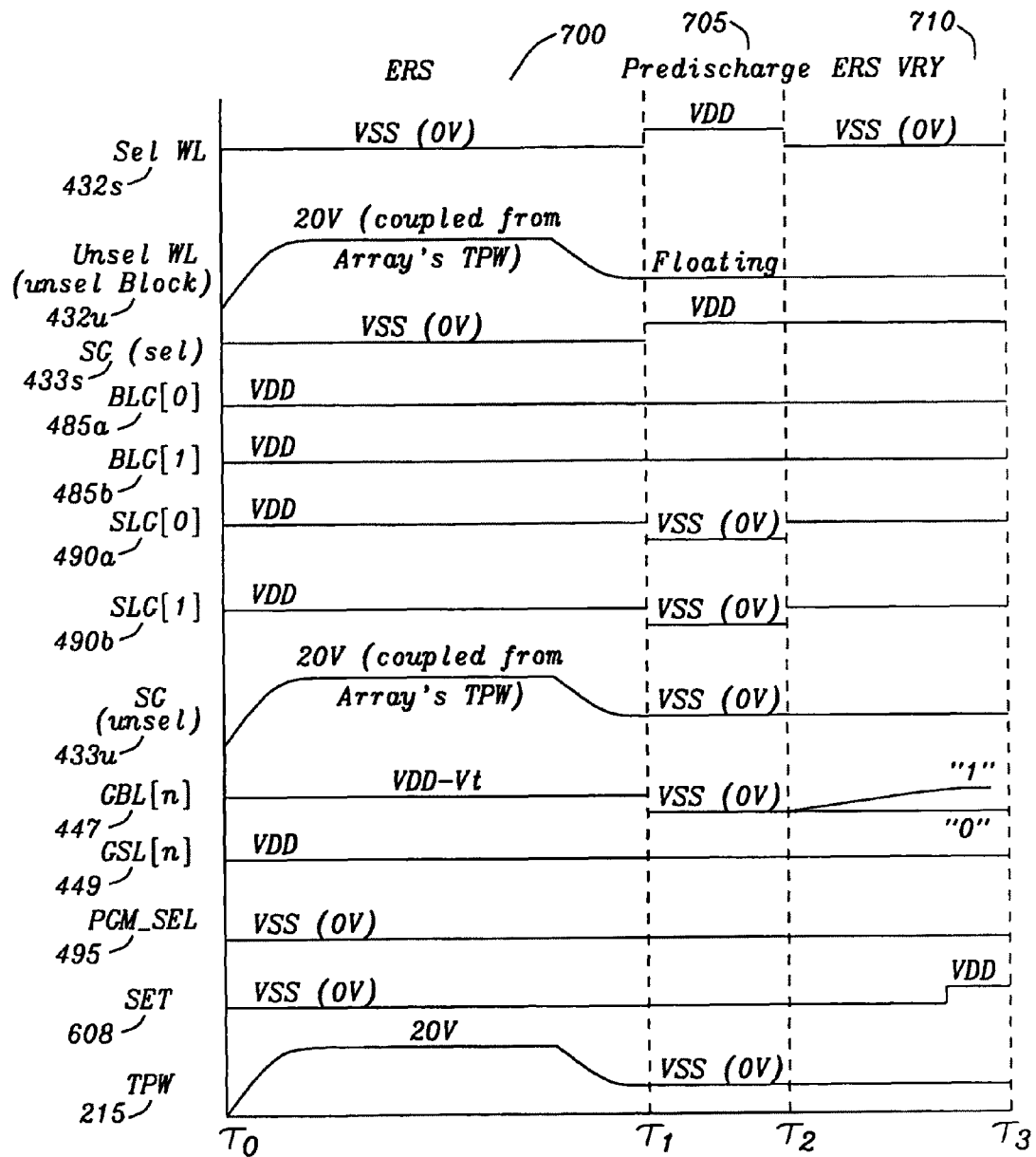
FIG. 13 is a timing diagram for erasing and erase verification of a block of the nonvolatile memory device of FIG. 5.

FIG. 13 is a timing diagram for erasing and erase verification of a block of the nonvolatile memory device of FIG. 5. The plots of FIG. 13 illustrates the operational timing for the signals applied to the selected word lines 432S and unselected word lines 432U of the selected block, selected block gate select lines 433S and unselected Block gate select lines 433U, and corresponding control signals including the bit line select lines BLG[0] 485a and BLG[1] 485b, source line select lines SLG[0] 490a and SLG[1] 490b, the global bit line GBL[0] 447a, . . . , 447n, global source lines GSL[0] 449a, the program select signal (PGM_SEL) 495, and the voltage level of the set signal 608 of FIG. 11 and the voltage level of the P-type well 215 of FIG. 3c.

The single level program (SLC) block and page erase and erase verify processes are iterative procedures. The erase and erase verify processes start at the time $\tau_0$ for the Erase phase 700. The erase phase is a Fowler-Nordheim channel tunneling to reduce the threshold voltage Vt of the selected NMOS floating gate transistors M0, . . . , Mn. The Erase phase is then followed by a pre-discharge phase 705 starting at the time $\tau_1$. The pre-discharge phase 705 applies a voltage level equal to the substrate voltage source (0.0V) to the sensing node of each selected global bit line GBL[N] 447. The third phase is an erase verification ERS VFY 710 at selected global bit line GBL[N] 447. An erase counter is set with a value to terminate if the die on which the nonvolatile memory device is formed fails to meet the desired threshold voltage level Vt within a set number of erase and erase verify cycles.

During the erase phase 700 between the time $\tau_0$ and time $\tau_1$, the selected word line 432S is brought to the voltage level of the substrate voltage source (0.0V) and the P-type well TPW 215 is brought to the high erase voltage level of approximately +20.0V. The unselected word lines 432U of the unselected blocks are set to be floating. The selected gate select line 433S is set to the voltage level of the substrate voltage source (0.0V). The unselected gate select line 433U, the unselected word lines 432Su of the selected block and the unselected word lines 432U of the unselected blocks are coupled to the high erase voltage level of approximately +20.0V. The bit line select lines BLG[0] 485a and BLG[1] 485b and the source line select lines SLG[0] 490a and SLG[1] 490b are set to the voltage level of the power supply voltage source VDD. The global bit lines GBL[n] 447 are set to the voltage level of the power supply voltage source VDD less the threshold voltage level (Vt) of an NMOS transistor (VDD−Vt). The global source lines GSL[n] 449 are set to the voltage level of the power supply voltage source VDD. The program select signal PGM_SEL 495 is set to the voltage level of the substrate voltage source (0.0V) to isolate the local bit line 465a, 465b, . . . , 465n from the local source lines 470a, 470b, . . . , 470n. The set signal 608 is deactivated to isolate the high voltage latch 600 from the global bit lines 447. These voltage levels, as described, activate the Fowler-Nordheim channel tunneling to reduce the threshold voltage Vt of the selected NMOS floating gate transistors M0, . . . , Mn.

During the pre-discharge phase 705 between the time $\tau_1$ and time $\tau_2$, the selected word line 432S is set to the voltage level of the power supply voltage source VDD. The unselected word lines 432U of the unselected blocks are set to be floating. The gate select line 433S is set to the first intermediate voltage (HV*) of approximately +6.0V. The bit line select lines BLG[0] 485a and BLG[1] 485b are set to the voltage level of the power supply voltage source VDD. The source line select lines SLG[0] 490a and SLG[1] 490b are set to the voltage level of the substrate voltage source (0.0V). The unselected gate select line 433U is set to the voltage level of the substrate voltage source (0.0V). The global bit lines GBL[n] 447 are set to the voltage level of the substrate voltage source (0.0V) and the global source lines GSL[n] 449 are set to the voltage level of the power supply voltage source VDD. The program select signal PGM_SEL 495 and the set signal 608 are set to the voltage level of the substrate voltage source (0.0V). These voltage levels, as established, set the global bit lines GBL[n] 447 and the local bit line 465a, 465b, . . . , 465n to a voltage level equal to the substrate voltage source (0.0V).

Depending on whether the erase operation is a page erase process or full block erase, the erase verify, the erase verify ERS VFY 710 tests that all the threshold voltage Vt of the erased NMOS floating gate transistors M0, . . . , Mn is below the upper boundary of the erased threshold voltage Vt0H, which is approximately −1.0V after erase. In the case of a page erase operation, each of the selected NMOS floating gate transistors M0, . . . , Mn is in communication with each global bit lines GBL[n] 447 and is compared with the upper boundary of the erase threshold voltage Vt0H. Conversely, if a full block is erased simultaneously, then each of the selected NMOS floating gate transistors M0, . . . , Mn connected to each line 432a, 432b, 432n, 434a, 434b, 434n of the selected block 412a, 412b, . . . , 412n, and 414a, 414b, . . . , 414n.

During the block erase verify phase 710 between the time $\tau_2$ and time $\tau_3$, the selected word line 432S is brought to the voltage level of the substrate voltage source (0.0V). The unselected word lines 432U of the unselected blocks are set to be floating. The gate select line 433S is set to the voltage level of the power supply voltage source VDD. The bit line select lines BLG[0] 485a and BLG[1] 485b and source line select lines SLG[0] 490a and SLG[1] 490b are set to the voltage level of the power supply voltage source VDD. The unselected gate select line 433U is set to the voltage level of the substrate voltage source (0.0V). The global bit lines GBL[n] 447 now are charged to a voltage level representative of a logical "1" or logical "0" of based on the data stored as the threshold voltage Vt of the selected NMOS floating gate transistors M0, . . . , Mn. The global source lines GSL[n] 449 are set to the voltage level of the power supply voltage source VDD. The program select signal PGM_SEL 495 are set to voltage level of the substrate voltage source (0.0V). The set signal 608 transitions from the voltage level of the substrate voltage source (0.0V) to the voltage level of the power supply voltage source VDD. The set signal 608 allows the data to be captured in the high voltage latch 600 of FIG. 11.

In the block erase verify, the selected word line 432S is set to voltage level of the substrate voltage source VSS (0.0V). If the erased voltage threshold Vt of the selected NMOS floating gate transistors M0, . . . , Mn is negative and is below the upper boundary of the erased voltage threshold Vt0H, then cell current will flow through NMOS floating gate transistors M0, . . . , Mn and the select gate floating gate transistor MG0 from global source line GSL[N] 449 through local source lines 470a, 470b, . . . , 470n and local bit line 465a, 465b, . . . , 465n to the corresponding global bit line GBL[N] 447. Therefore, the global bit line GBL[N] 447 is charged up from initial voltage level of the substrate voltage source (0.0V) to a voltage level higher than the upper boundary of the erase threshold voltage level Vt0H, if the erased voltage threshold Vt of the selected NMOS floating gate transistors M0, . . . , Mn is below the upper boundary of the erased threshold voltage (Vt0H). For the case of a block erase, all NMOS floating gate transistors M0, . . . , Mn are erased below the negative erase threshold voltage level Vt0H. The erase verify operation 710 is executed collectively for all of the word lines 432. The advantage of the erase verify operation 710 is that it is more accurate because the true negative erased threshold voltage level Vt0 is measured as the global bit line GBL[n] 449 voltage.

If the erase 700 and the erase verify 710 fail to meet the desired erased threshold voltage level Vt0H, then are repetitively erased until they are sufficiently below the erased threshold voltage level. The erase time for a page erase or block erase is almost same due to small erase current consumption.

Figure 14:
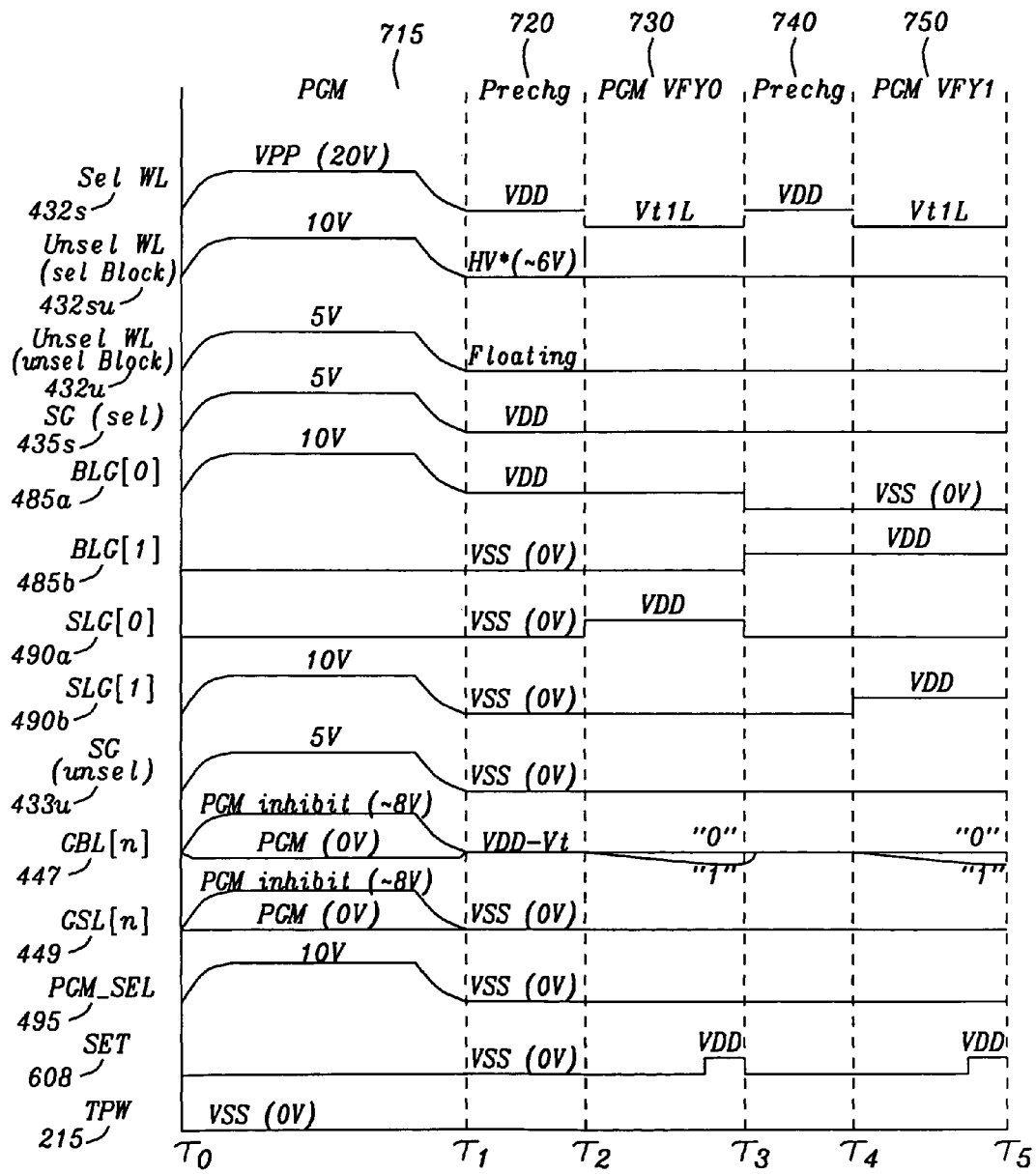
FIG. 14 is a timing diagram for programming and program verification of a block of the nonvolatile memory device of FIG. 5.

FIG. 14 is a timing diagram for programming and program verification of a block of the nonvolatile memory device of FIG. 5. The plots of FIG. 14 illustrate the operational timing for the signals applied to the selected word lines 432S and unselected word lines 432U and 432SU, selected block gate select lines 433S and unselected Block gate select lines 433U, and corresponding control signals including the bit line select lines BLG[0] 485a and BLG[1] 485b, source line select lines SLG[0] 490a and SLG[1] 490b, the global bit line GBL[0] 447a, ..., 447n, global source lines GSL[0] 449a, the program select signal (PGM_SEL) 495, and the voltage level of the set signal 608 of FIG. 11 and the voltage level of the P-type well 215 of FIG. 3c.

As shown in FIG. 6, each NAND string of the NMOS floating gate transistors M0, ..., Mn has one dedicated local bit line LBL[n] 465a, 465b, ..., 465n and one dedicated local source line LSL[N] 470a, 470b, ..., 470n. Two local bit lines 465a, 465b, ..., 465n shares one global bit line GBL[n] 447a, ..., 447n through the bit line select gating transistors MB0 and MB1 480a, 480b, ..., 480n. The bit line select gating transistors MB0 and MB1 480a, 480b, ..., 480n are controlled by the bit line select lines BLG[0] 485a and BLG[1] 485b. Similarly, two local source lines 470a, 470b, ..., 470n share one global source line GSL 449a, ..., 449n through the source line gating transistors MS0 and MS1 475a, 475b, 475n. The source line gating transistors MS0 and MS1 475a, 475b, 475n are controlled by the source line select lines SLG[0] 490a and SLG[1] 490b.

The single level program (SLC) block and page erase and erase verify processes are iterative procedures. The program process 710 and program verify process 730 and 750 are executed on the selected word line WL 432S as a whole page or selected NMOS floating gate transistors M0, ..., Mn as a partial page program. Note, a whole page means one selected word line WL 432S, while the partial page maybe the selected NMOS floating gate transistors M0, ..., Mn of ½ selected word line WL 432S or ¼ of selected word line WL 432S depending on the number of NMOS floating gate transistors M0, ..., Mn connected to the selected word line WL 432S and product spec. The program verify process 730 and 750 can be only performed in a ½ page increment of this embodiment as described in FIG. 6. If more metal layers are available for the NAND flash nonvolatile memory array, then each of the global bit line GBL[n] 447a, ..., 447n and each of the global source line GSL 449a, ..., 449n can be connected to one dedicated single local bit line LBL[n] 465a, 465b, ..., 465n and local source line LSL[N] 470a, 470b, 470n respectively, without a sharing. In that case, the pitch of metal is tighter in layout but the program verify process 730 and 750 can be performed in a whole page of a selected word line WL 432S within one cycle.

During the program process between the time $\tau_0$ and time $\tau_1$, the selected word line WL 432S is set to a high programming voltage level of from approximately +15.0V to approximately +20.0. The unselected word lines WL 432SU, the bit line select line BLG[0] 485a, the source line select line SLG[1] 490b, the program select signal (PGM_SEL) 495 are set to the larger programming inhibit voltage of approximately +10.0V. The unselected word line WL 432SU of the selected block, the selected block gate select lines 433S, and the unselected block gate select lines 433U are set to the intermediate program inhibit voltage of approximately +5.0V. The bit line select lines BLG[1] 485b and the source line select lines SLG[0] 490a are set the voltage level of the substrate voltage source VSS (0.0V). The global bit line GBL[n] 447n and global source line GSL[n] 449 are set to a second larger program inhibit voltage level of approximately +8.0V when the selected NMOS floating gate transistors M0, ..., Mn connected to the selected word line WL 432S are not to be programmed. The global bit line GBL[n] 447 and the global source line GSL 449n are set to the substrate voltage source VSS (0.0V) for those selected NMOS floating gate transistors M0, ..., Mn connected to the selected word line WL 432S are to be programmed. The set signal 608 is deactivated to isolate the high voltage latch 600 from the global bit lines 447 and the P-type well 215 is set to the substrate voltage source VSS (0.0V). These voltage levels as describe activate the Fowler-Nordheim channel tunneling to increase the threshold voltage Vt of the selected NMOS floating gate transistors M0, ..., Mn.

Since the selected word line WL 432S is divided into two half pages, the program verify process provides a first program verify operation 730 for a first half page and a second program verify operation 750. The first program verify operation 730 is accomplished on the even local bit line LBL[n] 465a, 465b, ..., 465n and local source line LSL[N] 470a, 470b, ..., 470n. The second program verify operation 750 is accomplished on the odd local bit line LBL[n] 465a, 465b, ..., 465n and local source line LSL[N] 470a, 470b, ..., 470n.

Prior to executing the each of the program verify operations 730 and 750, pre-charge operations 720 and 740 are executed. During the first pre-charge operation 720 between the between the time $\tau_2$ and time $\tau_3$, the selected word line WL 432S is set to the power supply voltage source VDD and the unselected word lines WL 432SU of the selected block is set to the first intermediate voltage (HV*), which is sufficiently large to turn on all the unselected NMOS floating gate transistors M0, ..., Mn connected to the unselected word lines 432SU. The unselected word lines WL 432U of the unselected blocks are allowed to float. The selected block gate select lines 433S and the even bit line select line BLG[0] 485a is set to the power supply voltage source VDD. The odd bit line select lines BLG[1] 485b, source line select lines SLG[0] 490a and SLG[1] 490b, and the unselected Block gate select lines 433U are set the voltage level of the substrate voltage source VSS (0.0V). The global bit line GBL[n] 447 is set to the voltage level of the power supply voltage source VDD minus a threshold voltage level Vt of an NMOS transistor (VDD−Vt). The program select signal (PGM_SEL) 495, set signal 608, the global source lines 449 and the P-type well 215 is set to the substrate voltage source VSS (0.0V).

During the first verify operation 730 between the time $\tau_3$ and time $\tau_4$, the selected word line WL 432S is set to the voltage level of the lower boundary of the programmed threshold voltage Vt1L. The unselected word lines WL 432SU of the is selected block remains set to the first intermediate voltage (HV*). The unselected word lines WL 432U of the unselected blocks remains floating. The selected block gate select lines 433S and the even bit line select line BLG[0] 485a remain set to the power supply voltage source VDD. The odd bit line select lines BLG[1] 485b, the even source line select lines SLG[0] 490a is set to the voltage level of the power supply voltage source VDD. The odd source select line SLG[1] 490b and the unselected Block gate select lines 433U remain set the voltage level of the substrate voltage source VSS (0.0V). The global bit line GBL[n] 447 is set to the voltage level of the power supply voltage source VDD minus a threshold voltage level Vt of an NMOS transistor (VDD−Vt). The program select signal (PGM_SEL) 495, set signal 608, the global source lines 449 and the P-type well 215 is set to the substrate voltage source VSS (0.0V). The global bit line GBL[N] 447 is discharged from initial voltage level of the power supply voltage source VDD minus the threshold voltage level Vt of an NMOS transistor (VDD−Vt) to a programmed threshold voltage level of the selected NMOS floating gate transistors M0, ..., Mn. If the data of the selected NMOS floating gate transistors M0, . . . , Mn is a logical "0", the global bit line GBL[N] 447 remains at the voltage level of the power supply voltage source VDD minus the threshold voltage level Vt of an NMOS transistor (VDD−Vt). If the data of the selected NMOS floating gate transistors M0, . . . , Mn is for a logical "1", the voltage level of the global bit line GBL[N] 447 decreases. The program select signal (PGM_SEL) 495, set signal 608, the global source lines 449 and the P-type well 215 remain set to the substrate voltage source VSS (0.0V). Near the end of the completion of the first verify operation 730, the set signal 608 transitions from the voltage level of the substrate voltage source (0.0V) to the voltage level of the power supply voltage source VDD. The set signal 608 allows the data to be captured in the high voltage latch 600 of FIG. 11.

During the second pre-charge operation 740 between the time $\tau_4$ and time $\tau_5$, the selected word line WL 432S is set to the power supply voltage source VDD and the unselected word lines WL 432SU of the selected block is set to the first intermediate voltage (HV). The unselected word lines WL 432U of the unselected blocks are allowed to float. The selected block gate select lines 433S and the even bit line select line BLG[1] 485b is set to the power supply voltage source VDD. The even bit line select lines BLG[0] 485a, source line select lines SLG[0] 490a and SLG[1] 490b, and the unselected Block gate select lines 433U are set the voltage level of the substrate voltage source VSS (0.0V). The global bit line GBL[n] 447 is set to the voltage level of the power supply voltage source VDD minus a threshold voltage level Vt of an NMOS transistor (VDD−Vt). The program select signal (PGM_SEL) 495, set signal 608, the global source lines 449 and the P-type well 215 is set to the substrate voltage source VSS (0.0V).

During the second verify operation 750 between the time $\tau_5$ and time $\tau_6$, the selected word line WL 432S is set to the voltage level of the lower boundary of the programmed threshold voltage Vt1L. The unselected word lines WL 432SU of the selected block remains set to the first intermediate voltage (HV*). The unselected word lines WL 432U of the unselected blocks remains floating. The selected block gate select lines 433S and the even bit line select line BLG[1] 485b remain set to the power supply voltage source VDD. The odd bit line select lines BLG[0] 485a, the odd source line select lines SLG[1] 490b is set to the voltage level of the power supply voltage source VDD. The even source select line SLG[0] 490a and the unselected Block gate select lines 433U remain set the voltage level of the substrate voltage source VSS (0.0V). The global bit line GBL[n] 447 is set to the voltage level of the power supply voltage source VDD less a threshold voltage level Vt of an NMOS transistor. The program select signal (PGM_SEL) 495, set signal 608, the global source lines 449 and the P-type well 215 is set to the substrate voltage source VSS (0.0V). The global bit line GBL[N] 447 is discharged from initial voltage level of the power supply voltage source VDD less the threshold voltage level Vt to a programmed threshold voltage level of the selected NMOS floating gate transistors M0, . . . , Mn. If the data of the selected NMOS floating gate transistors M0, . . . , Mn is a logical "0", the global bit line GBL[N] 447 remains at the voltage level of the power supply voltage source VDD minus the threshold voltage level Vt of an NMOS transistor (VDD−Vt). If the data of the selected NMOS floating gate transistors M0, . . . , Mn is for a logical "1", the voltage level of the global bit line GBL[N] 447 decreases. The program select signal (PGM_SEL) 495, set signal 608, the global source lines 449 and the P-type well 215 remain set to the substrate voltage source VSS (0.0V). Near the end of the completion of the first verify operation 750, the set signal 608 transitions from the voltage level of the substrate voltage source (0.0V) to the voltage level of the power supply voltage source VDD. The set signal 608 allows the data to be captured in the high voltage latch 600 of FIG. 11.

When at least one of the selected NMOS floating gate transistors M0, . . . , Mn has a threshold voltage level less than the lower boundary of the programmed threshold voltage Vt1L, the pre-charged voltage of the power supply voltage source VDD less a threshold voltage level Vt of an NMOS transistor (VDD−Vt) at global bit line GBL[N] 447 would be discharged to 0V. If all programmed threshold voltage level Vt1 are above the lower boundary of the threshold value Vt1L, then the pre-charged voltage of power supply voltage source VDD less a threshold voltage level Vt of an NMOS transistor (VDD−Vt) at global bit line GBL[N] 447 would stay at the voltage level of the power supply voltage source VDD less a threshold voltage level Vt of an NMOS transistor (VDD−Vt) so that the program 730 and 750 and the program verify 720 and 740 operations are successfully completed. Whether threshold voltage Vt1 of the selected NMOS floating gate transistors M0, . . . , Mn are meeting the lower boundary of the threshold value Vt1L or not, it is tested by the SET signal 680, which is used to set high voltage latch 600 shown in FIG. 11. Since each verification operation 730 and 750 can only check ½ page, the program verification operation PGM-VFY[0] 730 and program verification operation PGMVFY[1] 750 needs to executed twice. When the programmed threshold voltage Vt1 of the selected NMOS floating gate transistors M0, . . . , Mn is programmed above the lower boundary of the threshold Vt1L the sense amplifier node SA 620 of FIG. 11 is the voltage level of the power supply voltage source VDD, the NMOS transistors MN5 606 and NMOS transistor MN7 618 are both turned on and the high voltage latch 600 is set. As a result, the gate of the NMOS transistor MN3 634 would be low, and program verify node PE_OK 636 would be high to indicate the to completion of programming of the selected NMOS floating gate transistors M0, . . . , Mn. The input of high voltage latch 600 is from the data input/output DIO 612 from and external source but is gated by column select 445 in the NAND flash nonvolatile array.

Figure 15:
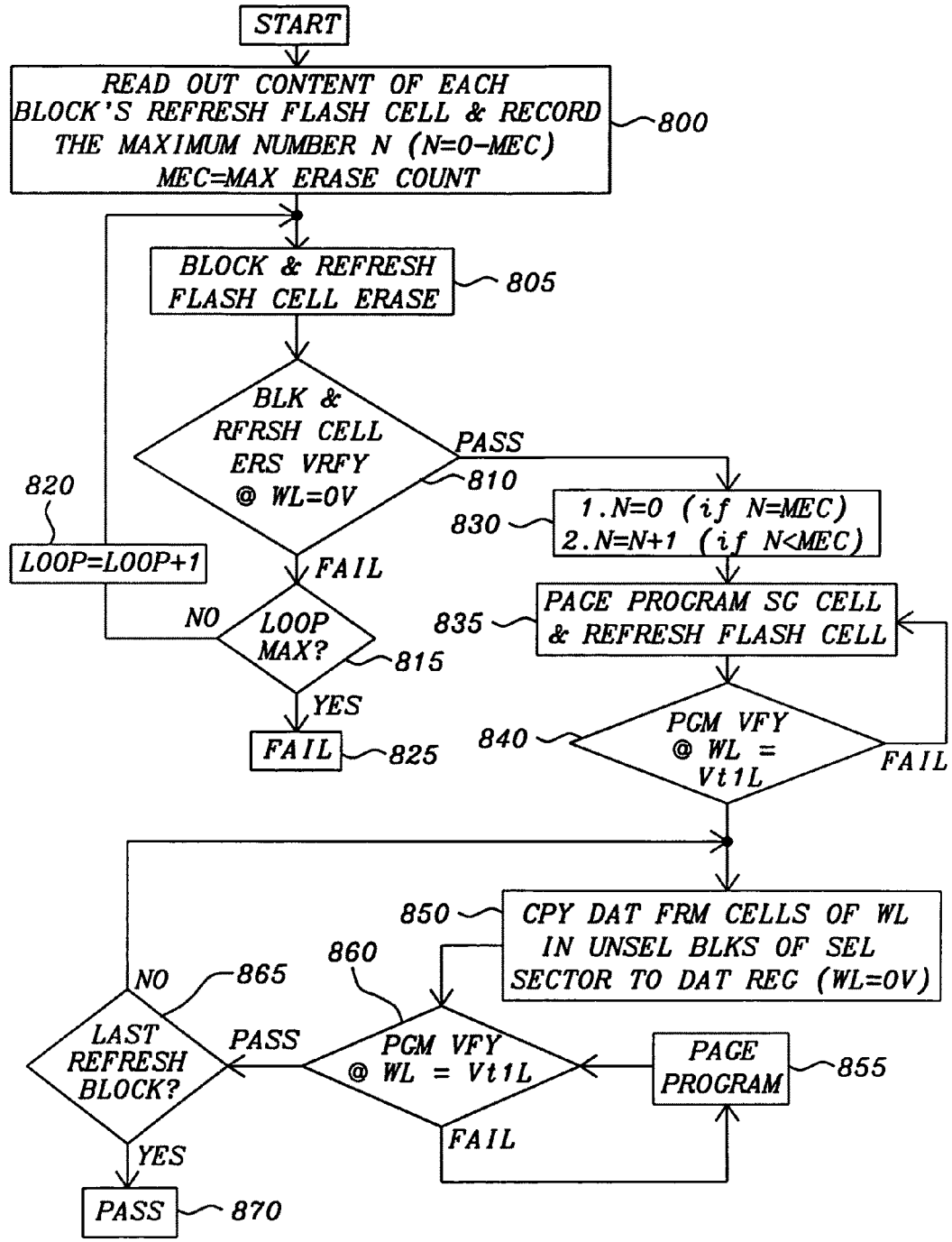
FIG. 15 is a flow chart of the method for erasing and refreshing a block of the nonvolatile memory device of FIG. 5.
Figure 16:
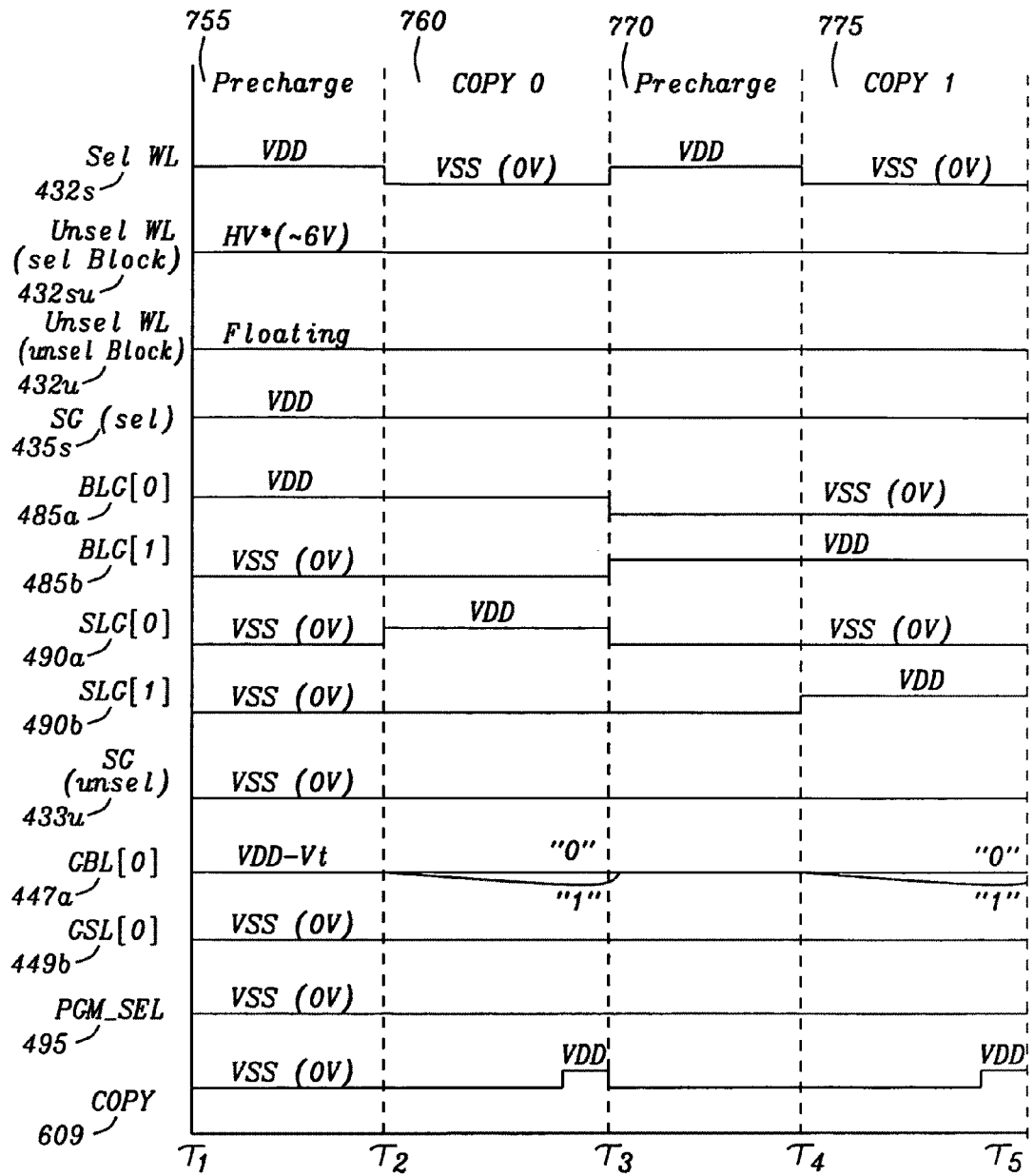
FIG. 16 is a timing diagram for copying a page from one block for restoring the data during a refresh operation of FIG. 15 of the nonvolatile memory device embodying the principles of this invention.

FIG. 15 is a flow chart of the method for erasing and refreshing a block of the nonvolatile memory device of FIG. 5. FIG. 16 is a timing diagram for copying a page from one block for restoring the data during a refresh operation of FIG. 15 of the nonvolatile memory device embodying the principles of this invention. Referring now to FIGS. 5, 6, 11, 15, and 16 for a discussion of a refresh process for reducing the disturbance effects of the high program and erasure voltages applied to the local bit lines 465a, 465b, . . . , 465n and word lines 432a, . . . , 432n on the unselected NMOS floating gate transistors M0, . . . , Mn in the unselected blocks 412a, 412b, . . . , 412n, and 414a, 414b, . . . , 414n within a selected sector 410a during the repeated program and erase cycles. The array of NMOS floating gate transistors MG0, M0, . . . , Mn is specified in current practice to be operable after being subjected to more than 100K program erase cycles. It should be noted that the threshold voltage level VtD of the select gate floating gate transistors MG0 is not as critical as the threshold voltage levels Vtn of the NAND string of the NMOS floating gate transistors M0, . . . , Mn connected to the select gate floating gate transistors MG0. The NMOS floating gate transistors M0, . . . , Mn stores relatively narrow threshold voltage levels Vt representing the single level programming (SLC) or multiple level programming (MLC) storage methods. The select gate floating gate transistors MG0 is used for connecting the NAND string of the NMOS floating gate transistors M0, ..., Mn to the associated local bit line 465a, 465b, ..., 465n. The threshold voltage of the select gate floating gate transistors MG0 is programmed to have a relatively high threshold voltage (>2.0V) such that there is a relatively large margin over which the threshold voltage Vt of the NMOS floating gate transistors M0, ..., Mn can vary and still be operable.

As described above the refresh process restores the threshold voltages Vtn of all unselected NMOS floating gate transistors M0, ..., Mn in the unselected blocks 412a, 412b, ..., 412n, and 414a, 414b, ..., 414n of the selected SECTOR within the set single level program or multiple level program level for the lower boundary of the threshold voltage level (VtnL) and the upper boundary of the threshold voltage level after repeat and accumulated program local bit line 465a, 465b, ..., 465n and word line 432a, ..., 432n disturbances.

An erase process begins reading (Box 800) the contents of each block erase count register 417a, ..., 417n, and 419a, ..., 419n for each block 412a, 412b, 412n, and 414a, 414b, ..., 414n with the selected sectors 410a, ..., 410n. The contents of the block erase count register 417a, ..., 417n, and 419a, ..., 419n are compared and the maximum count for the blocks 412a, 412b, ..., 412n, and 414a, 414b, ..., 414n is recorded (Box 800). The selected block 412a, 412b, ..., 412n, and 414a, 414b, 414n and the associated block erase count register 417a, ..., 417n, and 419a, ..., 419n are erased (Box 805) employing the voltage levels and timings as described in FIGS. 12a, 12b, and 13. The selected block 412a, 412b, ..., 412n, and 414a, 414b, ..., 414n and the associated block erase count register 417a, ..., 417n, and 419a, ..., 419n are then verified (Box 810) as described in FIGS. 12a, 12b, and 13. If the erase (Box 805) operation fails a maximum number of tolerable erase failures is compared (Box 815) to the erase count of the present selected block 412a, 412b, ..., 412n, and 414a, 414b, ..., 414n and the associated block erase count register 417a, ..., 417n, and 419a, ..., 419n. If the erase count has not exceeded the maximum number of tolerable erase failures, the erase count is incremented (Box 820) and the selected block 412a, 412b, ..., 412n, and 414a, 414b, ..., 414n and the associated block erase count register 417a, ..., 417n, and 419a, ..., 419n are erased (Box 805) again. If the erase (Box 805) fails and the erase count exceeds (Box 815) the maximum number tolerable erase failures, the nonvolatile memory device is deemed to have failed (Box 825) operation and is discarded.

When the selected block 412a, 412b, ..., 412n, and 414a, 414b, ..., 414n and the associated block erase count register 417a, ..., 417n, and 419a, ..., 419n passes the erase verification (Box 810), the block erase count register 417a, ..., 417n, and 419a, ..., 419n for the selected block 412a, 412b, ..., 412n, and 414a, 414b, 414n is set (Box 835) to zero (0), if the maximum erase count is exceeded. If the maximum erase count is not exceeded, then the maximum block erase count is incremented (Box 835). During the programming of the block erase count register 417a, ..., 417n, and 419a, ..., 419n, the select gate floating gate transistors MG0 on the gate select line 433a, 433n of the selected block 412a, 412b, ..., 412n, and 414a, 414b, ..., 414n are also programmed to refresh the select gate floating gate transistors MG0 to restore the threshold voltage of the select gate floating gate transistors MG0 to a value greater than the lower boundary of the threshold voltage VtD of the select gate floating gate transistors MG0.

To provide an example, the sectors 410a, ..., 410n of an array of nonvolatile NMOS floating gate transistors M0, ..., Mn are designated to contain four of the blocks 412a, 412b, ..., 412n, and 414a, 414b, ..., 414n. Each block has thirty-two NMOS floating gate transistors M0, ..., Mn connected in series with a select gate floating gate transistors MG0 connected to a first or top floating gate transistor M0. The NMOS floating gate transistors M0, ..., Mn that are aligned on a row constitute a page of the block 412a, 412b, ..., 412n, and 414a, 414b, ..., 414n. The block erase count registers 417a, ..., 417n, and 419a, ..., 419n for each block 412a, 412b, ..., 412n, and 414a, 414b, ..., 414n is connected through the gate select lines 433a, 433n to the row decoders 422a, 422b, 422n, and 424a, 424b, 424n of the read/write row decoder 420. This allows the erase count to be programmed to the associated block erase count register 417a, ..., 417n, and 419a, ..., 419n.

If the block erase count registers 417a, ..., 417n, and 419a, ..., 419n for the blocks 412a, 412b, ..., 412n, and 414a, 414b, ..., 414n of the selected sector 410a, ..., 410n have the following erase count:

| Block ID | Erase Count |
|----------|-------------|
| Block0   | 5           |
| Block1   | 3           |
| Block2   | 6           |
| Block3   | 7           |

If Block0 is chosen to be erased, the corresponding block erase count register will be reprogrammed from 5 to 8 after Block0 is erased. The refresh of the word line is applied to the word line 7 of the Blocks 1, 2, 3. Similarly, If Block2 is chosen to be erased, the corresponding block erase count register will be reprogrammed from 6 to 8 after Block2 is erased. The refresh of the word line is applied to the word line 7 of the Blocks 0, 1, 3. Once one of the four block erase count registers have reached the maximum erase count (31 in this instance) the block erase count registers are reset to zero after the next erase operation for the selected sector.

Once the select gate floating gate transistors MG0 and the block erase count register 417a, ..., 417n, and 419a, ..., 419n is programmed (Box 835) the select gate floating gate transistors MG0 and the NMOS flash floating gate transistors 585a, is 585b, 585c, 585d, and 585e of the block erase count register 417a, ..., 417n, and 419a, ..., 419n as shown in FIG. 10 are verified (Box 840). The programmed threshold voltage level for the select gate floating gate transistors MG0 must be greater than +2.0V as shown in FIG. 3f. If the select gate floating gate transistors MG0 and the NMOS flash floating gate transistors 585a, 585b, 585c, 585d, and 585e fail their verification (Box 840) they are reprogrammed.

At the completion of the programming of the select gate floating gate transistors MG0 and the block erase count register 417a, ..., 417n, and 419a, ..., 419n, the data is copied (Box 850) from the page of unselected blocks 412a, 412b, ..., 412n, and 414a, 414b, ..., 414n of the selected sector 410a, ..., 410n as indicated by the maximum count of the block erase count registers 417a, ..., 417n, and 419a, ..., 419n. The page is then reprogrammed (Box 855) to the page as indicated by the block erase count register 417a, ..., 417n, and 419a, ..., 419n and the page is verified (Box 860). If the page fails the programming the page is reprogrammed (Box 855) again. When the page passé the program verification (Box 860), a block counter is checked (Box 865) to insure that all the unselected blocks 412a, 412b, ..., 412n, and 414a, 414b, ..., 414n are refreshed and at the completion of the refreshing of the unselected block 412a, 412b, ..., 412n, and 414a, 414b, ..., 414n the nonvolatile memory device is designated as passing (Box 870) and considered operable.

Refer now to FIG. 16 for an explanation of the copy operation (850 of FIG. 15) employed in the refresh of the selected pages (word lines 432a, . . . , 432n) of the unselected blocks 412a, 412b, . . . , 412n, and 414a, 414b, . . . , 414n. As noted above, the selected word line WL 432S is divided into two half pages, the copy process provides a first copy operation 760 for a first half page and a second copy operation 775 for a second half page. The first copy operation 760 is accomplished on the even local bit line LBL[n] 465a, 465b, . . . , 465n and local source line LSL[N] 470a, 470b, 470n. The second copy operation 775 is accomplished on the odd local bit line LBL[n] 465a, 465b, . . . , 465n and local source line LSL[N] 470a, 470b, . . . , 470n.

Prior to executing the each of the copy operations 760 and 775, pre-charge operations 755 and 770 are executed. During the first pre-charge operation 755 between the between the time $\tau_1$ and time $\tau_2$, the selected word line WL 432S is set to the power supply voltage source VDD and the unselected word lines WL 432SU of the selected block is set to the first intermediate voltage (HV*), which is sufficiently large to turn on all the unselected NMOS floating gate transistors M0, . . . , Mn connected to the unselected word lines 432SU. The unselected word lines WL 432U of the unselected blocks are allowed to float. The selected block gate select lines 433S and the even bit line select line BLG[0] 485a is set to the power supply voltage source VDD. The odd bit line select lines BLG[1] 485b, source line select lines SLG[0] 490a and SLG[1] 490b, and the unselected Block gate select lines 433U are set the voltage level of the substrate voltage source VSS (0.0V). The global bit line GBL[n] 447 is set to the voltage level of the power supply voltage source VDD plus a threshold voltage level Vt of an NMOS transistor. The program select signal (PGM_SEL) 495, set signal 608, the global source lines 449 and the P-type well 215 is set to the substrate voltage source VSS (0.0V).

During the first copy operation 760 between the time $\tau_2$ and time $\tau_3$, the selected word line WL 432S is set to the voltage level of the lower boundary of the programmed threshold voltage Vt1L. The unselected word lines WL 432SU of the selected block remains set to the first intermediate voltage (HV*). The unselected word lines WL 432U of the unselected blocks remains floating. The selected block gate select lines 433S and the even bit line select line BLG[0] 485a remain set to the power supply voltage source VDD. The odd bit line select lines BLG[1] 485b, the even source line select lines SLG[0] 490a is set to the voltage level of the power supply voltage source VDD. The odd source select line SLG[1] 490b and the unselected Block gate select lines 433U remain set the voltage level of the substrate voltage source VSS (0.0V). The global bit line GBL[n] 447 is set to the voltage level of the power supply voltage source VDD minus a threshold voltage level Vt of an NMOS transistor (VDD−Vt). The program select signal (PGM_SEL) 495, set signal 608, the global source lines 449 and the P-type well 215 is set to the substrate voltage source VSS (0.0V). If the data of the selected NMOS floating gate transistors M0, . . . , Mn is a logical "0", the global bit line GBL[N] 447 remains at the voltage level of the power supply voltage source VDD minus the threshold voltage level Vt of an NMOS transistor (VDD−Vt). If the data of the selected NMOS floating gate transistors M0, . . . , Mn is for a logical "1", the voltage level of the global bit line GBL[N] 447 decreases. The program select signal (PGM_SEL) 495, copy signal 609, the global source lines 449 and the P-type well 215 remain set to the substrate voltage source VSS (0.0V). Near the end of the completion of the first copy operation 760, the copy signal 609 transitions from the voltage level of the substrate voltage source (0.0V) to the voltage level of the power supply voltage source VDD. The copy signal 609 allows the data to be captured in the high voltage latch 600 of FIG. 11.

During the second pre-charge operation 770 between the between the time $\tau_3$ and time $\tau_4$, the selected word line WL 432S is set to the power supply voltage source VDD and the unselected word lines WL 432SU of the selected block is set to the first intermediate voltage (HV). The unselected word lines WL 432U of the unselected blocks are allowed to float. The selected block gate select lines 433S and the even bit line select line BLG[1] 485b is set to the power supply voltage source VDD. The even bit line select lines BLG[0] 485a, source line select lines SLG[0] 490a and SLG[1] 490b, and the unselected Block gate select lines 433U are set the voltage level of the substrate voltage source VSS (0.0V). The global bit line GBL[n] 447 is set to the voltage level of the power supply voltage source VDD minus a threshold voltage level Vt of an NMOS transistor (VDD−Vt). The program select signal (PGM_SEL) 495, copy signal 609, the global source lines 449 and the P-type well 215 is set to the substrate voltage source VSS (0.0V).

During the second copy operation 775 between the time $\tau_4$ and time $\tau_5$, the selected word line WL 432S is set to the voltage level of substrate voltage source VSS (0.0V). The unselected word lines WL 432SU of the selected block remains set to the first intermediate voltage (HV*). The unselected word lines WL 432U of the unselected blocks remains floating. The selected block gate select lines 433S and the even bit line select line BLG[1] 485b remain set to the power supply voltage source VDD. The odd bit line select lines BLG[0] 485a and the odd source line select lines SLG[1] 490b are set to the voltage level of the power supply voltage source VDD. The even source select line SLG[0] 490a and the unselected Block gate select lines 433U remain set the voltage level of the substrate voltage source VSS (0.0V). The global bit line GBL[n] 447 is set to the voltage level of the power supply voltage source VDD less a threshold voltage level Vt of an NMOS transistor. The program select signal (PGM_SEL) 495, copy signal 609, the global source lines 449 and the P-type well 215 is set to the substrate voltage source VSS (0.0V). If the data of the selected NMOS floating gate transistors M0, . . . , Mn is a logical "0", the global bit line GBL[N] 447 remains at the voltage level of the power supply voltage source VDD minus the threshold voltage level Vt of an NMOS transistor (VDD−Vt). If the data of the selected NMOS floating gate transistors M0, . . . , Mn is a logical "1", the voltage level of the global bit line GBL[N] 447 decreases. The program select signal (PGM_SEL) 495, copy signal 609, the global source lines 449 and the P-type well 215 remain set to the substrate voltage source VSS (0.0V). Near the end of the completion of the first verify operation 760, the copy signal 609 transitions from the voltage level of the substrate voltage source (0.0V) to the voltage level of the power supply voltage source VDD. The copy signal 609 allows the data to be captured in the high voltage latch 600 of FIG. 11.

When at least one of the selected NMOS floating gate transistors M0, . . . , Mn has a threshold voltage level less than the lower boundary of the programmed threshold voltage Vt1L (Box 860 of FIG. 15), the pre-charged voltage of the power supply voltage source VDD less a threshold voltage level Vt of an NMOS transistor (VDD−Vt) at global bit line GBL[N] 447 would be discharged to 0V. If all programmed threshold voltage level Vt1 are above the lower boundary of the threshold value Vt1L, then the pre-charged voltage of the power supply voltage source VDD less a threshold voltage level Vt of an NMOS transistor (VDD−Vt) at global bit line GBL[N] 447 would stay at the voltage level of the power supply voltage source VDD less a threshold voltage level Vt of an NMOS transistor (VDD−Vt) so that the program 715 and the program verify 730 and 750 operations are successfully completed. Whether the threshold voltage Vt1 of the selected NMOS floating gate transistors M0, . . . , Mn are meeting the lower boundary of the threshold value Vt1L or not, it is tested by the SET signal 680, which is used to set high voltage latch 600 shown in FIG. 11. When the programmed threshold voltage Vt1 of the selected NMOS floating gate transistors M0, . . . , Mn is programmed above the lower boundary of the threshold Vt1L the sense amplifier node SA 620 of FIG. 11 is the voltage level of the power supply voltage source VDD, the NMOS transistors MN5 606 and NMOS transistor MN7 618 are both turned on and the high voltage latch 600 is set. As a result, the gate of the NMOS transistor MN3 634 would be low, and verify node PE_OK 636 would be high to indicate the completion of programming of the selected NMOS floating gate transistors M0, . . . , Mn. The data as stored in the high voltage latch 600 is then used for restoring the data to the selected word line 432a, . . . , 432n. In the first example above, the selected word line is word line seven (WL[7]) since the maximum count of the block erase count register 417a, . . . , 417n, and 419a, . . . , 419n in the example is seven.

Figure 17:
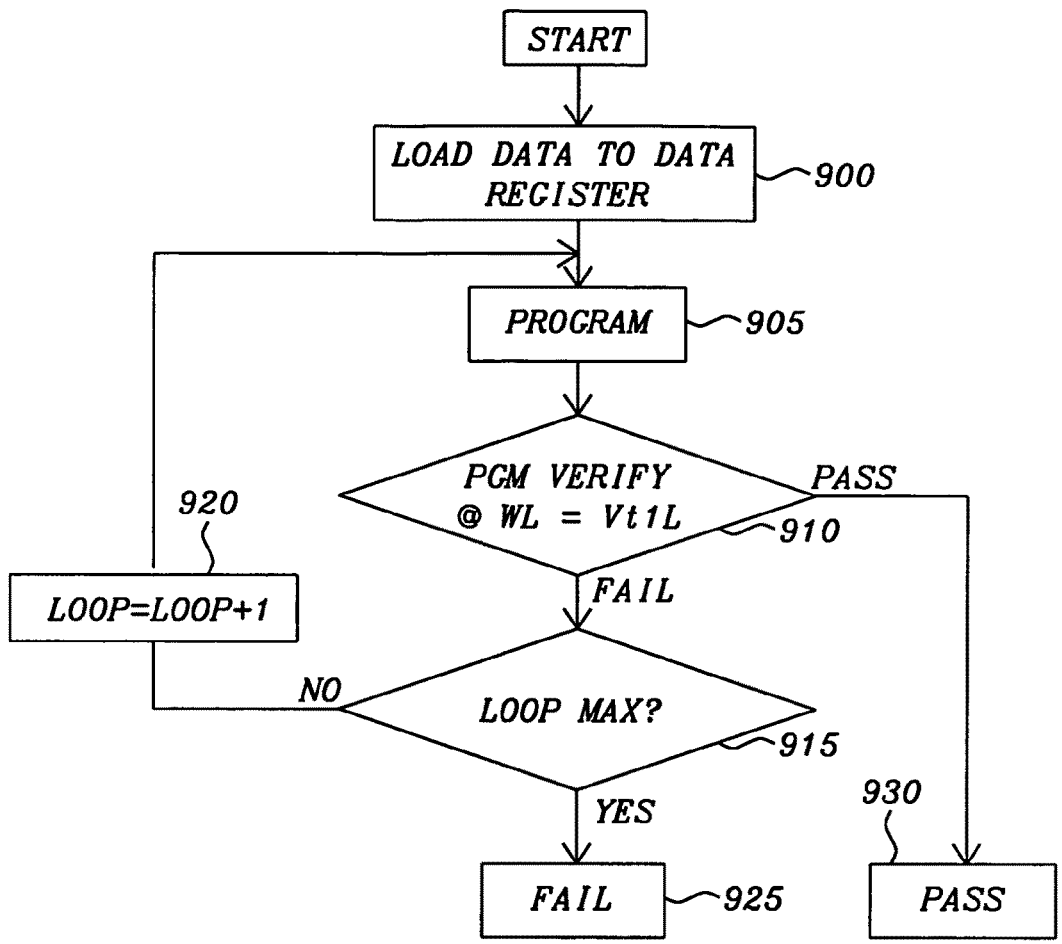
FIG. 17 is a flow chart of the method for programming a page of the nonvolatile memory device of FIG. 5.

FIG. 17 is flow chart of the method for programming a page of the nonvolatile memory device of FIG. 5. Referring to FIGS. 5, 6, 11, 14, and 17, the program operation begins by loading (Box 900) the data to be programmed to the register formed by the high voltage latches 600 of FIG. 11 in the data register and sense amplifier 447 of FIG. 5. The data is then programmed (Box 905) as described above in FIG. 14 to the selected NMOS floating gate transistors M0, . . . , Mn of the selected word line 432a, . . . , 432n. The programming of the selected NMOS floating gate transistors M0, . . . , Mn of the selected word line 432a, . . . , 432n is then verified (Box 910) according to the program verification 730 and 750 of FIG. 14. As noted in FIG. 14, since each global bit 447a, . . . , 447n is connected to a pair of local bit lines 465a, . . . , 465n, the program verification is executed in two operations. The first program verification 730 is for the even local bit lines 465a, . . . , 465n and the second verification operation 750 is for the odd local bit lines 465a, . . . , 465n. If the program verification fails, the operation fails a maximum number of tolerable program failures is compared (Box 915) to the program count of the present selected word line 432a, . . . , 432n. If the program count has not exceeded the maximum number of tolerable program failures, the program count is incremented (Box 920) and the selected NMOS floating gate transistors M0, . . . , Mn of the selected word line 432a, . . . , 432n are reprogrammed (Box 905). If the program (Box 905) fails and the program count exceeds (Box 915) the maximum number tolerable program failures, the nonvolatile memory device is deemed to have failed (Box 925) operation and is discarded.

When the program verification (Box 910) indicates that the programming of the selected NMOS floating gate transistors M0, . . . , Mn of the selected word line 432a, . . . , 432n is successful the nonvolatile memory device is deem to be operable (Box 930).

One of the key features of the nonvolatile memory device embodying the principles of this invention is a NAND series string of NMOS floating gate transistors optionally having a select gate floating gate transistor. The second key feature of the nonvolatile memory device is the placing of the source lines in parallel with the bit lines for each column of the NAND series strings of NMOS floating gate transistors. The parallel bit lines and source lines permit the currents for the reading, programming, and erasing of the NMOS floating gate transistors to be shared over the source lines to decrease noise and assist in the dissipation of heat. This permits the select gate floating gate transistor to be smaller approaching the size of the NMOS floating gate transistors and not have a concern with punch through with the high voltages placed on the bit lines. A third key feature is a row decoder having a charge pump to fully transfer the appropriate high voltages to the word lines and the gate select lines of each of the NAND series strings of NMOS floating gate transistors. A fourth key feature of the nonvolatile memory device embodying the principles of this invention is the circuits and method for refreshing the NAND series strings of NMOS floating gate transistors and the select gate floating gate transistor to eliminate the effects of program and erasing disturb due to the high voltage that the unselected NAND series strings of NMOS floating gate transistors are exposed during programming and erasing.

Figure 18A:
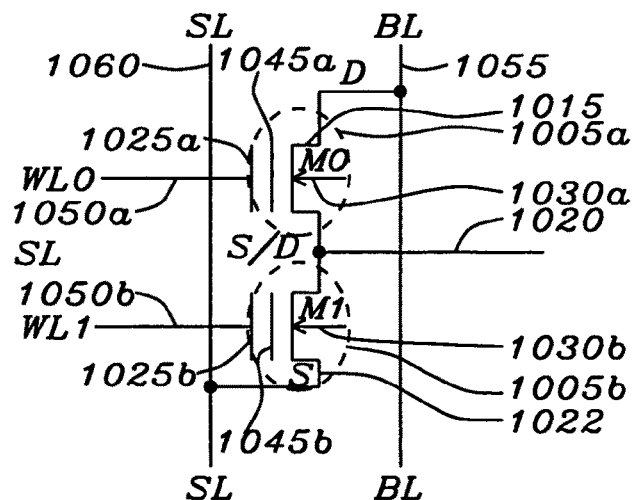
FIG. 18a is a schematic diagram of a NMOS NOR flash memory cell embodying the principles of the present invention.

FIG. 18a is a schematic diagram of a NMOS NOR flash memory cell 1000 embodying the principles of the present invention. FIGS. 18b-1 and 18c-1 are top plan views of implementations of a NMOS NOR flash memory cell 1000 embodying the principles of the present invention. FIGS. 18b-2 and 18c-2 are a cross sectional views of implementations of a NMOS NOR flash memory cell 1000 embodying the principles of the present invention. The floating-gate type NMOS NOR flash cell 1000 is formed in the top surface of a P-type substrate 1040. An N-type material is diffused into the surface of the P-type substrate 1040 to form a deep N-well 1035. A P-type material is then diffused into the surface of the deep N-well 1035 to form a P-well 1030 (commonly referred to as a triple P-well). The N-type material is then diffused into the surface of a P-type well 1030 to form the drain region (D) 1015a of the NMOS NAND-like flash floating-gate transistor 1005a, the source region of the NMOS NAND-like flash floating-gate transistor 1005b and the source/drain (S/D) 1020. The source/drain 1020 being the source region of the NMOS NAND-like flash floating-gate transistor 1005a and the drain of the NMOS NAND-like flash floating-gate transistors 1005b. A first polycrystalline silicon layer is formed above the bulk region of the P-type well 1030 between the drain region 1015a and the source region 1020 NMOS NAND-like flash floating-gate transistor 1005a and the drain region 1020 and the source region 1022 of the NMOS NAND-like flash floating-gate transistor 1005b to form the floating gates 1045a and 1045b. A second polycrystalline silicon layer is formed over the floating gates 1045a and 1045b to create the control gates (G) 1025a and 1025b of the NMOS NAND-like flash floating-gate transistors 1005a and 1005b. The source/drain region 1020 is formed as between the two adjacent second polycrystalline silicon layers of two control gates 1025a and 1025b of NMOS NAND-like flash floating-gate transistors 1005a and 1005b. The source/drain 1020 is commonly used in the NMOS NAND-like flash floating-gate transistors 1005a and 1005b to reduce the source line pitch.

The gate length of the NMOS NAND-like flash floating-gate transistors 1005a and 1005b is the channel region in the bulk region of P-type well 1030 between drain region 1015 and the source region 1020 of the NMOS NAND-like flash floating-gate transistor 1005a and the drain region 1020 and the source region 1022 of the NMOS NAND-like flash floating-gate transistors 1005a and 1005b. The NMOS NOR flash floating-gate transistor's 1005b channel width is determined by the width of the N-diffusion of the drain region 1015, the source region 1022 and the source/drain region 1020. The typical unit size of the two transistor NMOS NOR flash memory cell 1000 is from approximately $12\lambda^2$ to approximately $14\lambda^2$. Therefore the effective size for a single bit NOR cell is approximately $6\lambda^2$. The effective size ($6\lambda^2$) of a single bit NOR cell is slightly larger than a NAND cell size of the prior art. However, the effective size of a single bit NOR cell is much smaller than the NOR cell size ($10\lambda^2$) of the prior art for a semiconductor manufacturing process above 50 nm. The NOR cell structure of the prior size is projected to increase to $15\lambda^2$ due to the scalability issues in semiconductor manufacturing process below 50 nm. The effective single bit/single transistor size of the NMOS NOR flash memory cell 1000 remains constant an effective cell size of approximately $6\lambda^2$. The constant cell sized is a result of the scalability is identical to that of the NMOS NAND-like flash memory cell of the prior art.

The floating-gate layers 1045*a* and 1045*b* each respectively store electron charges to modify the threshold voltage of the NMOS NAND-like flash floating-gate transistors 1005*a* and 1005*b*. In all operations such as read, program and erase, the P-type substrate 1040 is always connected to a ground reference voltage source (GND). The deep N-well 1035 is connected to the power supply voltage source (VDD) in read and program operations but is connected to a voltage level of approximately +20V in a Fowler-Nordheim channel erase operation. In present designs of NMOS NOR flash memory cell 1000, the power supply voltage source is either 1.8V or 3.0V. Like the deep N-well bias conditions, the triple P-type well 1030 is connected to the ground reference voltage in normal read and program operations but is connected to around +20V in FN-channel erase operation.

In an array of NMOS NOR flash memory cell 1000, the NMOS NAND-like flash floating-gate transistors 1005*a* and 1005*b* are arranged in rows and columns. The second polycrystalline silicon layer 1025 that is the control gate of the NMOS NAND-like flash floating-gate transistors 1005 is extended to form a word-line that connects to each of the NMOS NAND-like flash floating-gate transistors 1005 on a row of the array.

A tunnel oxide is formed on top of the channel region 1032*a* and 1032*b* between the drain region 1015 and the source region 1020 of the NMOS NAND-like flash floating-gate transistor 1005*a* and the drain region 1020 and the source region 1022 of the NMOS NAND flash floating-gate transistor 1005*b* and beneath the floating-gates 1045*a* and 1045*b*. The thickness of the tunnel oxide typically 100 Å. The tunnel oxide is the layer through which the electron charges pass during the Fowler-Nordheim channel tunneling programming and erasing. In a traditional NOR operation, Fowler-Nordheim tunnel erasing expels stored electrons from the floating-gates 1045*a* and 1045*b* through the tunnel oxide to cell's channel regions 1032*a* and 1032*b* into the triple P-type substrate 1030.

After an erase operation, fewer electron charges are stored in the floating-gates 1045*a* and 1045*b* that results in a decrease in a first threshold voltage level (Vt0) of the NMOS NAND-like flash floating-gate transistors 1005*a* and 1005*b*. In contrast, in a Fowler-Nordheim program operation, electrons are attracted into floating-gates 1045*a* and 1045*b* so that a second threshold voltage level (Vt1) of the NMOS NAND-like flash floating-gate transistors 1005*a* and 1005*b* is set to the relatively high voltage.

FIGS. 19*a*-19*d* are graphs of threshold voltage levels of a variety of implementations of various embodiments of a single transistor of the two transistor floating-gate NMOS NAND-like flash NOR cell of the present invention. FIG. 19*a* illustrates the voltage thresholds levels for one implementation of programming and erasing of the NMOS NAND-like flash floating-gate transistors 1005*a* and 1005*b* of FIGS. 18*a*, 18*b*-1, 18*b*-2, 18*c*-1, and 18*c*-2. In this implementation there is one programmed positive threshold voltage level (Vt1) with a narrow distribution representing a logical "0" datum and one programmed negative threshold voltage level (Vt0) also with a narrow distribution representing a logical "1" datum. Both Vt0 and Vt1 are programmed states, having preferable threshold voltage levels with narrow distributions. In the erasing of NMOS NAND-like flash floating-gate transistors 1005*a* and 1005*b*, a +20V is applied to the triple P-well 1030 into which the NMOS NAND-like flash floating-gate transistors 1005*a* and 1005*b* are formed and a ground reference voltage level (0V) is applied to the selected control gate 1025*a* and 1025*b* on the selected NMOS NAND-like flash floating-gate transistors 1005*a* and 1005*b* to establish a 20V voltage drop between the selected control gate 1025*a* and 1025*b* and bulk 1032*a* and 1032*b* of the selected NMOS NAND-like flash floating-gate transistors 1005*a* and 1005*b* to establish a negative Fowler-Nordheim channel tunneling effect. Since the erase operation in an NOR flash nonvolatile memory array is conventionally performed in units of 64 KB on the selected NOR flash nonvolatile memory array block typically, the negative threshold voltage level (Vt0) is considered to be the collective erase state.

In a NAND flash nonvolatile memory array of the prior art, the threshold voltage level (Vt0) has a wide voltage distribution. Conventionally, the negative threshold voltage level (Vt0) has a range of approximately 2.0V, varying from −2.0V to about 0.0V. The threshold voltage level (Vt1) has a programmed voltage level of approximately +3.0V, varying from +2.75 to about +3.25V. The positive threshold voltage level (Vt1) does not need a narrow 0.5V distribution in circuit operation as long as the positive threshold voltage level (Vt1) is kept less than the pass voltage of 6.0V for the unselected word lines in the selected NAND flash nonvolatile memory array block during a page program operation.

Unlike the slow, synchronous, serial-read specification for a 512-bit page of the NAND flash nonvolatile memory array is about 20 μs, the targeted fast random, asynchronous read speed of NOR flash nonvolatile memory device is less than 100 ns. In view of the above speed requirements for a two-bit/two transistor of a NMOS NOR flash memory cell 1000. With NMOS NAND-like flash floating-gate transistors 1005*a* and 1005*b* connected in series, the most preferred threshold voltage level distribution for both the negative threshold voltage level (Vt0) and the positive threshold voltage level (Vt1) is within approximately 0.5V. The negative threshold voltage level (Vt0) having a nominal voltage level of approximately −0.5V and the positive threshold voltage level (Vt1) having a nominal voltage level of approximately +3.0V. In order to achieve a narrow threshold voltage level distribution for the negative threshold voltage level (Vt0) and positive threshold voltage level (Vt1), the negative threshold voltage level (Vt0) and positive threshold voltage level (Vt1) are achieved by using a bit-by-bit positive Fowler-Nordheim channel program process. The negative threshold voltage level (Vt0) state for the NMOS NAND-like flash floating-gate transistors 1005*a* and 1005*b* is performed in two steps. The first step is performed by a negative Fowler-Nordheim channel collective erase in a page or a block with a wider negative threshold voltage level (Vt0) distribution and the second step positive bit-by-bit Fowler-Nordheim channel program to obtain a narrow negative threshold voltage level (Vt0). The positive threshold voltage level (Vt1) of the selected NMOS NAND-like flash floating-gate transistors 1005*a* and 1005*b* can be narrowed down in a single step by gradually increasing the program voltage at the selected control gate 1025a and 1025b incrementally from approximately +15.0V to approximately +20V or greater depending on the manufacturing integrated circuit process. Both the negative threshold voltage level (Vt0) and the positive threshold voltage level (Vt1) are the narrow programmed state having a distribution of approximately 0.5V for the NMOS NAND-like flash floating-gate transistors 1005a and 1005b.

FIG. 19b illustrates the voltage thresholds levels for a second implementation of programming and erasing of NMOS NAND-like flash floating-gate transistors 1005a and 1005b of FIGS. 18a, 18b-1, 18b-2, 18c-1, and 18c-2. In this single level cell (SLC) implementation, the first threshold voltage level (Vt0) and the second threshold voltage level (Vt1) are all set to be positive with threshold voltage level distribution of approximately 0.5V. The positive first threshold voltage level (Vt0) is also done in 2-step with a first step of negative Fowler-Nordheim channel collective page-erase and followed by a second step of a positive Fowler-Nordheim channel bit-by-bit program as explained above for FIG. 19a. The first threshold voltage level (Vt0) and second threshold voltage level (Vt1) are both programmed states as opposed to being an erased and program state.

The first threshold voltage level (Vt0) is set to be positive with a nominal value of 0.5V with narrow distribution of 0.5V or from approximately +0.25V to approximately +0.75V for storing a logical "1" datum. The second threshold voltage level (Vt1) is a positive state with a nominal value of 3.0V having the narrow distribution of from approximately +2.75V to approximately +3.25V for storing a logical "0" datum. In some embodiments of the NOR flash nonvolatile memory device a wider threshold voltage level distribution from +2.5V to +3.5V in some applications where a speed trade-off is required.

FIG. 19c illustrates the voltage thresholds levels for still another implementation of programming and erasing of NMOS NAND-like flash floating-gate transistors 1005a and 1005b of FIGS. 18a, 18b-1, 18b-2, 18c-1, and 18c-2. This implementation is for a multi-level cell (MLC) where all four threshold voltage levels (Vt0, Vt1, Vt2 and Vt3), regardless positive or negative, have a narrow distribution of approximately 0.5V. In this implementation the first threshold voltage level (VT0) is negative and is also a programmed state by using the two step write method as explained above. That means the first threshold voltage level (VT0) has a nominal threshold voltage level of approximately −0.5V and distribution varying from approximately −0.25V to approximately −0.75V for storing a logical "11" data. The second threshold voltage level (VT1) is the second data state stored in the NMOS NAND-like flash floating-gate transistors 1005a and 1005b and has a nominal voltage level of approximately +1.0 v. The second threshold voltage level (VT1) has a distribution that varies from approximately +0.75V to approximately +1.25V to store a logical "10" data. The third threshold voltage level (Vt2) is the third data state of the NMOS NAND-like flash floating-gate transistors 1005a and 1005b with a nominal voltage level of approximately +2.0V. The third threshold voltage level (Vt2) has a distribution that varies from approximately +1.75V to approximately +2.25V to store a logical "01" data. The fourth threshold voltage level (Vt3) is the fourth data state of the NMOS NAND-like flash floating-gate transistors 1005a and 1005b and has nominal voltage level of approximately +3.0V. The fourth threshold voltage level (Vt3) has a distribution that varies from approximately +2.75V to approximately +3.25V to store a logical "00" data.

Further, FIG. 19d illustrates the voltage thresholds levels for another implementation of programming and erasing of NMOS flash floating-gate transistors 1005a and 1005b of FIGS. 18a, 18b-1, 18b-2, 18c-1, and 18c-2. The first threshold voltage level (VT0), second threshold voltage level (VT1), third threshold voltage level (Vt2), and fourth threshold voltage level (Vt3) have relatively narrow distributions of the threshold voltage levels that are all positive. In this implementation, the first threshold voltage level (VT0) has a median voltage level of approximately +1.0V for storing "11". The voltage distribution of the first threshold voltage level (VT0) is from +0.75V-+1.25V. The second threshold voltage level (VT1) has a median voltage level of approximately +2.0V to store a logical "10" data. The second threshold voltage level (VT1) has a distribution that varies from approximately +1.75V to approximately +2.25V. The third threshold voltage level (Vt2) has a median voltage level of approximately +3.0V to store a logical "01" data. The third threshold voltage level (Vt2) has a distribution that varies from approximately +2.75V to approximately +3.25V. The fourth threshold voltage level (Vt3) has a median voltage level of approximately +4.0V to store a logical "00" data. The fourth threshold voltage level (Vt3) has a distribution that varies from approximately +3.75V to approximately +4.25V.

Figure 20A:
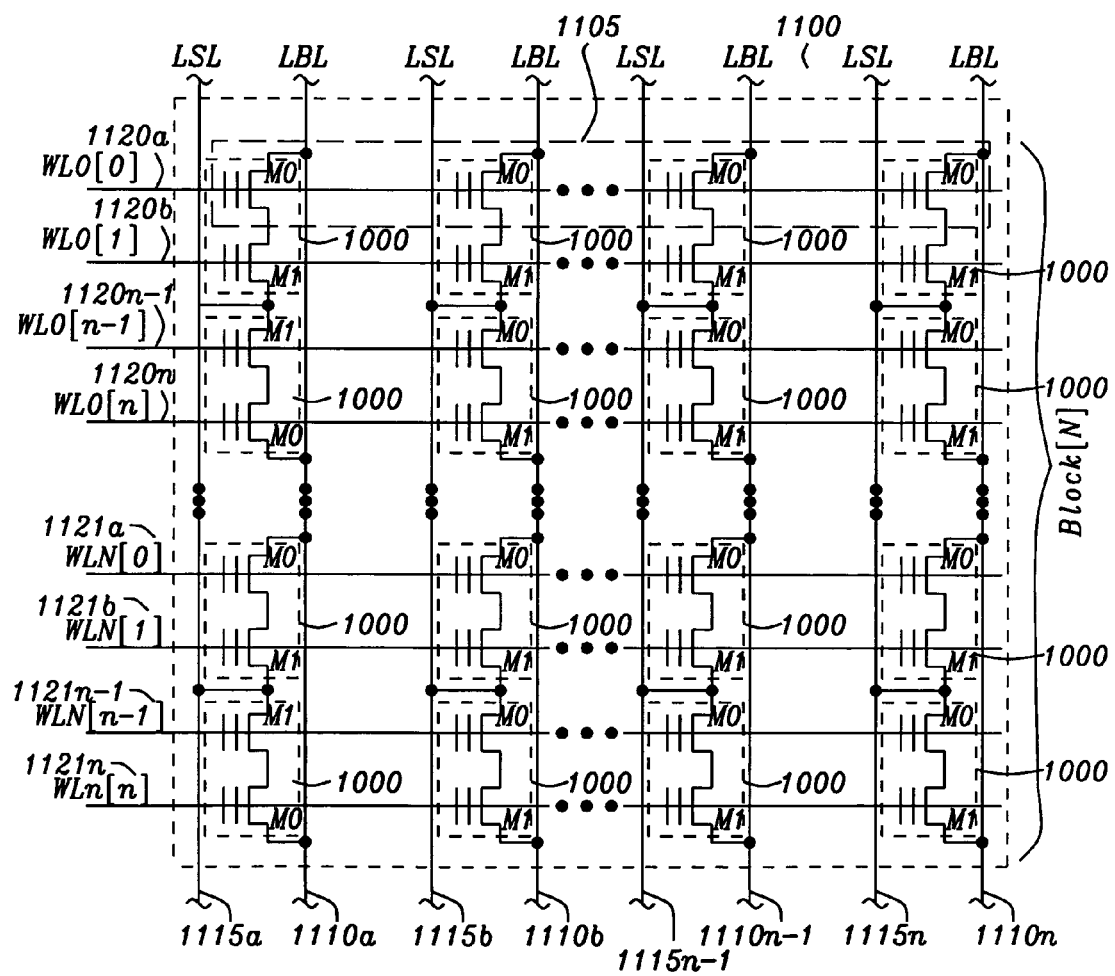
FIGS. 20a and 20b are a schematic diagram illustrating an array of two transistor floating-gate NAND based NMOS NOR flash cells embodying the principles of the present invention.
Figure 20B:
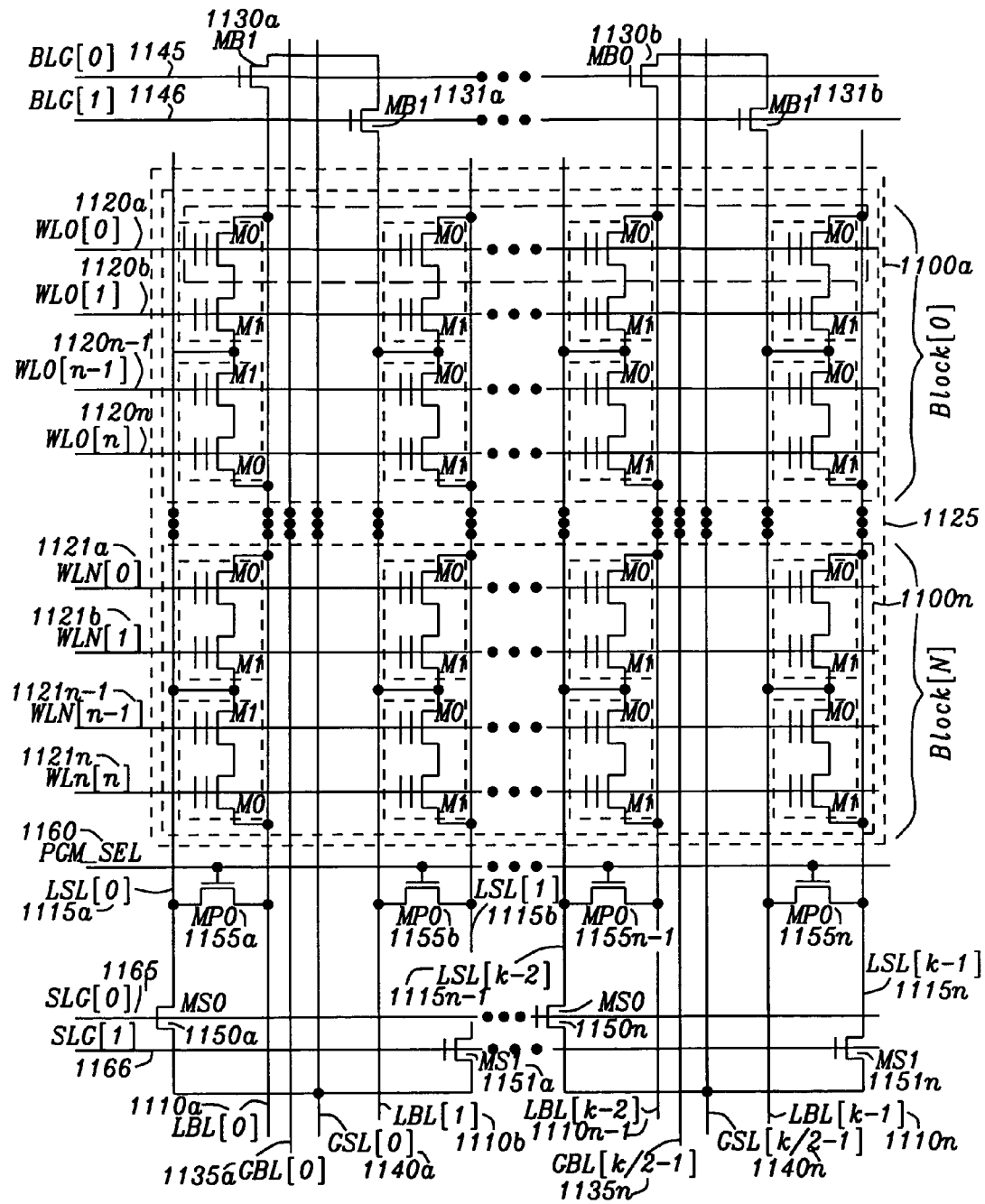

FIG. 20a is a schematic diagram of a sub-array or block 1100 of the NOR flash nonvolatile memory cells 1000 incorporating various embodiments of the present invention. FIG. 20b is a schematic diagram illustrating a grouping of sub-arrays or block of the two transistor floating-gate NAND-like NMOS NOR flash cells embodying the principles of the present invention.

Referring to FIG. 20a, the NOR flash nonvolatile memory block 1100 includes an array of two transistor floating-gate NMOS NOR flash cells 1000 arranged in a matrix of rows and columns. Each of the two transistor floating-gate NMOS NOR flash cells 1000 includes two NMOS NAND-like flash floating-gate transistors M0 and M1 that are structured and operate as the NMOS NAND-like flash floating-gate transistors 1005a and 1005b of FIGS. 18a, 18b-1, 18b-2, 18c-1, and 18c-2. The drain of the floating-gate transistors M0 is connected to one of the local bit lines 1110a, 1110b, ..., 1110n−1, and 1110n. The source of the floating-gate transistor M1 is connected of one of the local source lines 1115a, 1115b, ..., 1115n−1, and 1115n. The source of the NMOS NAND-like flash floating-gate transistor M0 is connected to the drain of the NMOS NOR flash floating-gate transistor M1. Each of the control gates of the NMOS NAND-like flash floating-gate transistors M0 and M1 of the two transistor floating-gate NMOS NOR flash cells 1000 on each row of the sub-array or block 1100 is connected to one of the word lines 1120a, 1120b, ..., 1120n.

Referring now to FIG. 20b, a grouping of the blocks 1100a, ..., 110n of FIG. 20a are organized into sectors 1125. A sector 1125 is the grouping of sub-arrays or blocks 1100a, ..., 1110n formed in a common P-type well or TPW. The drains of the even local bit lines 1110a, 1110b, ..., 1110n−1 are connected to the sources of the even bit line gating transistors 1130a, ..., 1130n and the drains of the odd local bit lines 1110a, 1110b, ..., 1110n−1 are connected to the sources of the odd bit line gating transistors 1131a, ..., 1131n. The drains of the bit line gating transistors 1130a, ..., 1130n and the 1131a, ..., 1131n are connected together and to the global bit lines 1135a, ..., 1135n. The gates of the bit line gating transistors 1130a, ..., 1130n and 1131a, ..., 1131n are connected to the bit line gating signals 1145 and 1146.

The even local source lines 1115a, 1115b, ..., 1115n−1 are connected to the sources of the even source line gating transistors 1150a, ..., 1150n and the odd local source lines

1115*a*, 1115*b*, . . . , 1115*n*−1 are connected to the sources of the odd source line gating transistors 1151*a*, . . . , 1151*n*. The drains of the source line gating transistors 1150*a*, . . . , 1150*n* and the 1151*a*, . . . , 1151*n* are connected together and to the global source lines 1140*a*, . . . , 1140*n*. The gates of the source line gating transistors 1150*a*, . . . , 1150*n* and 1151*a*, . . . , 1151*n* are connected to the source line gating signals 1165 and 1166.

Each of the local bit lines 1110*a*, 1110*b*, 1110*n* are connected to their associated local source lines 1115*a*, 1115*b*, . . . , 1115*n* through the pass transistors 1155*a*, 1155*b*, . . . , 1155*n*. The gates of the pass transistors 1155*a*, 1155*b*, . . . , 1155*n* are connected to the program select signal 1160 to bring the local bit line 1110*a*, 1110*b*, 1110*n* and the local source lines 1115*a*, 1115*b*, . . . , 1115*n* to an equal potential voltage level during a program operation.

Figure 21:
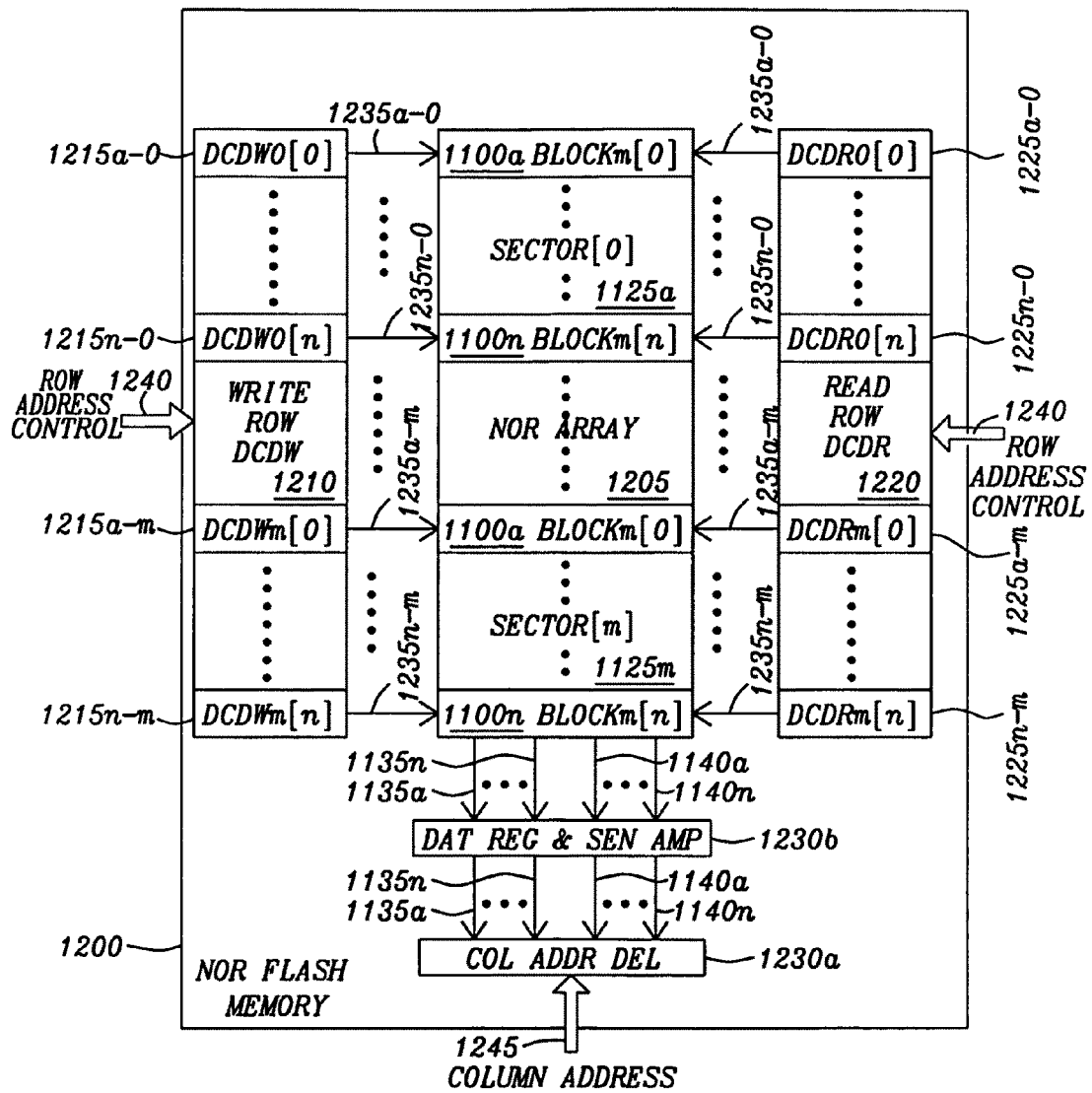
FIG. 21 is a block diagram of a nonvolatile memory device having an array of two transistor floating-gate NAND based NMOS NOR flash cells embodying the principles of the present invention.

FIG. 21 is a block diagram of a nonvolatile memory device 1200 having an array of two transistor floating-gate NAND-like NMOS NOR flash cells 1000 embodying the principles of the present invention. The nonvolatile memory device 1200 has an array 1205 of sectors 1125*a*, 1125*n* of the blocks 1100*a*, . . . , 1110*n*. The sectors 1125*a*, 1125*n* and the blocks are structured as described FIGS. 20*a* and 20*b*.

The array 1205 communicates with the write row decoder 1210 through the groups of word lines 1235*a*-0, 1235*a*-*n*, 1235*a*-*m*, 1235*n*-*m*. The groups of word lines 1235*a*-0, 1235*a*-*n*, 1235*a*-*m*, 1235*n*-*m* each consists of the word lines word lines 1120*a*, 1120*b*, . . . , 1120*n* of FIG. 20*a* and are connected to the rows of the NMOS NAND-like flash floating-gate transistors M0 and M1 of FIG. 20*a* to receive the appropriate control signals for programming selected pages (1105 of FIG. 20*a*) of the array 1205. Similarly, the array 1205 communicates with the read row decoder 1220 through the groups of word lines 1235*a*-0, 1235*a*-*n*, 1235*a*-*m*, 1235*n*-*m* to receive the appropriate control signals for reading selected pages (1105 of FIG. 20*a*) of the array 1205. The array 1205 communicates with the column address decode circuit 1230 through the global bit lines 1135*a*, . . . , 1135*n* and the global source lines 1140*a*, . . . , 1140*n* to transmit and receive the data and control signals for reading, programming, and erasing selected sections (blocks 1100*a*, . . . , 1110*n* or pages 1105) of the array 1205. The row address and control signals 1240 are applied to the write row decoder 1210 and the read row decoder 1220 provide the location and the operation to be executed on a selected row(s) or page(s) of the array of the two transistor floating-gate NAND based NMOS NOR flash cells 1000. The operations include the read, program and erase for the selected row(s) or page(s).

The write row decoder 1210 includes write decoder driver circuits 1215*a*-0, . . . , 1215*a*-*n*, . . . , 1215*a*-*m*, . . . , 1215*n*-*m* that communicates with each of the blocks 1100*a*, . . . , 1110*n* in each of the sectors 1125*a*, . . . , 1125*m* through the word lines 1235*a*-0, 1235*a*-*n*, 1235*a*-*m*, 1235*n*-*m*. The read row decoder 1210*b* includes read decoder driver circuits 1225*a*-0, 1225*a*-*n*, 1225*a*-*m*, 1225*n*-*m* that communicates with each of the blocks 1100*a*, . . . , 1110*n* in each of the sectors 1125*a*, . . . , 1125*m*.

The write row decoder 1210 or the read row decoder 1220 receive a row address 1240, decodes the address 1240, and from the decoded address 1240 selects which of the sectors 1125*a*, . . . , 1125*m* are being accessed. The column address decoder 1230*a* receives and decodes the column address 1245 to activate the appropriate bit lines 1135*a*, . . . , 1135*n* and the appropriate source lines 1140, . . . , 1140*n* for operating a selected sector 1125*a*, . . . , 1125*n*. The appropriate bit lines 1135*a*, . . . , 1135*n* and the appropriate source lines 1140*a*, . . . , 1140*n* are further connected to the data register and sense amplifier 1230*b*. The data register and sense amplifier 1230*b* (similar to the circuit 435 of FIG. 11) receives the data signals through the bit lines 1135*a*, . . . , 1135*n* and the source lines 1140*a*, . . . , 1140*n* from the selected sector 1125*a*, . . . , 1125*n* and senses and holds the data from the data signal for a read operation. In a program operation, the data is transferred from the data register and sense amplifier 1230*b* through the bit lines 1135*a*, . . . , 1135*n* and the source lines 1140*a*, . . . , 1140*n* to the selected sector 1125*a*, . . . , 1125*n*.

Figure 22:
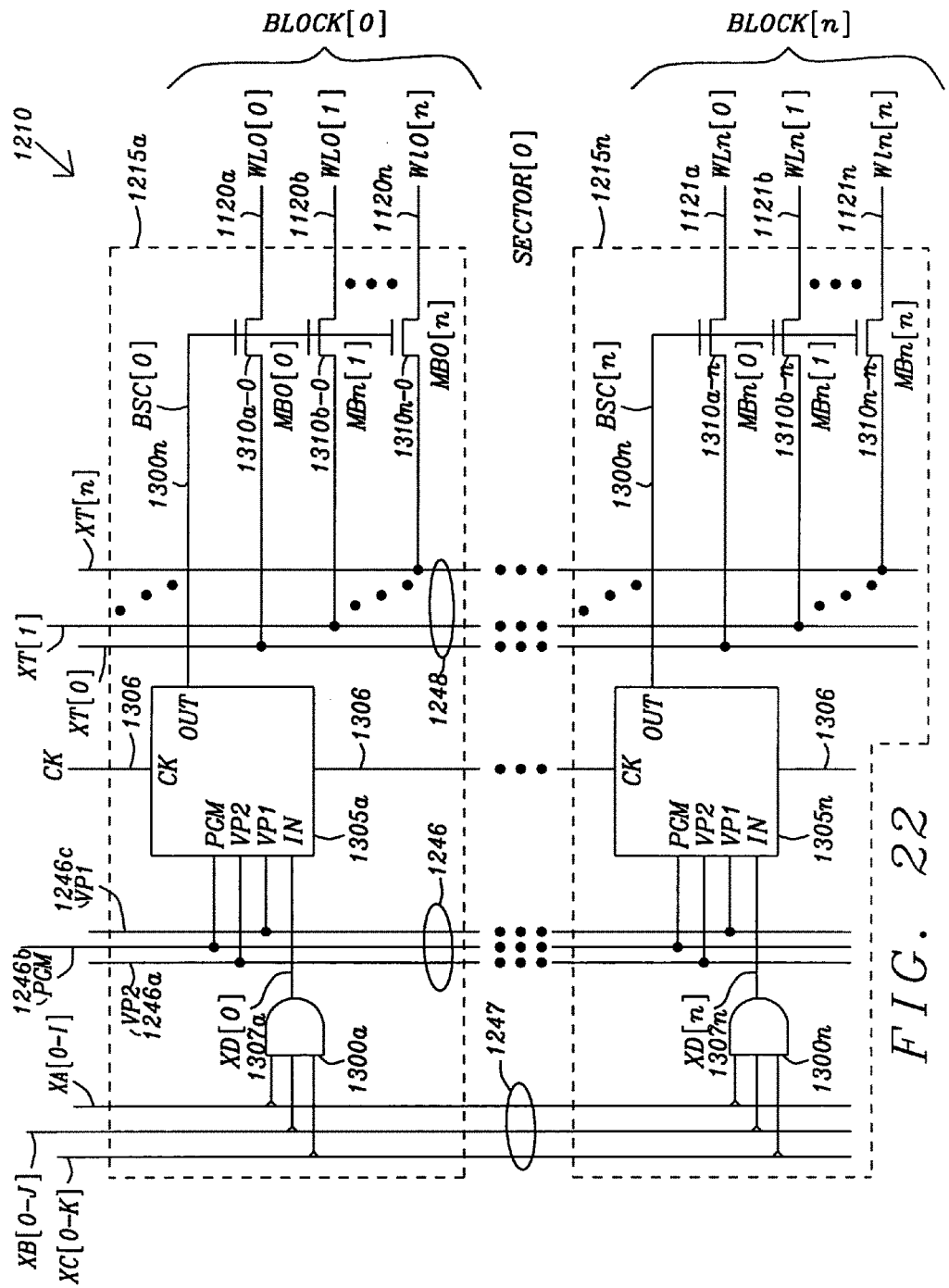
FIG. 22 is a schematic diagram of a block write row decoder of the nonvolatile memory device of FIG. 21 embodying the principles of the present invention.

FIG. 22 is a schematic diagram of a block write row decoder of the nonvolatile memory device of FIG. 21 embodying the principles of the present invention. Refer now to FIG. 22 for a discussion of the structure and operation of the write decoder driver circuits 1215*a*, . . . , 1215*n* of the write row decoder 1210. The block address portion 1247 of the row address 1240 of FIG. 21 is the input to a select logic gates 1300*a*, . . . , 1300*n* (an AND gate in this embodiment) for selecting the appropriate write decoder driver circuits 1215*a*, . . . , 1215*n* to condition a selected block 1100*a*, . . . , 1100*n*, of the selected sector 1235*a*, . . . , 1235*m* for programming.

The block selection output 1307*a*, 1307*n* of the select logic gate 1300*a*, . . . , 1300*n* is an input signal to a charge pump circuit 1305*a*, . . . , 1305*n*. The charge pump circuits 1305*a*, . . . , 1305*n* generate a high voltage level necessary for selecting a block for reading, programming, or erasing. The command signals 1246 are the inputs to the charge pump circuits 1305*a*, . . . , 1305*n* and provide the program command 1246*b* and the pass voltage levels 1246*a* and 1246*d*. The pass voltage levels 1246*a* and 1246*d* are transferred to the output 1320*a*, . . . , 1320*n* of the charge pump circuits 1305*a*, . . . , 1305*n*. The output 1320*a*, . . . , 1320*n* of the charge pump circuits 1305*a*, . . . , 1305*n* are connected to the block select pass transistors and the word line select transistors 1310*a*-0, . . . , 1310*n*-0 and 1310*a*-*n*, . . . , 1310*n*-*m*. The output 1320*a*, . . . , 1320*n* of the charge pump circuits 1305*a*, . . . , 1305*n* must have sufficient amplitude to fully pass the voltage levels of the page address portion 1248 of the address 1245 to the word lines 1235*a*-0, 1235*a*-*n*, 1235*a*-*m*, 1235*n*-*m*.

Figure 23:
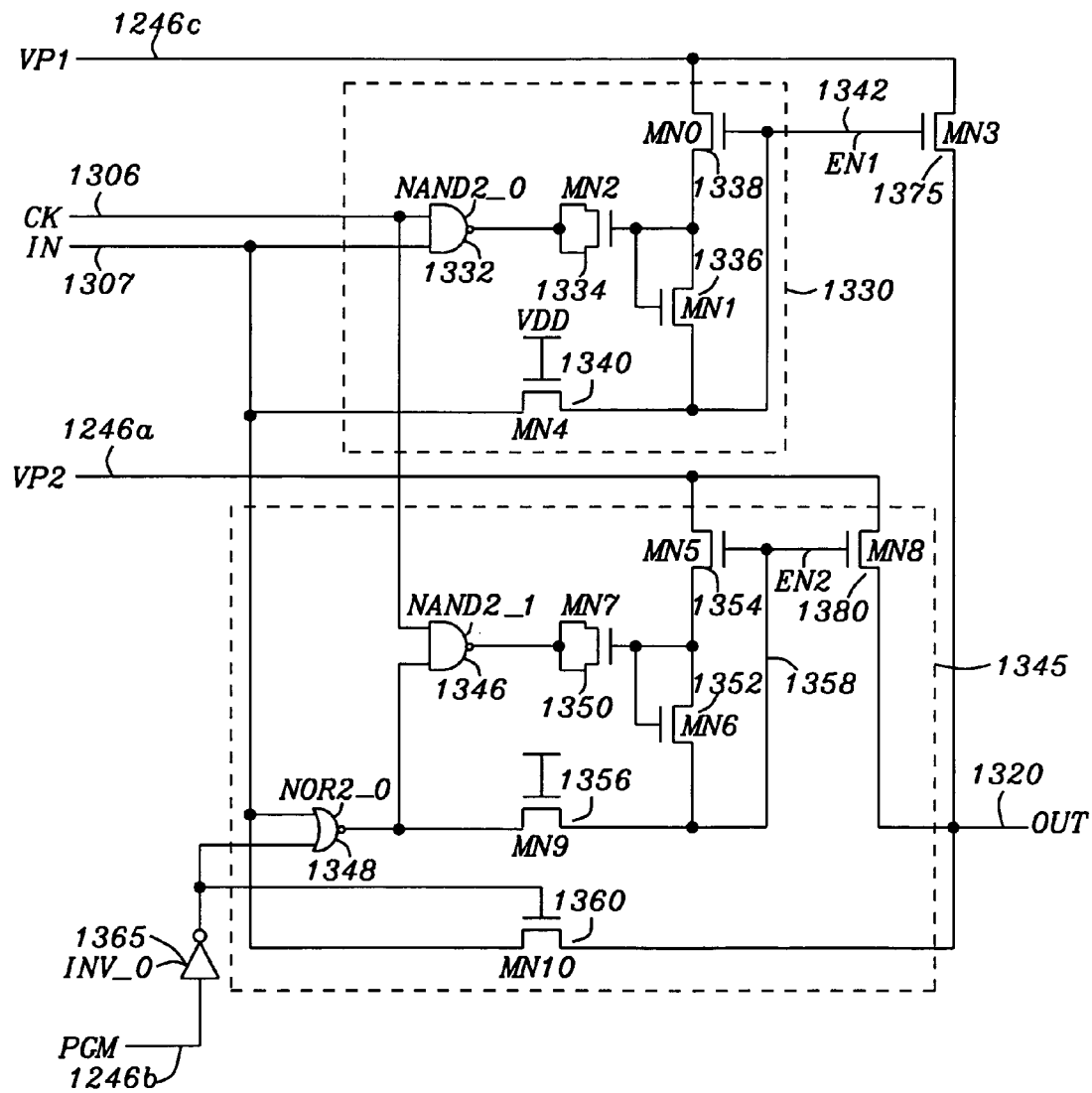
FIG. 23 is a schematic diagram of a charge pump circuit of FIG. 22 embodying the principles of the present invention.

FIG. 23 is a schematic diagram of a charge pump circuit of FIG. 22. Charge pump circuit 1305 includes two charge-pump sub-circuits 1330 and 1345. The first charge-pump sub-circuit 1330 has a gating logic circuit 1332 (a NAND gate in this embodiment) that is active when the select input signal 1307 is active and changes state as the clock 1306 changes state. The first coupling capacitor 1334, the first high voltage NMOS diode 1336, the high voltage gating transistors 1338 and 1375 transfer the first high voltage power supply level 1246*c* to the output node 1320 during a read operation. During the read operation, the first enable signal 1342 is pumped by the first charge-pump sub-circuit to a voltage level equal to the first high voltage power supply level 1246*c* plus the voltage threshold level of the output transistor 1375 (VP1+Vt). The NMOS transistor 1340 has its drain connected to the select input terminal 1307, it source connected to the first enable signal 1342, and it gate connected to the power supply voltage source VDD. The NMOS transistor 1340 is a high voltage devices used to isolate the pumped voltage levels at the first enable signal 1342 from the low voltage devices at the select input terminal 1307. When the select input terminal 1307 is set to the voltage level of the power supply voltage source VDD, the first charge-pump sub-circuit is enabled to pump the first enable signal 1342 to a voltage level equal to the first high voltage power supply level 1246*c* plus the voltage threshold level of the output transistor 1375 (VP1+Vt).

The second charge-pump sub-circuit 1345 has second logic gate 1346 (a NAND gate in this embodiment) that is activated based on the output of a third logic gate 1348 (a NOR gate in this embodiment). The inputs of the third logic gate 1346 are the input select signal 1307 and the inversion of the program command signal 1246*b* through the inverter gate 1365. The second high voltage coupling capacitor, the second high voltage NMOS diode 1352, and the gating transistors 1354 act as a charge pump to generate a sufficiently high voltage to an enable node EN2 1358 such that the output gating transistor 1380 transfers a second high voltage power supply level 1246*a* to the output node 1320.

The drain of the high voltage transistor 1360 is connected to the output of the logic gate 1348. Gate of the high voltage transistor 1360 is connected to the power supply voltage source VDD. The source of the high voltage transistor 1360 is connected to the enable node EN2 1358. During the program operation, the program signal 1246*b* is active and the output of the logic gate 1348 is the input select signal 1307. If the block is selected and the input select signal 1307 is a logic "1", the output of the logic gate 1248 is a logic "0" and the logic gate 1346 is disable, thus disabling the second charge pump 1345. If the block is not selected and the input select signal 1307 is a logic "0", the output of the logic gate 1346 is activated to pass the clock signal 1306 to activate the charge pump 1345 to pass the intermediate program inhibit voltage +5.0V to the output node 1320. If the program signal 1246*b* is inactive, the logic gate 1348 is set to a logic level that deactivates the logic gate 1346 to deactivate the second charge pump 1345.

The NMOS transistor 1356 has its drain connected to the output of the logic gate 1348, it source connected to the second enable signal 1358, and it gate connected to the power supply voltage source VDD. The NMOS transistor 1356 is a high voltage device used to isolate the pumped voltage levels at the second enable signal 1358 from the low voltage devices at the output of the logic gate 1348. When the output of the logic gate 1348 is set to the voltage level of the power supply voltage source VDD, the second charge-pump sub-circuit 1345 is enabled to pump the second enable signal 1358 to a voltage level equal to the high voltage level HV* of approximately +6.0V.

Figure 24:
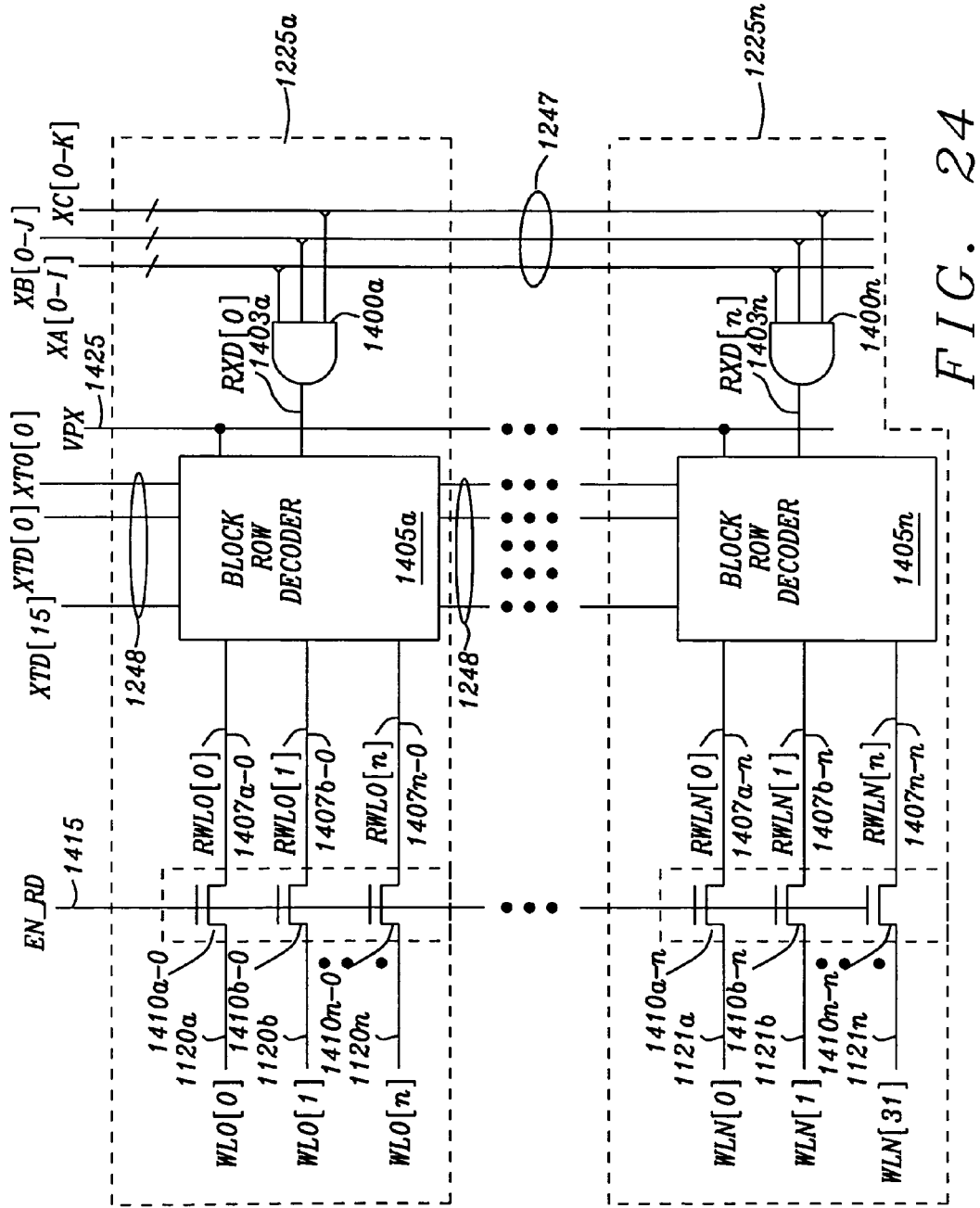
FIG. 24 is a schematic diagram of a block read row decoder of the nonvolatile memory device of FIG. 21 embodying the principles of the present invention.

FIG. 24 is a schematic diagram of a block read row decoder of the nonvolatile memory device of FIG. 21. Each row read decoder 1225*a*, . . . , 1225*n* has three stages—a block selector formed of the logic gates 1400*a*, . . . , 1400*n*, a block row decoder 1405, . . . , 1405*n*, and pass transistors 1410*a*-0, . . . , 1410*a*-*n*, . . . , 1410*a*-*m*, . . . , 1410*n*-*m* which when activated transfer the correct voltage level to the word lines 1120*a*, 1120*b*, . . . , 1120*n* or 1121*a*, 1121*b*, . . . , 1121*n* of the selected block.

The block read row decoder 1405*a*, . . . , 1405*n* receives the block selection address portion 1247 of the address and control signals 1240 of FIG. 21. The block selector has the logic gates 1400*a*, . . . , 1400*n* (AND circuits in this embodiment) that activate when the logical levels of the block selection address portion 1247 indicate a selected block is to be read. The block selection output 1403*a*, . . . , 1403*n* is the input to the block read row decoder 1405*a*, 1405*n* indicating that the block is selected for reading. The page selection address portion 1248 of the address and control signals 1240 are decoded and the voltage levels of the page selection address portion 1248 are transferred to the selected output 1407*a*-0, . . . , 1407*n*-0, . . . , 1407*a*-*m*, . . . , 1407*n*-*m*. Unlike the local charge pump circuit 1305*a*, . . . , 1305*n* for page selection of FIG. 22, the block read row decoder 1405*a*, . . . , 1405*n* does not require the charge pump for read operations. The transistors employed in the block read row decoder 1405*a*, . . . , 1405*n* are medium-high voltage (MHV) PMOS and NMOS transistors operable at voltage levels of approximately +6.0V during a read operation.

The block pass-transistors 1410*a*-0, . . . , 1410*a*-*n*, . . . , 1410*a*-*m*, . . . , 1410*n*-*m* have their drains connected to the selected outputs 1407*a*-0, . . . , 1407*n*-0, 1407*a*-*m*, 1407*n*-*m* of the block read row decoder 1405*a*, . . . , 1405*n*. The sources of the block pass transistors 1410*a*-0, . . . , 1410*a*-*n*, . . . , 1410*a*-*m*, . . . , 1410*n*-*m* are connected to the word lines 1120*a*, . . . , 1120*b*, . . . , 1120*n* or 1121*a*, 1121*b*, . . . , 1121*n*. The gates of the pass transistors 1410*a*-0, . . . , 1410*a*-*n*, . . . , 1410*a*-*m*, . . . , 1410*n*-*m* are connected to be activated by a read enable signal EN_RD 1415. During a fast 100 ns random read operation, the voltage level of the read enable signal EN_RD 1415 is constantly set to a voltage level that is the medium high voltage level plus a threshold voltage level of an NMOS transistor (MHV+Vt to fully pass the required boosted voltage of the medium high voltage to the selected write decoder driver circuits 1120*a*, 1120*b*, . . . , 1120*n* or 1121*a*, 1121*b*, . . . , 1121*n*. But during a write operation (Program and erase), the read enable signal EN_RD 1415 is set to the voltage level of the ground reference voltage (0.0V) to isolate this read row decoder 1220 from the write row decoder 1210 of the selected sectors 1125*a*, . . . , 1125*n*.

Figure 25:
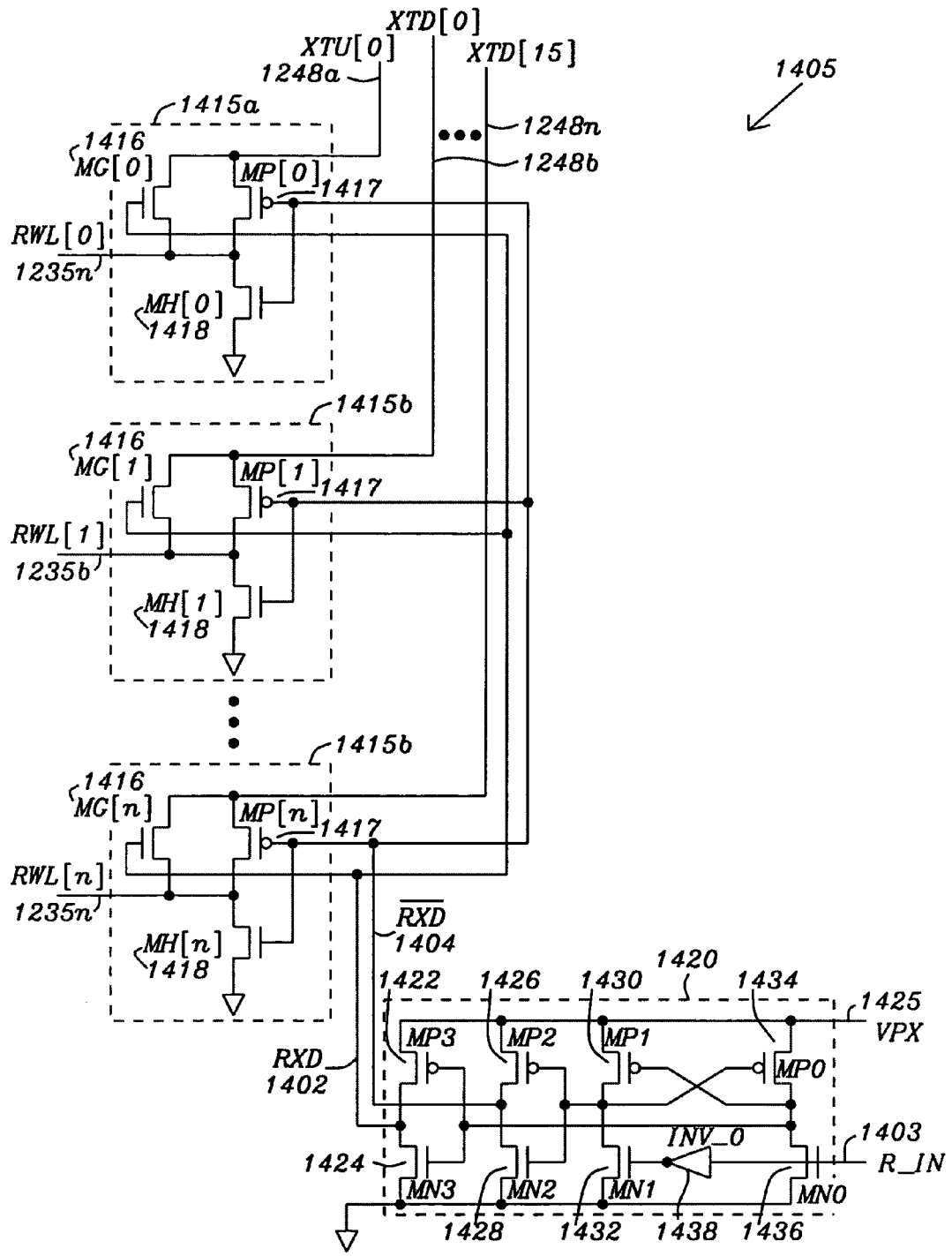
FIG. 25 is a schematic diagram of a level shift circuit of the read block row decoder of FIG. 24 embodying the principles of this invention.

FIG. 25 is a schematic diagram of a level shift circuit of the read block row decoder 1405 of FIG. 24 embodying the principles of this invention. Each read block row decoder 1405 has multiple row driver circuits 1415*a*, . . . , 1415*n* and a row select decode circuit 1425. Each of the row driver circuits 1415*a*, . . . , 1415*n* is connected to receive the page address portion 1248*a*, . . . , 1248*n* of the address 1240 and the block selection output 1403. Each row driver circuit 1415*a*, . . . , 1415*n* has three high voltage transistors—two NMOS transistors 1416 and 1418 and a PMOS transistor 1417. The drain of the NMOS transistor 1416 and the source of the PMOS transistor 1417 are connected to one of the page address portions 1248*a*, . . . , 1248*n* of the address 1240. The gate NMOS transistor 1416 is connected to the block selected output 1406 and the source of the PMOS transistor 1417 to the inversion of the block selected output 1404. The source of the NMOS transistor 1416 and the drain of the PMOS transistor 1417 are connected to the drain of the NMOS transistor 1418. The source of the NMOS transistor 1418 is connected to the ground reference voltage source. The gate of the NMOS transistor 1418 is connected to the inversion of the block selected output 1404.

When the block selected output 1406 and the inversion of the block selected output 1404 indicate that the block is selected, the NMOS transistor 1416 and the PMOS transistor 1417 are turned on and the boosted medium high-voltage level of approximately 6.0V of the page address portion 1248*a*, . . . , 1248*n* of the address 1240 is transferred to the selected word line 1235*a*, 1235*b*, . . . , 1235*n*. When the block selected output 1406 and the inversion of the block selected output 1404 indicate that the block is not selected, the NMOS transistors 1416 and 1418 and the PMOS transistor 1417 are turned off to isolate the output of the write row decoder 1210 of FIG. 21 from the row select decode circuit 1425 during write operations—the program operation and the erase operation.

The block selected output 1406 is connected to the gate of the NMOS transistor 1436. The drain of the NMOS transistor 1436 is connected to the drain of the PMOS transistor 1434, the gate of the PMOS transistor 1430, and the gates of the NMOS transistor 1424 and the PMOS transistor 1422. The block selection output 1403 is also the input to the inverter 1438. The output of the inverter 1438 is connected to the gate of the NMOS transistor 1432. The drain of the NMOS transistor 1432 is connected to the drain of the PMOS transistors 1430, the gates of the NMOS transistor 1428 and the PMOS transistor 1426, and the gate of the PMOS transistor 1434. The drains of the PMOS transistor 1422 and the NMOS transistor 1424 are connected to the block selected output 1406. The drains of the PMOS transistor 1426 and the NMOS transistor 1428 are connected to the inversion of the block selected output 1404. The sources of the PMOS transistors 1422, 1426, 1430 1434 are connected to the pass high voltage source VPX 1425. The sources of the NMOS transistors 1424, 1428, 1432, and 1436 are connected to the ground reference voltage source.

When the block selection output 1403 indicates that the block is selected, the NMOS transistor 1436 turns on and the NMOS transistor 1432 turns off. The PMOS transistor 1434 turns off and the PMOS transistor 1430 turns on. This forces the PMOS transistor 1422 to turn on and the NMOS transistor 1424 to turn on to allow the pass high voltage source VPX 1425 to be transferred to the block selected output 1406. The NMOS transistor 1428 is turned on and the PMOS transistor 1426 is turned off to set the inversion of the block selected output 1404 to the voltage level of the ground reference voltage source. Alternately, when the block selection output 1403 indicates that the block is not selected, the NMOS transistor 1436 turns off and the NMOS transistor 1432 turns on. The PMOS transistor 1434 turns on and the PMOS transistor 1430 turns off. This forces the PMOS transistor 1422 to turn off and the NMOS transistor 1424 to turn off to set the block selected output 1406 to the voltage level of the ground reference voltage source. The NMOS transistor 1428 is turned off and the PMOS transistor 1426 is turned on to allow the pass high voltage source VPX 1425 to be transferred the inversion of the block selected output 1404.

Returning to FIG. 24, during the fast random read operation, word line select transistors 1310a-0, ..., 1310n-0 and 1310a-n, ..., 1310n-m of FIG. 22 are turned off to isolate the write row decoder 1410 from the word lines 1235a-0, ..., 1235a-n, ..., 1235a-m, ..., 1235n-m. The pass transistors 1410a-0, ..., 1410a-n, ..., 1410a-m, ..., 1410n-m are turned on to allow the desired read voltage to be coupled to the selected and un-selected word lines 1235a-0, ..., 1235a-n, ..., 1235a-m, ..., 1235n-m of the selected BLOCK and un-selected BLOCKS. When the floating-gate NMOS NOR flash cells (1000 of FIG. 20a) have a positive erase threshold voltage Vt0, the gate voltage of the unselected word lines 1235a-0, ..., 1235a-n, ..., 1235a-m, ..., 1235n-m either in the selected blocks 1100a, ..., 1100n or unselected blocks 1100a, ..., 1100n can be coupled to the voltage level of the ground reference voltage source without inducing any bit line leakage. Therefore, an accurate reading of the floating-gate transistors M0 or M1 in the selected floating-gate NMOS NOR flash cells 1000 can be achieved. Since the goal is to achieve high-speed read, therefore cell current of the selected floating-gate NMOS NOR flash cells 1000 has an erase threshold voltage distribution Vt0 distribution between the lower boundary of the erase threshold voltage Vt0L of approximately +0.25V and to an upper boundary of the erase voltage distribution Vt0H less than approximately +0.75V to have a higher read current. To secure no leakage through the floating-gate NMOS NOR flash cells 1000 with such a low erase threshold voltage Vt0 distribution, a voltage level of approximate −2.0V may be applied to the selected P-type well TPW (215 of FIG. 3c) during read operation. This voltage level −2.0V makes the floating-gate NMOS NOR flash cells 1000 operate in back-biased condition with two advantages. The 1st advantage is that the threshold voltage Vt of the floating-gate transistors M0 or M1 increases to reduce any sub-threshold leakage of each floating-gate NMOS NOR flash cells 1000. The 2nd advantage of back-biasing the selected P-type well TPW (215 of FIG. 3c) is to reduce the junction capacitance of selected local bit lines 1110a, 1110b, 1110n−1, and 1110n and local source lines 1115a, 1115b, ..., 1115n−1, and 1115n, thus reducing the delay. One disadvantage is the reduction in read current of the selected floating-gate NMOS NOR flash cells 1000.

But the advantage of drastically reducing the sub-threshold leakage is more important for all single level programming (SLC) and Multiple Level Programming (MLC) read of this array 1205 of FIG. 21.

FIG. 26 is a table of the operational voltages of the write block row decoder of FIG. 22. Referring now to FIGS. 22 and 26, the input of the charge pump circuits 1305a, ..., 1305n is the block selection output 1307a, 1307n and is designated in FIGS. 26, 27a, and 27b as 1307S for selected blocks and 1307U for unselected blocks. The output 1320a, ..., 1320n of the charge pump circuits 1305a, ..., 1305n is designated 1320S for selected blocks and 1320U for unselected blocks. The word lines 1235a-0, ..., 1235a-n, ..., 1235a-m, ..., 1235n-m are designated 1235S for a selected word line, 1235SU for unselected word lines in selected blocks, and 1235U for unselected word lines in unselected blocks. The block selection output 1403a, ..., 1403n that is the input RIN to the block row decoder 1405a, ..., 1405n is designated 1403S for selected blocks and 1403U for unselected blocks.

In a read operation, shown in FIG. 26, the block selection input 1307S and 1307U for the selected and unselected blocks are set to approximately the voltage level of the ground reference voltage source (0.0). The output 1320S and 1320U of the charge pump circuit for the selected and unselected blocks are similarly set to approximately the voltage level of the ground reference voltage source (0.0). The voltage level for the pass high voltage source VP1 1426c and VP2 1246a are set to the voltage level of the power supply voltage source VDD and the program signal 1246c is set to the voltage level of the ground reference voltage source (0.0). The output of the write block row decoders 1210a, ..., 1210n is disabled thus isolating the write block row decoders 1405a, ..., 1405n from the word lines 1235a-0, 1235a-n, 1235a-m, 1235n-m. The P-type well 1030 of FIGS. 18b-2 and 18-c2 is connected to a P-well voltage source that is set to approximately −2.0V to back-bias the floating-gate NMOS NOR flash cells 1000 as described above.

In a page erase operation, the block selection input 1307S and thus output 1320S of the charge pump circuit are set to the voltage level of the power supply voltage source VDD for the selected blocks. The block selection input 1307U and thus the output 1320U of the charge pump circuits of the non-selected blocks are set to the voltage level of the ground reference voltage source (0.0). The voltage level for the pass high voltage source VP1 1246c and VP2 1246a are set to the voltage level of the power supply voltage source VDD and the program signal 1246b is set to the voltage is level of the ground reference voltage source (0.0). The output of the read block row decoders 1405a, ..., 1405n is disabled. The selected word line 1235S is thus set to the voltage level of the ground reference voltage source (0.0). The unselected word lines 1235SU and 1235U are thus disconnected and allowed to float.

In the page erase verify operation, the block selection input 1307S for the write row decoder is set to the voltage level of the ground reference voltage source (0.0) for the selected blocks. The output 1320S of the charge pump circuit is set to the voltage level of the ground reference voltage source (0.0). The block selection input 1307U and thus the output 1320U of the charge pump circuits of the unselected blocks are set to the voltage level of the ground reference voltage source (0.0). The voltage level for the VP2 1246*a* is set to the voltage level of the power supply voltage source VDD and the program signal 1246*c* is set to the voltage level of the ground reference voltage source (0.0). The output of the read block row decoders 1405*a*, . . . , 14305*n* of the enabled page is set to the set to the voltage level of the high voltage level of approximately +6.0V. The output of the read row decoders 1405*a*, . . . , 1405*n* of the disabled pages is disabled. The selected word line 1235S is thus set to the upper boundary of the erased threshold voltage Vt0H. The unselected word lines 1235SU is set to the high inhibit voltage level of approximately +6.0V and 1235U is thus set to the voltage level of the ground reference voltage source (0.0) based on the output of the read row decoders 1405*a*, . . . , 1405*n*.

In the program operation, the block selection input 1307S and the program signal 1246*b* are set to the voltage level of the power supply voltage source VDD for the selected blocks. The output 1320S of the charge pump circuit is activated to become the second pass voltage level VP1 1246*c* that has the very high programming voltage level of approximately +20.0V plus a NMOS transistor threshold voltage level (+20.0V+Vt). The block selection input 1307U is set to the voltage level of the ground reference voltage source (0.0). Thus the output 1320U of the charge pump circuits of the unselected blocks becomes the voltage level for the second pass voltage level VP2 1246*a* that is set to the voltage level of the set to the voltage level of the high voltage level of approximately +5.0V plus a threshold voltage of an NMOS transistor (+5.0V+Vt). The selected word line 1235S is set very high programming voltage level of approximately +20.0V. The unselected word lines 1235SU and 1235S are thus set to the intermediate inhibit voltage level of approximately +5.0V.

In the program verify operation and the program correction verify operation, the block selection input 1307S is set to the voltage level of the ground reference voltage source (0.0) for the selected blocks. The output 1320S of the charge pump circuit is set to the voltage level of the ground reference voltage source (0.0). The block selection input 1307U and thus the output 1320U of the charge pump circuits of the unselected blocks are set to the voltage level of the ground reference voltage source (0.0). The voltage level for the VP2 1246*a* is set to the voltage level of the power supply voltage source VDD and the program signal 1246*c* is set to the voltage level of the ground reference voltage source (0.0). The output of the read row decoders 1405*a*, . . . , 1405*n* of the enabled page is set to the voltage level of the high voltage level HV* of approximately +6.0V. The outputs of the read row decoders 1405*a*, . . . , 1405*n* of the disabled pages are disabled. The selected word line 1235S is thus set to the voltage level of the successively to the lower boundaries of the erased threshold Vt0L and the programmed threshold voltage Vt1L for the program verify and to the upper boundary of the programmed threshold voltage Vt1H for the programmed correction verify. The unselected word lines 1235SU is set to the voltage level of the high voltage level HV* of approximately +6.0V and 1235U is thus set to the voltage level of the ground reference voltage source (0.0) based on the output of the read row decoders 1405*a*, . . . , 1405*n*.

Referring to FIGS. 27*a* and 27*b*, the read (Read+) operation the write row decoders 1215*a*, . . . , 1215*n* are disabled and the read row decoders 1405*a*, . . . , 1405*n* are enabled. The output of the read row decoders 1405*a*, . . . , 1405*n* and thus the selected word line 1235*s* is set to the lower boundary of the programmed threshold voltage Vt1L for the single level program of FIG. 27*a* and iteratively to the first, second, and third reference voltage levels VR1, VR2, and VR3 for the multiple level program of FIG. 27*b*. The unselected word lines 1235SU of the selected block is set to the high voltage level HV* of approximately +6.0V. The unselected word lines 1235U of the unselected blocks are set to the voltage level of the ground reference voltage source (0.0). The row select signal line XT 1248S to establish the output voltage of the read row decoder 1405*a*, . . . , 1405*n* for the selected word line 1235S is set to the lower boundary of the programmed threshold voltage Vt1L for the single level program of FIG. 27*a* and iteratively to the first, second, and third reference voltage levels VR1, VR2, and VR3 for the multiple level program of FIG. 27*b*. The row select signals XT 1248SU is set to the voltage level of the high voltage level HV* of approximately +6.0V and row select signals XT 1248U is set to the voltage level of the ground reference voltage source (0.0). The block selection input 1307S and 1307U are set to the voltage level of the ground reference voltage source (0.0). The block selection output 1403S for the selected block is set to the voltage level of the power supply voltage source VDD. The block selection output 1403U for the unselected blocks is set to the voltage level of the ground reference voltage source (0.0). The high pass voltage VPX 1425 and the read enable signal EN_RD 1425 are set to the high voltage level HV** that is the high voltage level HV* of approximately +6.0V plus a threshold voltage level of an NMOS transistor Vt (HV1*+Vt). The program select signal PGM_SEL 1246*b* is set to the voltage level of the ground reference voltage source (0.0). The voltage threshold of the selected floating-gate NMOS NOR flash cells 1000 are sensed by the column address decode circuit 1230 for either the single level programming or the multiple level programming.

In the page erase operation, the voltage levels as described above for the write row decoder 1210 in FIGS. 26 and 27 have set the selected word line to the voltage level of the ground reference voltage source (0.0) and the unselected word lines 1235SU and 1235U are coupled, as described above, to the very high erase voltage level of approximately +20.0V that is applied to the P-type well TPW 1030 of FIGS. 18*b*-2 and 18*c*-2. The row select signal line XT 1248S to establish the output voltage of the write row decoder for the selected word line 1235S is set to voltage level of the ground reference voltage source (0.0). The row select signals XT 1248SU and 1248U are set to the voltage level of the power supply voltage source VDD. The selected block selection input IN 1307S is set to the voltage level of the power supply voltage source VDD. The unselected block select input IN 1307U is voltage level of the ground reference voltage source (0.0). The block selection output 1403S for the selected block is set to the voltage level of the power supply voltage source VDD. The block selection output 1403U for the unselected blocks is set to the voltage level of the ground reference voltage source (0.0). The high pass voltage VPX 1425 is set to the voltage level of the power supply voltage source VDD. The read enable signal EN_RD 1425 and the program select signal PGM_SEL 1246*b* are set to the voltage level of the ground reference voltage source (0.0).

At the completion of the page erase operation, the page erase verify operation is executed. In the page erase verify operation, the write row decoders 1215*a*, . . . , 1215*n* are disabled and the read row decoders 1405*a*, . . . , 1405*n* are enabled. The output of the read row decoders 1405*a*, . . . , 1405*n* and thus the selected word line 1235*s* is set to the upper boundary of the erased threshold voltage Vt0H for the single level program of FIG. 27*a* and the multiple level program of FIG. 27*b*. The unselected word lines 1235SU of the selected block is set to the high voltage level HV* of approximately +6.0V. The unselected word lines 1235U of the unselected blocks are set to the voltage level of the ground reference voltage source (0.0). The row select signal line XT 1248S to establish the output voltage of the read row decoder for the selected word line 1235S is set to the upper boundary of the programmed threshold voltage Vt0H for the single level program of FIG. 27*a* and The row select signals XT 1248SU is set to the voltage level of the high voltage level HV* of approximately +6.0V and row select signals XT 1248U is set to the voltage level of the ground reference voltage source (0.0). The block selection input 1307S and 1307U are set to the voltage level of the ground reference voltage source (0.0). The block selection output 1403S for the selected block is set to the voltage level of the power supply voltage source VDD. The block selection output 1403U for the unselected blocks is set to the voltage level of the ground reference voltage source (0.0). The high pass voltage VPX 1425 and the read enable signal EN_RD 1425 are set to the high voltage level HV** that is the high voltage level HV* of approximately +6.0V plus a threshold voltage level of an NMOS transistor Vt (HV1*+Vt). The program select signal PGM_SEL 1246*b* is set to the voltage level of the ground reference voltage source (0.0). The voltage threshold of the selected floating-gate NMOS NOR flash cells 1000 are sensed by the column address is decode circuit 1230 for either the single level programming or the multiple level programming to determine if the erase has been successful.

In the program operation, the voltage levels as described above for the write row decoder 1210 in FIG. 26 have set the selected word line to the voltage level of the very high program voltage level of from approximately +15.0V to approximately +20.0V and the unselected word lines 1235SU and 1235U are coupled, as described above, intermediate program inhibit voltage of approximately +5.0V. The row select signal line XT 1248S to establish the output voltage of the read row decoder for the selected word line 1235S is set to very high program voltage level of from approximately +15.0V to approximately +20.0V. The unselected row select signals XT 1248SU and 1248U are set to the voltage level of the intermediate program inhibit voltage of approximately +5.0V. The selected block selection input IN 1307S is set to the voltage level of the power supply voltage source VDD. The unselected block select input IN 1307U is voltage level of the ground reference voltage source (0.0). The block selection output 1403S for the selected block is set to the voltage level of the power supply voltage source VDD. The block selection output 1403U for the unselected blocks is set to the voltage level of the ground reference voltage source (0.0). The high pass voltage VPX 1425 is set to the voltage level of the power supply voltage source VDD. The read enable signal EN_RD 1425 is set to the voltage level of the ground reference voltage source (0.0). The program select signal PGM_SEL 1246*b* is activated with a larger programming select voltage of approximately +10.0V.

At the completion of the program operation, the program verify and program correction verify operation is executed. If selected floating-gate NMOS NOR flash cells 1000 are shown to be incorrect with the program verify, the selected floating-gate NMOS NOR flash cells 1000 are reprogrammed and then evaluated with the program correction operation. In the program verify operation and the program correction operation, as in the read (Read+) operation, the write row decoders 1215*a*, . . . , 1215*n* are disabled and the read row decoders 1405*a*, . . . , 1405*n* are enabled. For the program verify, the output of the read row decoders 1405*a*, . . . , 1405*n* and thus the selected word line 1235*s* is set to the upper boundary of the erased threshold voltage Vt0H to evaluate the erased floating-gate NMOS NOR flash cells 1000 and the lower boundary of the program threshold voltage Vt1L to evaluate the programmed floating-gate NMOS NOR flash cells 1000 for the single level program of FIG. 27*a* and the lower boundaries of the erased and multiple program threshold voltages Vt0L, Vt1L, Vt2L, Vt3L for the multiple level program of FIG. 27*b*.

The unselected word lines 1235SU are set to the high voltage level HV* of approximately +6.0V and unselected word lines 1235U are set to the voltage level of the ground reference voltage source (0.0). The row select signal line XT 1248S to establish the output voltage of the read row decoder for the selected word line 1235S is set to the upper boundary of the erased threshold voltage Vt0H the lower boundary of the program threshold voltage Vt1L for the single level program of FIG. 27*a* and iteratively to the four lower boundaries of the threshold values Vt0L, Vt1L, Vt2L, Vt3L for the multiple level program of FIG. 27*b* for the program verify operation.

For the program correction verify, the output of the read row decoders 1405*a*, . . . , 1405*n* and thus the selected word line 1235*s* is set to the upper boundary of the programmed threshold voltage Vt1H to evaluate the programmed floating-gate NMOS NOR flash cells 1000 and the upper boundary of the program threshold voltage Vt1H to evaluate the programmed floating-gate NMOS NOR flash cells 1000 for the single level program of FIG. 27*a* and the upper boundaries of the erased and multiple program threshold voltages Vt0H, Vt1H, Vt2H, Vt3H for the multiple level program of FIG. 27*b*. The row select signal line XT 1248S to establish the output voltage of the read row decoder for the selected word line 1235S is set to the upper boundary of the programmed threshold voltage Vt1H for the single level program of FIG. 27*a* and iteratively to the four upper boundaries of the threshold values Vt0H, Vt1H, Vt2H, Vt3H for the multiple level program of FIG. 27*b* for the program correction verify operation. The row de-select signals XT 1248SU is set to the high voltage level HV* of approximately +6.0V and row de-select signals 1248U are set to the voltage level of the ground reference voltage source (0.0) for the program correction verify operation. The block selection input 1307S and 1307U are set to the voltage level of the ground reference voltage source (0.0) for the program correction verify operation. The block selection output 1403S for the selected block is set to the voltage level of the power supply voltage source VDD. The block selection output 1403U for the unselected blocks is set to the voltage level of the ground reference voltage source (0.0). The high pass voltage VPX 1425 and the read enable signal EN_RD 1425 are set to the high voltage level HV** that is the high voltage level HV* of approximately +6.0V plus a threshold voltage level of an NMOS transistor Vt (HV1*+Vt). The program select signal PGM_SEL 1246*b* is set to the voltage level of the ground reference voltage source (0.0). The voltage threshold of the selected floating-gate NMOS NOR flash cells 1000 are sensed by the column address decode circuit 1230 for either the single level programming or the multiple level programming to determine if the program operation has been successful.

It will be apparent to one skilled in the art that while the embodiments explained herein describe floating gate charge storage transistors, other embodiments of the present invention will have SONOS charge trapping transistors. The structure and function of the SONOS charge trapping transistors will be identical to those described in the embodiment described herein.

While this invention has been particularly shown and described with reference to the preferred embodiments thereof, it will be understood by those skilled in the art that various changes in form and details may be made without departing from the spirit and scope of the invention.

The invention claimed is:

1. A nonvolatile memory circuit comprising:
   at least one nonvolatile memory cell comprising a plurality of charge retaining memory transistors serially connected as a NAND series string;
   at least one local source line charge retaining select gating transistor for selecting the nonvolatile memory nonvolatile memory cell for selectively connecting the nonvolatile memory cell to a column local source line of an array of nonvolatile memory cells; and
   at least one local bit line charge retaining select gating transistor for selecting the nonvolatile memory nonvolatile memory cell for selectively connecting the nonvolatile memory cell to a column local bit line of an array of nonvolatile memory cells.

2. The nonvolatile memory circuit of claim 1 wherein in the local source lines and the local bit lines are metal and are arranged to reduce noise in the local source line and more evenly dissipate heat.

3. The nonvolatile memory circuit of claim 1 wherein the charge retaining memory transistors are programmed to their threshold voltages to an erased threshold voltage level and at least one programmed threshold voltage level.

4. The nonvolatile memory circuit of claim 3 wherein the erased threshold voltage level is negative and the at least one programmed threshold voltage level is positive.

5. The nonvolatile memory circuit of claim 4 wherein the erased threshold voltage level has a distribution of approximately 2.0V.

6. The nonvolatile memory circuit of claim 5 wherein the erased threshold voltage level has a range of from approximately −3.0V to approximately −1.0V and is nominally −2.0V.

7. The nonvolatile memory circuit of claim 4 wherein the charge retaining memory transistors have four programmed threshold voltage levels that have a narrow distribution of approximately 2.0V that has a range of from approximately +3.0V to approximately +1.0V and is nominally +2.0V.

8. The nonvolatile memory circuit of claim 4 wherein the charge retaining memory transistors have three programmed threshold voltage levels that have a distribution of approximately 0.5V wherein a first programmed threshold voltage level has a range of from approximately +0.5V to approximately +1.0V and is nominally +0.75V, a second programmed threshold voltage level has a range of from approximately +1.5V to approximately +2.0V and is nominally +1.75V, a third programmed threshold voltage level has a range of from approximately +2.5V to approximately +3.0V and is nominally +2.75V.

9. The nonvolatile memory circuit of claim 1 wherein the at least one local source line charge retaining select gating transistor and the at least one local bit line charge retaining select gating transistor have a threshold voltage level is greater than +2.0V.

10. A row decode/driver circuit peripheral to an array of nonvolatile memory cells and connected to a block of the array of nonvolatile memory cells for controlling the application of the necessary read, program, and erase signals to selected nonvolatile memory cells of the array of nonvolatile memory cells, comprising:
    a plurality of block decoder circuits to select the block containing the row of nonvolatile memory cells to be read, programmed, or erased;
    a plurality of high voltage charge-pump circuits to activate local bit line select gating charge retaining transistors connected to each column grouping of the nonvolatile memory cells; and
    a plurality of pass-transistors, wherein each of the pass transistors is connected to the control gates of one row of nonvolatile memory cells through their associated word lines to address input lines having the necessary voltage levels for reading, programming, or erasing the nonvolatile memory cells of each row of the selected block.

11. A method for refreshing a nonvolatile memory cells within a sector of a plurality of blocks of an array of nonvolatile memory cells to eliminate the effects of program disturb voltages comprising the steps of:
    determining a maximum erase count for unselected blocks of the plurality of blocks;
    if the maximum erase count is equal to a maximum upper limit erase count, setting the erase count to zero;
    if the maximum erase count is less than the maximum upper limit erase count, incrementing the erase count;
    retaining the erase count;
    copying data stored at one page within each of the unselected blocks of the sector;
    program verifying nonvolatile memory cells of the selected pages from the unselected blocks of the sector and
    if any of the data from the copied page show effects of program disturb voltages, programming the copied data back to the page copied from the unselected blocks of the sector.

12. The method of claim 11 wherein the determining the maximum erase count comprises the steps of:
    storing an erase count in an erase count register associated with each block of the selected sector;
    reading the erase counts from each erase count register associated with each block of the selected sector;
    comparing the erase counts; and
    determining which of the erase counts is a maximum erase count.

13. The method for refreshing a nonvolatile memory cells of claim 12 wherein the erase count register comprises:
    a plurality of charge retaining memory transistors, wherein each of the charge retaining memory transistors have a first source/drain connected between a refresh bit line, a second source/drain connected to a refresh source line, and a control gate connected to a select gate line of the associated block to receive the erase count for the associated block.

14. The method for refreshing a nonvolatile memory cells of claim 11 further comprising:
    erasing a selected block within the plurality of blocks.

15. The method for refreshing a nonvolatile memory cells of claim 14 wherein retaining the erase count comprises programming the erase count register of the selected block within the plurality of blocks with the erase count.

16. The method for refreshing a nonvolatile memory cells of claim 11 wherein copying the one page within the unselected blocks comprises:
    selecting the one page within each of the unselected blocks as pointed to by the maximum erase count; and
    reading and retaining the data from the one page within each of the unselected blocks for reprogramming.

17. A nonvolatile memory device comprising;
    a nonvolatile memory array including a plurality of charge retaining memory transistors arranged in rows and columns;

a plurality of bit lines, wherein each one of the bit lines is associated with each column of the plurality of charge retaining memory transistors;

a plurality of source lines, such that each one of the source lines is associated with one column of the plurality of charge retaining memory transistors and placed essentially parallel to the bit line associated with the column of charge retaining transistors such that the source lines will mitigate noise generated by currents from reading, programming, and erasing blocks of the plurality of charge retaining memory transistors;

a plurality of word lines, such that each word line is connected to control gates of the charge retaining memory transistors of each one row of the plurality of charge retaining memory transistors;

a plurality of row decode/driver circuits, each row decoder/driver circuit is connected to blocks of the charge retaining memory transistors for controlling the application of the necessary read, program, and erase signals to selected charge retaining memory transistors of the array of nonvolatile memory array; and a plurality of erase count registers, each of the erase count registers associated with one block of the array of the charge retaining memory transistors for storing an erase count for the associated block.

18. The nonvolatile memory device of claim 17 further comprising a plurality of bit line select gating charge retaining transistors wherein groupings of the charge retaining memory transistors in each column of the array are connected as NAND series strings and each NAND series string of the charge retaining memory transistors is connected to one of the bit line select gating charge retaining transistors.

19. The nonvolatile memory device of claim 18 wherein a source of the one bit line select gating charge retaining transistor is connected to a drain of the first charge retaining memory transistor and a drain of the one bit line select gating charge retaining transistor is connected to one bit line, a gate of the bit line select gating charge retaining transistor is connected to receive a bit line select signal for turning on the bit line select gating charge retaining transistor to connect the drain of the bit line charge retaining memory transistor to the one bit line.

20. The nonvolatile memory device of claim 18 wherein a drain of the one source line select gating charge retaining transistor is connected to a source of a first charge retaining memory transistor of the NAND series string and a source of the one source line select gating charge retaining transistor is connected to one source line, a gate of the source line select gating charge retaining transistor is connected to receive a source line select signal for turning on the source line select gating charge retaining transistor to connect the source line of the second charge retaining memory transistor to the one source line.

21. The nonvolatile memory device of claim 17 further comprising a plurality of source line select gating charge retaining transistors wherein each source line select gating charge retaining transistor is connected to one of the NAND series string of the charge retaining memory transistors.

22. The nonvolatile memory device of claim 17 wherein each row decoder circuit comprises:

a plurality of block decoder circuits to select the sub-array or block containing the row of charge retaining memory transistors to be read, programmed, or erased;

a plurality of high voltage charge-pump circuits to activate the local bit line select gating charge retaining transistors connected to each column grouping of the select gating charge retaining memory transistor;

a plurality of first pass-transistors, wherein each of the first pass transistors connects the control gates of each row of charge retaining memory transistors through their associated word lines to address input lines having the necessary voltage levels for reading, programming, or erasing the charge retaining memory transistors of each row of the selected block; and a plurality of second pass transistors such that each second pass transistor is connected to the gate of each of the local bit line select gating charge retaining transistors and is connected to the high voltage charge pump circuit to selectively connect a block select signal to the gates of the local bit line select gating charge retaining transistors associated with each column of the charge retaining memory transistors; and a plurality of third pass transistors such that each third pass transistor is connected to the gate of each of the local source line select gating charge retaining transistors and is connected to the high voltage charge pump circuit to selectively connect a block select signal to the gates of the local source line select gating charge retaining transistors associated with each column of the charge retaining memory transistors.

23. A nonvolatile memory control apparatus for operating a nonvolatile memory array including a plurality of charge retaining memory transistors arranged in rows and columns such that the array is divided into sectors of blocks of the array of the charge retaining memory transistors, wherein the nonvolatile memory control device comprises;

a plurality of bit lines, wherein each one of the bit lines is associated with each column of the plurality of charge retaining memory transistors;

a plurality of source lines, such that each one of the source lines is associated with one column of the plurality of charge retaining memory transistors and placed essentially parallel to the bit line associated with the column of charge retaining transistors such that the source lines will mitigate noise generated by currents from reading, programming, and erasing blocks of the plurality of charge retaining memory transistors;

a plurality of word lines, such that each word line is connected to control gates of the charge retaining memory transistors of each one row of the plurality of charge retaining memory transistors;

a plurality of row decode/driver circuits, each row decoder/driver circuit is connected to blocks of the charge retaining memory transistors for controlling the application of the necessary read, program, and erase signals to selected charge retaining memory transistors of the array of nonvolatile memory array;

a plurality of data register/sense amplifiers each data register/sense amplifier in communication with one of the bit lines and one of the sources lines to provide column control signals for read, program, and erase of the selected charge retaining memory transistors and to sense data signals from selected charge retaining memory transistors; and a plurality of erase count registers, each of the erase count registers associated with one block of the array of the charge retaining memory transistors for storing an erase count for the associated block.

24. The nonvolatile memory control apparatus of claim 23 further comprising:

a plurality of bit line select gating charge retaining transistors, each of the bit line select gating charge retaining transistors having a first source/drain connected to one local bit line and a second source/drain connected to the at least one of the charge retaining memory transistors of the selected column.

25. The nonvolatile memory control apparatus of claim 24 further comprising:
a plurality of source line select gating charge retaining transistors, each of the source line select gating charge retaining transistors having a first source/drain connected to one local source line and a second source/drain connected to the at least one of the charge retaining memory transistors of the selected column.

26. The nonvolatile memory control apparatus of claim 23 wherein each row decoder circuit comprises:
a plurality of block decoder circuits to select the block containing the row of charge retaining memory transistors to be read, programmed, or erased;
a plurality of high voltage charge-pump circuits to activate the local bit line select gating charge retaining transistors connected to each column grouping of the select gating charge retaining memory transistor;
a plurality of first pass-transistors, wherein each of the first pass transistors connects the control gates of each row of charge retaining memory transistors through their associated word lines to address input lines having the necessary voltage levels for reading, programming, or erasing the charge retaining memory transistors of each row of the selected block;
a plurality of second pass transistors such that each second pass transistor is connected to the gate of each of the local bit line select gating charge retaining memory transistors and is connected to the high voltage charge pump circuit to selectively connect a block select signal to the gates of the local bit line select gating charge retaining transistors associated with each column of the charge retaining memory transistors; and
a plurality of third pass transistors such that each third pass transistor is connected to the gate of each of the local source line select gating charge retaining memory transistors and is connected to the high voltage charge pump circuit to selectively connect a block select signal to the gates of the local source line select gating charge retaining transistors associated with each column of the charge retaining memory transistors.

27. The nonvolatile memory control apparatus of claim 23 further comprising
a plurality of global source lines connected between the data register/sense amplifier and the plurality of local source lines, wherein each of the global source lines is associated with a plurality of columns of nonvolatile memory cells to provide operating voltages to one selected column of the plurality of columns for reading, programming, and erasing at least one of the charge retaining memory transistors of the selected column; and
a plurality of global source line gating transistors, each of the global source line gating transistors having a first source/drain connected to one global source line and a second source/drain connected to one local source line to connect a selected one of the local source lines to the global source line for the transfer of the operating voltages to the selected charge retaining memory transistors.

28. The nonvolatile memory control apparatus of claim 23 further comprising
a plurality of global bit lines, wherein each of the global bit lines is associated with the plurality of columns of nonvolatile memory cells to provide operating voltages to one selected column of the plurality of columns for reading, programming, and erasing the at least one of the charge retaining memory transistors of the selected column;
a plurality of global bit line gating transistors, each of the global bit lines having a first source/drain connected to one global bit line and a second source/drain connected to one local bit line to connect a selected one of the local bit lines to the global bit line for the transfer of the operating voltages to the selected charge retaining memory transistors.

29. The nonvolatile memory control apparatus of claim 23 wherein each of the data register/sense amplifiers comprises:
a high voltage latching circuit connected to receive and retain data read from selected charge retaining memory transistors of
a set control transistor having a drain connected to the high voltage latch circuit and a gate connected to receive a set control signal that when activated allows data to be captured by the high voltage latch;
a copy control transistor having a drain connected to the high voltage latch circuit and a gate connected to receive a copy control signal that when activated allows data to be copied to the high voltage latch during a refresh operation;
a threshold detection transistor having a drain connected to a source of the set control transistor and the copy control transistor, a source connected to the ground reference voltage level, and a gate connected to a sense amplifier node to detect the threshold voltage level of the selected charge retaining memory transistors connected to the global bit line;
a transfer control transistor having a drain connected to the high voltage latching circuit, a source connected to a data input/output terminal for transfer of data between external circuitry and the high voltage latch, and a gate to receive the a transfer control signal that control the transfer of the data; and
a precharge transistor having a source connected to the power supply voltage source, a drain in communication with the global bit line, and a gate connected to receive a precharge signal for precharging the global bit line to a voltage level of approximately the power supply voltage source.

30. The nonvolatile memory control apparatus of claim 23 further comprising;
a plurality of local bit line select gate lines, wherein one local bit line select gate line is connected between the row decode/driver circuit associated with each block of the array of charge retaining memory transistors and the gates of the local bit line select transistors connected to the local bit lines associated with each of the blocks of the array of the charge retaining memory transistors and is connected to the erase count register associated with each of the blocks of the array of the charge retaining memory transistors.

31. The nonvolatile memory control apparatus of claim 30 wherein the nonvolatile memory control apparatus performs a refresh operation to eliminate the effects of program disturb voltages with selected blocks of the array of charge retaining memory transistors, wherein the refresh operation comprises;
reading the erase count register by the row decode/driver circuits associated with the selected blocks activating the local bit line select gate line to activate the erase count register such that the data register/sense amplifiers connected to the erase count register capture the erase count for the selected block;

copying the data of the page of the selected blocks by the row decode/driver circuits for the selected blocks activating the word line associated with a page of each of the selected blocks to a copying voltage level such that the data register/sense amplifiers connected to each of the bit lines of the selected pages of the selected blocks for capturing and retaining the data present in the charge retaining memory transistors of the selected pages of the selected blocks;

performing a program verify operation on each of the charge retaining memory transistors of the selected pages by the row decode/driver circuits activating the word lines connected to the charge retaining memory transistors of the selected pages to the voltage level of a lower boundary of a programmed data state such that the data register/sense amplifiers capture and determine if any of the charge retaining memory transistors have a threshold voltage level less than the lower boundary of the programmed data state;

if any of the charge retaining memory transistors have a threshold voltage level less than the lower boundary of the programmed data state, programming the copied data back the selected charge retaining memory transistors of the selected pages by the row decode/driver circuits activating the word lines of the selected pages to a high program voltage level and the data register/sense amplifiers placing the copied data to the local bit lines and the local source lines of the selected blocks;

determining a maximum erase count for the selected blocks of the plurality of blocks;

if the maximum erase count is equal to a maximum upper limit erase count, setting the erase count to zero;

if the maximum erase count is less than the maximum upper limit erase count, incrementing the erase count;

retaining the erase count.

32. The nonvolatile memory control apparatus of claim 31 wherein the refresh operation performed on the selected blocks occurs when an erase of one other block of the array of charge retaining memory transistors and wherein retaining the erase count comprises programming the erase count register of the erased one other block with the erase count.

33. The nonvolatile memory control apparatus of claim 32 wherein the erase count register comprises:
a plurality of charge retaining memory transistors, wherein each of the charge retaining memory transistors have a first source/drain connected between a refresh bit line, a second source/drain connected to a refresh source line, and a control gate connected to a select gate line of the associated block to receive the erase count for the associated block from the row decode/driver circuits.

34. The nonvolatile memory control apparatus of claim 33 wherein in programming the erase count to the row decode/driver circuits applies the very large program voltage to the select gate line and thus to control gates of the charge retaining transistors of the erase count register and the data register/sense amplifiers applies the erase count to the refresh bit lines and the refresh source lines erase one other block.

35. A NAND-like NOR flash cell comprising:
at least two serially connected charge retaining memory transistors wherein when one serially connected charge retaining memory transistors is selected for reading/verifying, programming, or erasing the other of the at least two serially connected charge retaining transistors functions as a select gating transistor;
wherein a drain of a topmost charge retaining transistor is connected to a bit line associated with the at least two serially connected charge retaining transistors;
wherein a source of a bottommost charge retaining transistor is connected to a source line associated with the at least two charge retaining transistors;
wherein a control gate of each of the at least two charge retaining transistors is connected to a separate word line; and
wherein the local source line and the local bit line are arranged in parallel in parallel with a column of at least two nonvolatile memory cells.

36. The NAND-like NOR flash cell claim 35 wherein a erased threshold voltage level of each of the at least two serially connected charge retaining memory transistors is negative and the at least one programmed threshold voltage level is positive.

37. The NAND-like NOR flash cell claim 36 wherein the erased threshold voltage level has a distribution of approximately 0.5V.

38. The NAND-like NOR flash cell claim 37 wherein the erased threshold voltage level has a range of from approximately −0.75V to approximately −0.25V and is nominally −0.5V.

39. The NAND-like NOR flash cell claim 36 wherein the programmed threshold voltage level has a distribution of approximately 0.5V.

40. The NAND-like NOR flash cell claim 39 wherein the programmed threshold voltage level has a range of from approximately +2.75V to approximately +3.25V and is nominally +3.0V.

41. The A NAND-like NOR flash cell claim 36 wherein the at least two serially connected charge retaining memory transistors have three programmed threshold voltage levels that have a distribution of approximately 0.5V wherein a first programmed threshold voltage level has a range of from approximately +0.75V to approximately +1.25V and is nominally +1.0V, a second programmed threshold voltage level has a range of from approximately +1.75V to approximately +2.25V and is nominally +2.0V, a third programmed threshold voltage level has a range of from approximately +2.75V to approximately +3.25V and is nominally +3.0V.

42. The NAND-like NOR flash cell claim 35 wherein each of the at least two serially connected charge retaining memory transistors have a plurality of programmed data states having positive threshold voltage levels.

43. The NAND-like NOR flash cell claim 42 wherein the threshold voltage levels of the plurality of programmed data states have a distribution of approximately 0.5V.

44. The NAND-like NOR flash cell claim 43 wherein the at least two serially connected charge retaining memory transistors have two data states with positive threshold voltages levels where in a first programmed threshold voltage level has a range of from approximately +0.25V to approximately +0.75V and is nominally +0.5V and a second programmed threshold voltage level has a range of from approximately +2.75V to approximately +3.25V and is nominally +3.0V.

45. The A NAND-like NOR flash cell claim 42 wherein the at least two serially connected charge retaining memory transistors have four programmed threshold voltage levels that have a distribution of approximately 0.5V wherein a first programmed threshold voltage level has a range of from approximately +0.75V to approximately +1.25V and is nominally +1.0V, a second programmed threshold voltage level has a range of from approximately +1.75V to approximately +2.25V and is nominally +2.0V, a third programmed threshold voltage level has a range of from approximately +2.75V to approximately +3.25V and is nominally +3.0V, and a fourth programmed threshold voltage level has a range of from approximately +3.75V to approximately +4.25V and is nominally +4.0V.

46. A nonvolatile memory device comprising;
- a nonvolatile memory array including a plurality of NAND-like NOR flash nonvolatile memory cells arranged in rows and columns, wherein each of the plurality of A NAND-like NOR flash cells comprises:
  - at least two serially connected charge retaining memory transistors wherein when one serially connected charge retaining memory transistors is selected for reading/verifying, programming, or erasing the other of the at least two serially connected charge retaining transistors functions as a select gating transistor;
- a plurality of bit lines, wherein each one of the bit lines is associated with each column of the plurality of NAND-like NOR flash cells and the a drain of a topmost charge retaining transistor of each of the NAND-like NOR flash cells is connected to a bit line associated with the NAND-like NOR flash cells;
- a plurality of source lines, such that each one of the source lines is associated with one column of the plurality of NAND-like NOR flash cells and placed essentially parallel to the bit line associated with the column of NAND-like NOR flash cells such that the source lines will mitigate noise generated by currents from reading, programming, and erasing blocks of the plurality of charge retaining memory transistors, wherein a source of a bottommost of each of the NAND-like NOR flash cells is connected to the source line associated with the column of NAND-like NOR flash cells;
- a plurality of word lines, such that each word line is connected to control gates of the charge retaining memory transistors of each one row of the plurality of NAND-like NOR flash cells;
- a plurality of write row decode/driver circuits, each write row decoder/driver circuit is connected to blocks of the array of the NAND-like NOR flash cells for controlling the application of the necessary program, and erase signals to selected charge retaining memory transistors of the array of NAND-like NOR flash cells;
- a plurality of read row decode/driver circuits, each read row decoder/driver circuit is connected to blocks of the array of the NAND-like NOR flash cells for controlling the application of the necessary read signals to selected charge retaining memory transistors of the array of NAND-like NOR flash cells;
- a plurality of data register/sense amplifiers each data register/sense amplifier in communication with one of the bit lines and one of the sources lines to provide column control signals for read, program, and erase of the selected charge retaining memory transistors and to sense data signals from selected charge retaining memory transistors; and
- a plurality of erase count registers, each of the erase count registers associated with one block of the array of the NAND-like NOR flash cells for storing an erase count for the associated block.

47. The nonvolatile memory device of claim 46 wherein each write row decoder circuit comprises:
- a plurality of block decoder circuits to select the sub-array or block containing the row of charge retaining memory transistors to be read, programmed, or erased;
- a plurality of high voltage charge-pump circuits to activate the local bit line select gating charge retaining transistors connected to each column grouping of the select gating charge retaining memory transistor;
- a first plurality of pass-transistors, wherein each of the first pass transistors connects the control gates of each row of charge retaining memory transistors through their associated word lines to address input lines having the necessary voltage levels for reading, programming, or erasing the charge retaining memory transistors of each row of the selected block; and
- a second plurality of pass transistors such that each second pass transistor is connected to the gate of each of the local bit line select gating charge retaining memory transistors and is connected to the high voltage charge pump circuit to selectively connect a block select signal to the gates of the local bit line select gating charge retaining transistors associated with each column of the charge retaining memory transistors; and
- a third plurality of pass transistors such that each third pass transistor is connected to the gate of each of the local source line select gating charge retaining memory transistors and is connected to the high voltage charge pump circuit to selectively connect a block select signal to the gates of the local source line select gating charge retaining transistors associated with each column of the charge retaining memory transistors.

48. The nonvolatile memory device of claim 46 wherein each read row decoder circuit comprises:
- a plurality of block selection circuits connected to receive block selection address, decodes the block address for selecting one block of the array of the NAND-Like NOR memory cells;
- a plurality of block decoder circuits to select the row of charge retaining memory transistors within the selected block to be read; and
- a plurality of read pass-transistors, wherein each of the read pass transistors connects the control gates of each row of charge retaining memory transistors through their associated word lines to address input lines having the necessary voltage levels for reading, programming, or erasing the charge retaining memory transistors of each row of the selected block.

49. The nonvolatile memory device of claim 48 wherein the nonvolatile memory control apparatus performs a refresh operation to eliminate the effects of program disturb voltages with selected blocks of the array of charge retaining memory transistors, wherein the refresh operation comprises;
- reading the erase count register by the row decode/driver circuits associated with the selected blocks activating the local bit line select gate line to activate the erase count register such that the data register/sense amplifiers connected to the erase count register capture the erase count for the selected block;
- copying the data of the page of the selected blocks by the row decode/driver circuits for the selected blocks activating the word line associated with a page of each of the selected blocks to a copying voltage level such that the data register/sense amplifiers connected to each of the bit lines of the selected pages of the selected blocks for capturing and retaining the data present in the charge retaining memory transistors of the selected pages of the selected blocks;
- performing a program verify operation on each of the charge retaining memory transistors of the selected pages by the row decode/driver circuits activating the word lines connected to the charge retaining memory transistors of the selected pages to the voltage level of a lower boundary of a programmed data state such that the data register/sense amplifiers capture and determine if any of the charge retaining memory transistors have a threshold voltage level less than the lower boundary of the programmed data state;

if any of the charge retaining memory transistors have a threshold voltage level less than the lower boundary of the programmed data state, programming the copied data back the selected charge retaining memory transistors of the selected pages by the row decode/driver circuits activating the word lines of the selected pages to a high program voltage level and the data register/sense amplifiers placing the copied data to the local bit lines and the local source lines of the selected blocks;

determining a maximum erase count for the selected blocks of the plurality of blocks;

if the maximum erase count is equal to a maximum upper limit erase count, setting the erase count to zero;

if the maximum erase count is less than the maximum upper limit erase count, incrementing the erase count;

retaining the erase count.

50. The nonvolatile memory device of claim 49 wherein the refresh operation performed on the selected blocks occurs when an erase of one other block of the array of charge retaining memory transistors and wherein retaining the erase count comprises programming the erase count register of the erased one other block with the erase count.

51. The nonvolatile memory device of claim 49 wherein the erase count register comprises:
a plurality of charge retaining memory transistors, wherein each of the charge retaining memory transistors have a first source/drain connected between a refresh bit line, a second source/drain connected to a refresh source line, and a control gate connected to a select gate line of the associated block to receive the erase count for the associated block from the row decode/driver circuits.

52. The nonvolatile memory device of claim 51 wherein in programming the erase count to the row decode/driver circuits applies the very large program voltage to the select gate line and thus to control gates of the charge retaining transistors of the erase count register and the data register/sense amplifiers applies the erase count to the refresh bit lines and the refresh source lines erase one other block.

53. The nonvolatile memory control apparatus of claim 46 further comprising
a plurality of global source lines connected between the data register/sense amplifier and the plurality of local source lines, wherein each of the global source lines is associated with a plurality of columns of nonvolatile memory cells to provide operating voltages to one selected column of the plurality of columns for reading, programming, and erasing at least one of the charge retaining memory transistors of the selected column; and
a plurality of global source line gating transistors, each of the global source line gating transistors having a first source/drain connected to one global source line and a second source/drain connected to one local source line to connect a selected one of the local source lines to the global source line for the transfer of the operating voltages to the selected charge retaining memory transistors.

54. The nonvolatile memory device of claim 46 further comprising
a plurality of global bit lines, wherein each of the global bit lines is associated with the plurality of columns of nonvolatile memory cells to provide operating voltages to one selected column of the plurality of columns for reading, programming, and erasing the at least one of the charge retaining memory transistors of the selected column;
a plurality of global bit line gating transistors, each of the global bit lines having a first source/drain connected to one global bit line and a second source/drain connected to one local bit line to connect a selected one of the local bit lines to the global bit line for the transfer of the operating voltages to the selected charge retaining memory transistors.

55. The nonvolatile memory device of claim 46 wherein each of the data register/sense amplifiers comprises:
a high voltage latching circuit connected to receive and retain data read from selected charge retaining memory transistors of a set control transistor having a drain connected to the high voltage latch circuit and a gate connected to receive a set control signal that when activated allows data to be captured by the high voltage latch;
a copy control transistor having a drain connected to the high voltage latch circuit and a gate connected to receive a copy control signal that when activated allows data to be copied to the high voltage latch during a refresh operation;
a threshold detection transistor having a drain connected to a source of the set control transistor and the copy control transistor, a source connected to the ground reference voltage level, and a gate connected to a sense amplifier node to detect the threshold voltage level of the selected charge retaining memory transistors connected to the global bit line;
a transfer control transistor having a drain connected to the high voltage latching circuit, a source connected to a data input/output terminal for transfer of data between external circuitry and the high voltage latch, and a gate to receive the a transfer control signal that control the transfer of the data; and
a precharge transistor having a source connected to the power supply voltage source, a drain in communication with the global bit line, and a gate connected to receive a precharge signal for precharging the global bit line to a voltage level of approximately the power supply voltage source.

56. The nonvolatile memory device of claim 46 further comprising;
a plurality of local bit line select gate lines, wherein one local bit line select gate line is connected between the row decode/driver circuit associated with each block of the array of NAND-like NOR flash cells and the gates of the local bit line select transistors connected to the local bit lines associated with each of the blocks of the array of the NAND-like NOR flash cells and is connected to the erase count register associated with each of the blocks of the array of the NAND-like NOR flash cells.

\* \* \* \* \*